(12) United States Patent
Yugami

(10) Patent No.: US 8,664,053 B2
(45) Date of Patent: Mar. 4, 2014

(54) SEMICONDUCTOR DEVICE WITH ISOLATION STRUCTURES AND GATE INSULATING FILM THAT CONTAIN AN ELEMENT FOR THRESHOLD REDUCTION AND METHOD OF MANUFACTURING THE SAME

(75) Inventor: Jiro Yugami, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 168 days.

(21) Appl. No.: 13/165,821

(22) Filed: Jun. 22, 2011

(65) Prior Publication Data
US 2012/0012946 A1    Jan. 19, 2012

(30) Foreign Application Priority Data

Jul. 14, 2010 (JP) .................................. 2010-159693

(51) Int. Cl.
*H01L 29/772* (2006.01)
*H01L 21/28* (2006.01)

(52) U.S. Cl.
USPC 438/197; 257/411; 257/E21.19; 257/E29.242; 438/196; 438/591

(58) Field of Classification Search
CPC . H01L 21/76; H01L 21/762; H01L 21/76264; H01L 21/821481; H01L 21/823878; H01L 2027/11829; H01L 2027/11831; H01L 29/0603; H01L 29/0638; H01L 29/0642; H01L 29/7846
USPC .................................................. 438/196, 197
See application file for complete search history.

(56) References Cited

U.S. PATENT DOCUMENTS

| | | | | |
|---|---|---|---|---|
| 6,261,920 | B1* | 7/2001 | Oyamatsu | 438/424 |
| 6,323,103 | B1* | 11/2001 | Rengarajan et al. | 438/424 |
| 6,346,438 | B1* | 2/2002 | Yagishita et al. | 438/197 |
| 7,576,399 | B2* | 8/2009 | Li | 257/412 |
| 7,851,299 | B2* | 12/2010 | Natzle | 438/230 |
| 2001/0022383 | A1* | 9/2001 | Kuroda et al. | 257/510 |
| 2009/0218634 | A1* | 9/2009 | Sakashita et al. | 257/369 |

(Continued)

OTHER PUBLICATIONS

V. Narayanan et al., Band-Edge High-Performance High-K/Metal Gate n-MOSFETs using Cap Layers Containing Group IIA and IIIB Elements with Gate-First Processing for 45 nm and Beyond, Symposium on VLSI Technology Digest of Technical Papers, 2006, p. 224.

(Continued)

*Primary Examiner* — Kevin Parendo
*Assistant Examiner* — Pauline Vu
(74) *Attorney, Agent, or Firm* — Mattingly & Malur, PC

(57) ABSTRACT

A device isolation region is made of a silicon oxide film embedded in a trench, an upper portion thereof is protruded from a semiconductor substrate, and a sidewall insulating film made of silicon nitride or silicon oxynitride is formed on a sidewall of a portion of the device isolation region which is protruded from the semiconductor substrate. A gate insulating film of a MISFET is made of an Hf-containing insulating film containing hafnium, oxygen and an element for threshold reduction as main components, and a gate electrode that is a metal gate electrode extends on an active region, the sidewall insulating film and the device isolation region. The element for threshold reduction is a rare earth or Mg when the MISFET is an n-channel MISFET, and the element for threshold reduction is Al, Ti or Ta when the MISFET is a p-channel MISFET.

3 Claims, 41 Drawing Sheets

(56) References Cited

U.S. PATENT DOCUMENTS

| | | | |
|---|---|---|---|
| 2010/0047994 A1* | 2/2010 | Dong et al. | 438/421 |
| 2010/0052063 A1* | 3/2010 | Masuoka et al. | 257/369 |
| 2011/0108921 A1* | 5/2011 | Kanakasabapathy et al. | 257/369 |

OTHER PUBLICATIONS

P. Sivasubramani et al., Dipole Moment Model Explaining nFET Vt Tuning Utilizing La, Sc, Er, and Sr Doped HfSiON Dielectrics, Symposium on VLSI Technology Digest of Technical Papers, 2007, pp. 68-69.

H-S. Jung, et al. A Highly Manufacturable MIPS (Metal Inserted Poly-Si Stack) Technology with Novel Threshold Voltage Control, Symposium on VLSI Technology Digest of Technical Papers, 2005, pp. 232-233.

M. Inoue et al., Impact of Area Scaling on Threshold Voltage Lowering in La-Containing High-k/Metal Gate NMOSFETs Fabricated on (100) and (110)Si, Symposium on VLSI Technology Digest of Technical Papers, 2009, pp. 40-41.

* cited by examiner

SEMICONDUCTOR DEVICE WITH ISOLATION STRUCTURES AND GATE INSULATING FILM THAT CONTAIN AN ELEMENT FOR THRESHOLD REDUCTION AND METHOD OF MANUFACTURING THE SAME

CROSS-REFERENCE TO RELATED APPLICATIONS

The present application claims priority from Japanese Patent Application No. 2010-159693 filed on Jul. 14, 2010, the content of which is hereby incorporated by reference to this application.

TECHNICAL FIELD

The present invention relates to a semiconductor device and a method of manufacturing the same, and in particular to a technique effectively applied to a semiconductor device provided with a MISFET having a high-dielectric gate insulating film and a metal gate electrode and a manufacturing technology of the same.

BACKGROUND

A MISFET (Metal Insulator Semiconductor Field Effect Transistor) can be formed by forming a gate insulating film on a semiconductor substrate, forming a gate electrode on the gate insulating film and forming source/drain regions by ion-implantation or the like. As the gate electrode, a polysilicon film is typically used.

In recent years, however, the gate insulating film has been thinned with the miniaturization of a MISFET element, and the influence of depletion of the gate electrode when a poly-silicon film is used for the gate electrode has become unignorable. For its solution, there is a technique of suppressing a depletion phenomenon of the gate electrode by using a metal gate electrode as the gate electrode.

Further, when the gate insulating film has been thinned with the miniaturization of the MISFET element and a thin silicon oxide film is used as the gate insulating film, electrons flowing through a channel of the MISFET tunnel through a barrier made of the silicon oxide film to flow in the gate electrode, and a so-called tunnel current is generated. For its solution, there is a technique of reducing a leakage current by using a material having a dielectric constant higher than that of the silicon oxide film (high-dielectric material) as the gate insulating film to increase a physical film thickness without changing a capacitance.

V. Narayanan et al., VLSI 2006, p. 224, P. Sivasubramani et al., VLSI 2007, pp. 68-69, H-S. Jung et al., VLSI 2005, pp. 232-233 and M. Inoue et al., VLSI 2009, pp. 40-41 (Non-Patent Documents 1 to 4) describe techniques for a MISFET having a metal gate electrode and a high-dielectric gate insulating film.

SUMMARY

According to the studies by the inventor of the present invention, the following has been found.

When a metal gate electrode is used, the problem of depletion of a gate electrode can be solved, but an absolute value of a threshold voltage (threshold) of the MISFET becomes large as compared with the case of using a polysilicon gate electrode, and absolute values of threshold voltages of both an n-channel MISFET and a p-channel MISFET become large in the case of a CMISFET. Therefore, it is desired to achieve threshold reduction (lower the absolute value of the threshold voltage) when the metal gate electrode is applied.

As a high-dielectric film (High-k film) for a gate insulating film, an Hf-based gate insulating film which is a high-dielectric film containing Hf is favorable, but it is effective to introduce an element for threshold reduction into the Hf-based gate insulating film in order to achieve the threshold reduction of the MISFET. When a rare earth element or the like is introduced into the Hf-based gate insulating film in the n-channel MISFET as an element for threshold reduction, the threshold reduction of the n-channel MISFET can be achieved. Further, when aluminum or the like is introduced into the Hf-based gate insulating film in the p-channel MISFET as an element for threshold reduction, the threshold reduction of the p-channel MISFET can be achieved.

However, when the element for threshold reduction is introduced into the Hf-based gate insulating film, the element for threshold reduction which has been introduced into the Hf-based gate insulating film has such a property that it easily diffuses into the silicon oxide film constituting a device isolation region.

Therefore, when the metal gate electrode has been formed so as to extend over the device isolation region from an active region, the element for threshold reduction diffuses from the Hf-based gate insulating film positioned below the metal gate electrode to the device isolation region, which results in the phenomenon that the concentration of the element for threshold reduction lowers. When the phenomenon occurs, the effect of threshold reduction obtained by the introduction of the element for threshold reduction into the Hf-based gate insulating film is weakened and the absolute value of the threshold voltage of the MISFET becomes large, and this becomes more prominent as the channel width becomes smaller. Therefore, it is desired to improve the performance of the semiconductor device by appropriately attaining the effect of threshold reduction obtained by the introduction of the element for threshold reduction into the Hf-based gate insulating film.

An object of the present invention is to provide a technique capable of achieving the performance improvement of a semiconductor device.

The above and other objects and novel characteristics of the present invention will be apparent from the description of the present specification and the accompanying drawings.

The following is a brief description of an outline of the typical invention disclosed in the present application.

A semiconductor device according to a typical embodiment includes: a semiconductor substrate; a trench for device isolation formed in the semiconductor substrate; a device isolation region which is made of a silicon oxide film embedded in the trench for device isolation and whose upper portion is protruded from the semiconductor substrate; and a sidewall insulating film which is formed on a sidewall of a portion of the device isolation region protruded from the semiconductor substrate and is made of silicon nitride or silicon oxynitride. The semiconductor device further includes: a gate insulating film which is formed on an active region of the semiconductor substrate defined by the device isolation region and is made of a first insulating film containing hafnium, oxygen and a first element as main components; and a metal gate electrode which is formed on the active region of the semiconductor substrate via the gate insulating film. In the case of an n-channel MISFET, the first element is an element belonging to any of Group 1, Group 2 and Group 3, and in the case of a p-channel MISFET, the first element is any of Al, Ti and Ta. Furthermore, the metal gate electrode partially extends on the device isolation region, and the sidewall insulating film is interposed between the gate insulating film located between the gate electrode and the active region of the semiconductor substrate and the device isolation region.

Also, a semiconductor device according to another typical embodiment includes: a semiconductor substrate; a trench for device isolation formed in the semiconductor substrate; a device isolation region which is made of a silicon oxide film embedded in the trench for device isolation; an active region defined by the device isolation region; and an insulator portion which is disposed adjacent to the device isolation region and is made of silicon nitride or silicon oxynitride. The semiconductor device further includes: a metal gate electrode which extends on the active region, the insulator portion and the device isolation region; and a first insulating film for a gate insulating film which is formed between the metal gate electrode and the active region, between the metal gate electrode and the insulator portion and between the metal gate electrode and the device isolation region. The first insulating film contains hafnium, oxygen and a first element as main components, in the case of an n-channel MISFET, the first element is an element belonging to any of Group 1, Group 2 and Group 3, and in the case of a p-channel MISFET, the first element is any of Al, Ti and Ta. Furthermore, a portion of the first insulating film located on the insulator portion is interposed between a portion of the first insulating film located on the active region and a portion of the first insulating film located on the device isolation region.

Also, a method of manufacturing a semiconductor device according to a typical embodiment includes: (a) a step of preparing a semiconductor substrate; (b) a step of forming, on the semiconductor substrate, a first insulating film which is for a gate insulating film of a MISFET and contains hafnium, oxygen and a first element as main components; (c) a step of forming a metal film for forming a metal gate electrode of the MISFET on the first insulating film; and (d) a step of forming a first material film on the metal film. The method further includes: (e) a step of patterning the first material film, the metal film and the first insulating film to form a stacked pattern; (f) a step of forming a sidewall insulating film made of silicon nitride or silicon oxynitride on a sidewall of the stacked pattern; and (g) a step of etching the semiconductor substrate with using the sidewall insulating film and the stacked pattern as an etching mask to form a trench for device isolation in the semiconductor substrate. The method further includes: (h) a step of forming a silicon oxide film on the semiconductor substrate so as to fill the trench for device isolation and cover the stacked pattern and the sidewall insulating film; and (i) a step of polishing the silicon oxide film until the first material film of the stacked pattern is exposed, thereby forming a device isolation region which is made of the silicon oxide film embedded in the device isolation trench and whose upper portion is protruded from the semiconductor substrate. The method further includes: (j) after the step (i), a step of removing the first material film of the stacked pattern; (k) after the step (j), a step of forming a silicon film on the semiconductor substrate including on the metal film and on the device isolation region; and (l) a step of patterning the silicon film and the metal film to form a metal gate electrode for the MISFET. Furthermore, when the MISFET is an n-channel MISFET, the first element is an element belonging to any of Group 1, Group 2 and Group 3, when the MISFET is a p-channel MISFET, the first element is any of Al, Ti and Ta, and at the step (l), the metal gate electrode is formed so that a portion of the metal gate electrode extends on the device isolation region.

The effects obtained by typical embodiments of the invention disclosed in the present application will be briefly described below.

According to the representative embodiments, the performance improvement of a semiconductor device can be achieved.

DETAILED DESCRIPTION

Figure 1:
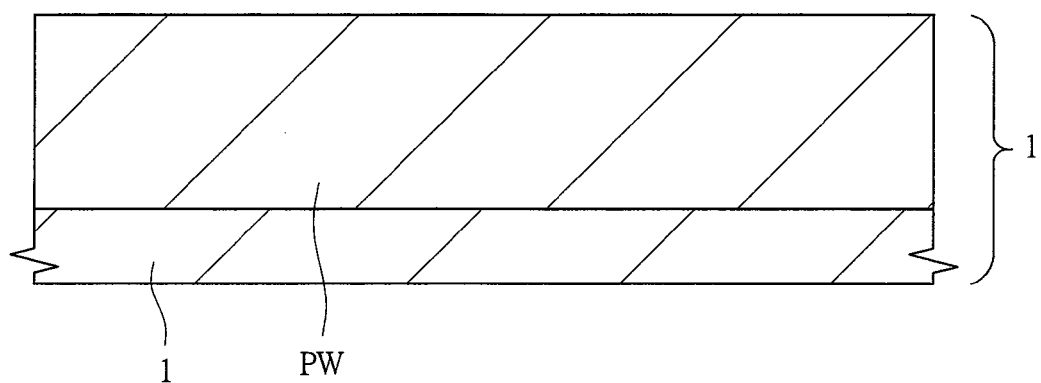
FIG. 1 is a sectional view of a main portion of a semiconductor device according to a first embodiment of the present invention during a manufacturing process thereof.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, the embodiments of the present invention will be described based on the drawings. Note that components having the same function are denoted by the same reference symbols throughout the drawings for describing the embodiments, and the repetitive description thereof is omitted. Also, in the following embodiments, the description of the same or similar parts is not repeated in principle except the case where it is particularly required.

Also, in the drawings used in the following embodiments, hatching is omitted in some cases even in a sectional view so as to make the drawings easy to see. Furthermore, hatching is used in some cases even in a plan view so as to make the drawings easy to see.

First Embodiment

The manufacturing process of a semiconductor device according to the present embodiment will be described with reference to the drawings. FIG. 1 to FIG. 25 are sectional views and a plan view of a main portion of a semiconductor device according to the present embodiment, that is, a semiconductor device having a MISFET (Metal Insulator Semiconductor Field Effect Transistor) during the manufacturing process thereof. Among FIG. 1 to FIG. 25, FIG. 1 to FIG. 12 and FIG. 14 to FIG. 25 are sectional views of the main portion, and FIG. 13 is a plan view of the main portion. Note that, in this embodiment, the case where an n-channel MISFET is formed as the MISFET will be described as an example.

First, as shown in FIG. 1, a semiconductor substrate (semiconductor wafer) 1 made of p-type single crystal silicon having a specific resistance of, for example, about 1 to 10 Ωcm or the like is prepared.

Next, a p-type well PW is formed in a region of the semiconductor substrate 1 in which an n-channel MISFET is to be formed. The p-type well PW is formed by, for example, ion-implanting a p-type impurity such as boron (B).

Next, a surface of the semiconductor substrate 1 is cleaned (washed) by removing a naturally-formed oxide film on the surface of the semiconductor substrate 1 by wet etching or the like using, for example, hydrofluoric acid (HF) aqueous solution. By this means, the surface (silicon surface) of the semiconductor substrate 1 (p-type well PW) is exposed.

Figure 2:
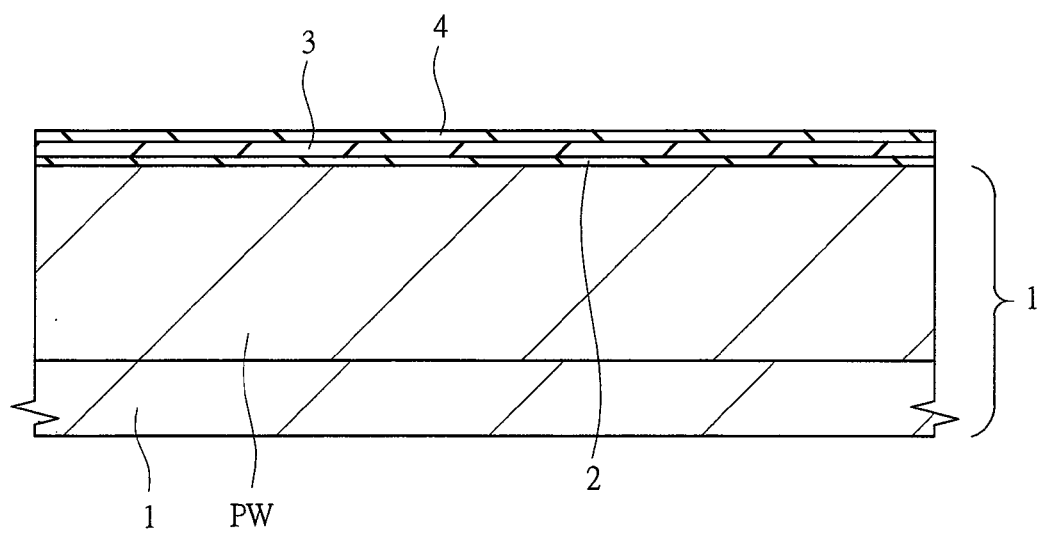
FIG. 2 is a sectional view of a main portion of the semiconductor device during the manufacturing process thereof continued from FIG. 1.

Next, as shown in FIG. 2, an interface layer (insulating layer, insulating film) 2 made of a silicon oxide film or a silicon oxynitride film is formed on the surface of the semiconductor substrate 1 (namely, on the surface of the p-type well PW).

An Hf-containing film 3 described later can be formed directly on the surface (silicon surface) of the semiconductor substrate 1 (p-type well PW) without forming the interface layer 2, but if the interface layer 2 is formed and the Hf-containing film 3 described later is then formed on the interface layer 2, since the number of defects such as traps can be reduced, the driving ability and reliability can be desirably improved. When the interface layer 2 is formed, the film thickness of the interface layer 2 can be made as small as about 1 nm. The interface layer 2 can be formed by, for example, a thermal oxidation method. Further, when the interface layer 2 is a silicon oxynitride film, it can be formed by a high-temperature short-time oxidation method using $N_2O$, $O_2$ and $H_2$.

Next, the Hf-containing film (Hf-containing layer) 3 is formed on a main surface of the semiconductor substrate 1, namely, on the interface layer 2. This Hf-containing film 3 is an insulating film to be a base for forming the high-dielectric gate insulating film of a MISFET.

The Hf-containing film 3 is an insulating film containing hafnium (Hf), and more specifically it is made of an insulating material containing hafnium (Hf) and oxygen (O). The Hf-containing film 3 may be preferably an HfO film (hafnium oxide film, typically, an $HfO_2$ film), an HfON film (hafnium oxynitride film), an HfSiON film (hafnium silicon oxynitride film) or an HfSiO film (hafnium silicate film). Among them, when the HfON film is used as the Hf-containing film 3, the improvement in heat resistance and further reduction of leakage current can be achieved. Therefore, the Hf-containing film 3 can be regarded as an insulating film containing hafnium (Hf) and oxygen (O) as main components. The film thickness (formation film thickness) of the Hf-containing film 3 may be set to, for example, about 2 nm. The Hf-containing film 3 in this stage does not contain an element for threshold reduction (here, rare earth element).

For example, the Hf-containing film 3 may be formed in the following manner.

When the Hf-containing film 3 is an HfSiON film, an HfSiO film is first deposited by using an ALD (Atomic Layer Deposition) method or a CVD (Chemical Vapor Deposition) method. Then, this HfSiO film is subjected to a nitriding process such as a plasma nitridation process, thereby forming an HfSiON film (namely, the HfSiO film is nitrided to an HfSiON film). After the nitridation process, heat treatment may be performed in an inert or oxidizing atmosphere.

When the Hf-containing film 3 is an HfON film, an HfO film (typically an $HfO_2$ film) is first deposited by using an ALD method or a CVD method. Then, this HfO film is subjected to a nitriding process such as a plasma nitridation process, thereby forming an HfON film (namely, the HfO film is nitrided to an HfON film). After the nitridation process, heat treatment may be performed in an inert or oxidizing atmosphere.

When the Hf-containing film 3 is an HfO film (typically an $HfO_2$ film), an HfO film (typically an $HfO_2$ film) can be deposited by using an ALD method or a CVD method, and it is unnecessary to perform a nitridation process. Thereafter, heat treatment may be performed in an inert or oxidizing atmosphere.

When the Hf-containing film 3 is an HfSiO film, an HfSiO film can be deposited by using an ALD method or a CVD method, and it is unnecessary to perform a nitridation process. Thereafter, heat treatment may be performed in an inert or oxidizing atmosphere.

After the Hf-containing film 3 is formed, a rare earth-containing film (rare earth-containing layer) 4 is formed as a material film containing an element for threshold reduction on the main surface of the semiconductor substrate 1, namely, on the Hf-containing film 3 so as to come in contact with the Hf-containing film 3.

As the element for threshold reduction introduced into the Hf-based gate insulating film of the n-channel MISFET for lowering the absolute value of the threshold voltage of the n-channel MISFET, rare earth elements are preferred. Among them, La (lanthanum) is especially preferred. Therefore, the rare earth-containing film 4 is a material film containing a rare earth element, and it contains a rare earth element as a main component and preferably contains La (lanthanum). From the viewpoint of stability, the rare earth-containing film 4 is preferably a rare earth oxide film (rare earth oxide layer), and more preferably a lanthanum oxide film (typical lanthanum oxide is $La_2O_3$). The rare earth-containing film 4 in this stage does not contain Hf (hafnium).

The rare earth-containing film 4 can be formed by a PVD (Physical Vapor Deposition) method, an ALD method or the like, and a film thickness (formation film thickness) thereof may be set to, for example, about 0.5 nm.

Next, heat treatment is applied to the semiconductor substrate 1. This heat treatment process can be performed in an inert gas atmosphere (or in a nitrogen gas atmosphere) within the preferably heat treatment temperature range of 600 to 1000° C.

Figure 3:
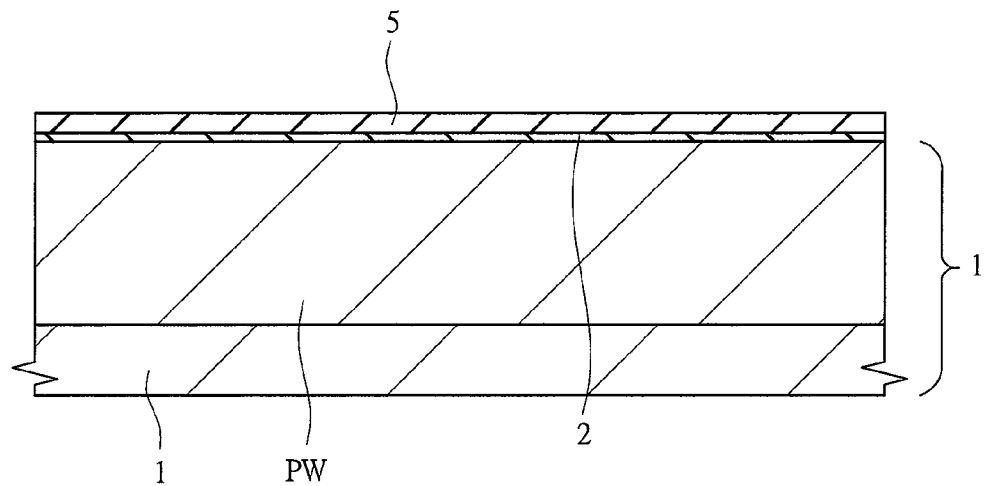
FIG. 3 is a sectional view of a main portion of the semiconductor device during the manufacturing process thereof continued from FIG. 2.

By this heat treatment, the Hf-containing film 3 and the rare earth-containing film 4 are reacted with (mixed with, mutually diffused in) each other, and an Hf-containing insulating film 5 which is a reaction layer (mixed layer) between the Hf-containing film 3 and the rare earth-containing film 4 is formed as shown in FIG. 3. That is, the rare earth element in the rare earth-containing film 4 is introduced into the Hf-containing film 3, and the Hf-containing film 3 is changed to the Hf-containing insulating film 5. Although there are the case where concentration distributions of respective elements (Hf, rare earth element and the like) in a thickness direction in the Hf-containing insulating film 5 are even and the case where they are uneven (for example, uneven distribution in which composition distributions of the Hf-containing film 3 and the rare earth-containing film 4 before the reaction therebetween are maintained to some extent), both the cases are acceptable. Here, the concentration distribution in the thickness direction corresponds to a concentration distribution in a direction perpendicular to the main surface of the semiconductor substrate 1 in the Hf-containing insulating film 5.

Furthermore, when the interface layer 2 is formed before the Hf-containing film 3 is formed, it is preferred that the reaction between the Hf-containing film 3 and the interface layer 2 therebelow is suppressed during the heat treatment so as to leave the interface layer 2 made of a silicon oxide film or a silicon oxynitride film. In this case, the insulating interface layer 2 made of a thin silicon oxide film or silicon oxynitride film exists at an interface between the Hf-containing insulating film 5 and the semiconductor substrate 1 (p-type well PW). By this means, an excellent device in which deterioration of a driving force and reliability is suppressed can be manufactured. However, some of the Hf from the Hf-containing film 3 or the rare earth element from the rare earth-containing film 4 may be introduced into the interface layer 2 in some cases. Further, the structure where the interface layer 2 and the Hf-containing insulating film 5 are mixed with each other may be formed in some cases. Note that it is desirable that neither Hf (hafnium) nor a rare earth element exists in a portion where the interface layer 2 comes in contact with the semiconductor substrate 1.

The Hf-containing film 3 contains hafnium (Hf) and oxygen (O) as main components, and the rare earth-containing film 4 contains a rare earth element (Ln) as a main component. Therefore, the Hf-containing insulating film 5 formed by the reaction between the Hf-containing film 3 and the rare earth-containing film 4 is an insulating film containing hafnium (Hf), oxygen (O) and the rare earth element (Ln) as main components.

Here, since the rare earth element Ln introduced into the Hf-containing insulating film 5 is an element introduced for threshold reduction (lowering the absolute value of the threshold voltage), it can be regarded as an element for threshold reduction (first element). Therefore, the Hf-containing insulating film 5 can be regarded as an insulating film containing hafnium (Hf), oxygen (O) and the element for threshold reduction (first element) as main components.

The rare earth element Ln which the Hf-containing insulating film 5 contains is the same as the rare earth element Ln which the rare earth-containing film 4 contains. Further, when the Hf-containing film 3 contains not only hafnium (Hf) and oxygen (O) but also nitrogen (N), the Hf-containing insulating film 5 eventually contains not only hafnium (Hf), oxygen (O) and the rare earth element (Ln) but also nitrogen (N). Furthermore, when the Hf-containing film 3 contains not only hafnium (Hf) and oxygen (O) but also Si (silicon), the Hf-containing insulating film 5 eventually contains not only hafnium (Hf), oxygen (O) and the rare earth element (Ln) but also Si (silicon).

Further, the rare earth-containing film 4 is preferably a rare earth oxide film as described above. In this case, the rare earth-containing film 4 contains oxygen (O) in addition to the rare earth element (Ln), but since the Hf-containing film 3 also contains oxygen (O), the Hf-containing insulating film 5 contains oxygen (O) regardless of whether or not the rare earth-containing film 4 contains oxygen (O). More specifically, it is preferred that the rare earth-containing film 4 further contains oxygen (O) in addition to the rare earth element (Ln), but the Hf-containing insulating film 5 contains oxygen (O) in both cases where the rare earth-containing film 4 contains oxygen (O) and it does not contain oxygen (O).

Accordingly, when the Hf-containing film 3 is an HfSiON film, the Hf-containing insulating film 5 is an HfLnSiON film, when the Hf-containing film 3 is an HfSiO film, the Hf-containing insulating film 5 is an HfLnSiO film, when the Hf-containing film 3 is an Hf ON film, the Hf-containing insulating film 5 is an HfLnON film, and when the Hf-containing film 3 is an HfO film (typically an $HfO_2$ film), the Hf-containing insulating film 5 is an HfLnO film.

Note that, even when the Hf-containing insulating film 5 is expressed as an HfLaSiON film, it does not mean that an atomic ratio of Hf, La, Si, O and N in the HfLaSiON film is limited to 1:1:1:1:1. The same holds true for films other than the HfLaSiON film.

After the heat treatment process is performed, if an unreacted portion (portion which has not reacted in the heat treatment process) remains in the rare earth-containing film 4, it may be removed by etching (preferably, wet-etching).

Figure 4:
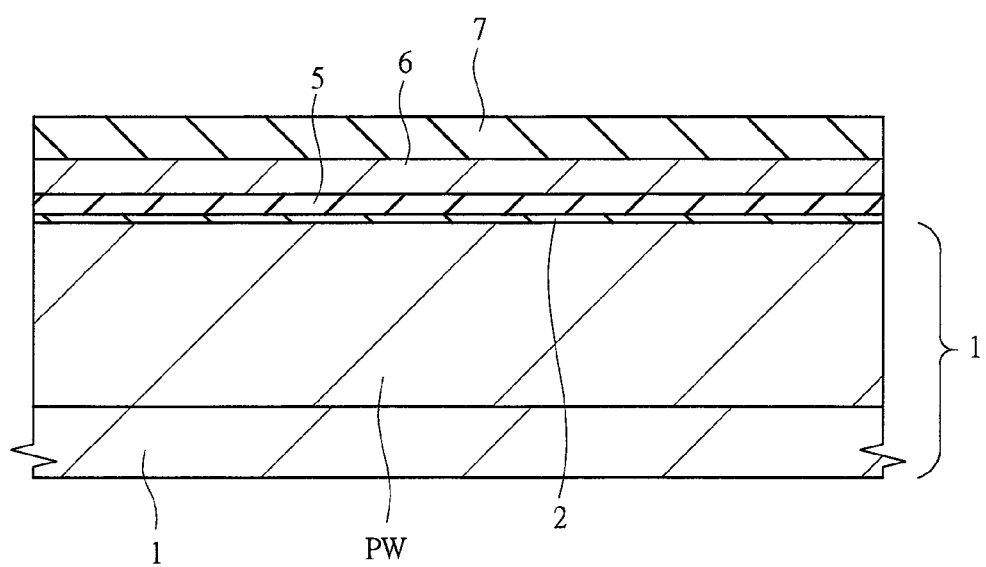
FIG. 4 is a sectional view of a main portion of the semiconductor device during the manufacturing process thereof continued from FIG. 3.

Next, as shown in FIG. 4, a metal film (metal layer, metal gate film) 6 for a metal gate (metal gate electrode) is formed on the main surface of the semiconductor substrate 1, namely, on the Hf-containing insulating film 5.

The metal film 6 is preferably a titanium nitride (TiN) film, a tantalum nitride (TaN) film, a tungsten nitride (TiN) film, a titanium carbide (TiC) film, a tantalum carbide (TaC) film, a tungsten carbide (WC) film or a tantalum carbide nitride (TaCN) film. The metal film 6 can be formed by, for example, a sputtering method. From the viewpoint of easy processability and gate resistance, it is further preferred that the metal film is a titanium nitride (TiN) film. The film thickness (formation film thickness) of the metal film 6 may be set to, for example, about 5 to 20 nm.

Next, an insulating film 7 is formed as a material film on the main surface of the semiconductor substrate 1, namely, on the metal film 6. The insulating film 7 is preferably made of a silicon nitride film, and it is formed by a plasma CVD method which is a relatively low-temperature process.

The insulating film 7 is preferably a silicon nitride film, but it may be another material film. However, it is necessary to select the insulating film 7 so that the insulating film 7 can be selectively removed at a step shown in FIG. 11 described later while suppressing the etching of a device isolation region 13 and a sidewall insulating film SW1 described later and the metal film 6. The film thickness (formation film thickness) of the insulating film 7 may be set to, for example, about 50 to 100 nm.

Figure 5:
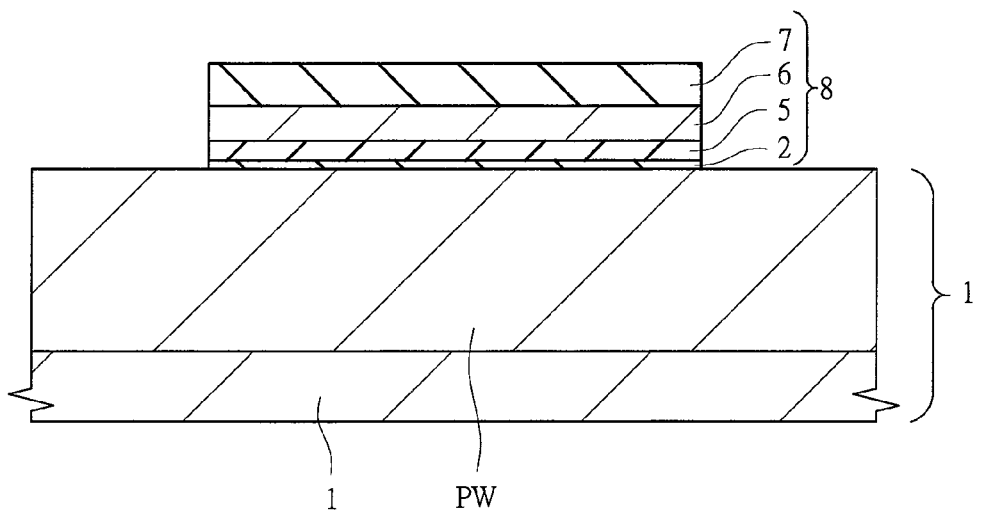
FIG. 5 is a sectional view of a main portion of the semiconductor device during the manufacturing process thereof continued from FIG. 4.

Next, as shown in FIG. 5, the insulating film 7, the metal film 6, the Hf-containing insulating film 5 and the interface layer 2 are patterned to form a stacked pattern 8 made up of the insulating film 7, the metal film 6, the Hf-containing insulating film 5 and the interface layer 2 that have been patterned. For example, the patterning process can be performed in the following manner.

That is, the insulating film 7 is first patterned by using a photolithography technique and a dry-etching technique. Then, the metal film 6, the Hf-containing insulating film 5 and the interface layer 2 are patterned by etching utilizing the patterned insulating film 7 as an etching mask. This patterning process can be performed by a dry-etching or a combination of a dry-etching and a wet-etching. By this means, a stacked pattern (stacked film pattern) 8 in which the interface layer 2, the Hf-containing insulating film 5, the metal film 6 and the insulating film 7 are stacked in this order from the bottom can be formed. Since a region where the stacked pattern 8 has been formed serves as an active region 14 described later, the stacked pattern 8 is formed in a region to be the active region 14 in advance.

As another aspect, the stacked pattern 8 can be formed by patterning the insulating film 7, the metal film 6, the Hf-containing insulating film 5 and the interface layer 2 by the etching utilizing a photoresist pattern (not shown) formed on the insulating film 7 as an etching mask.

Figure 6:
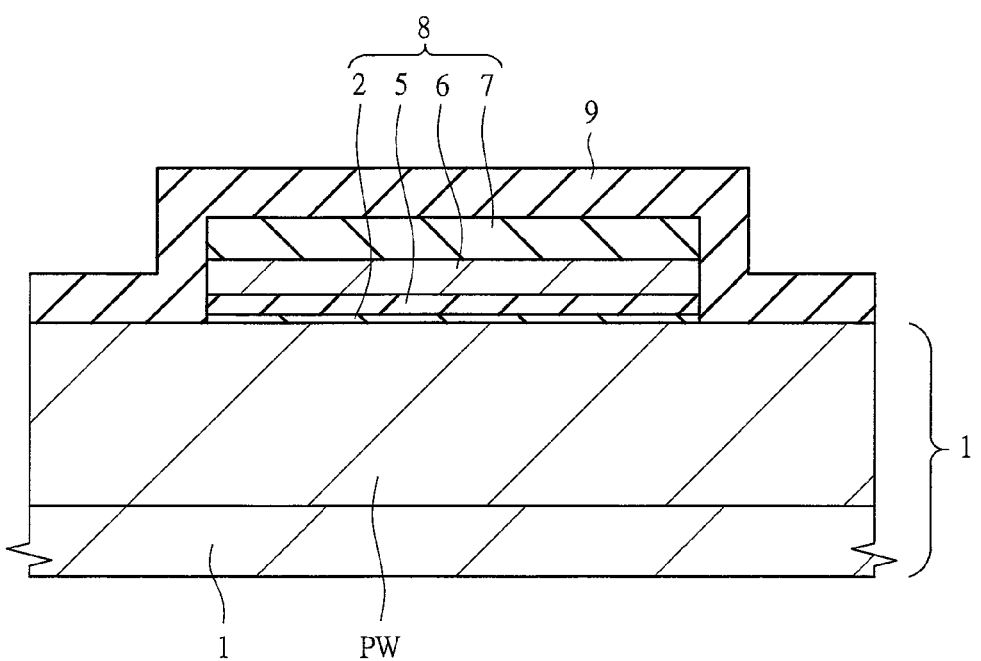
FIG. 6 is a sectional view of a main portion of the semiconductor device during the manufacturing process thereof continued from FIG. 5.
Figure 7:
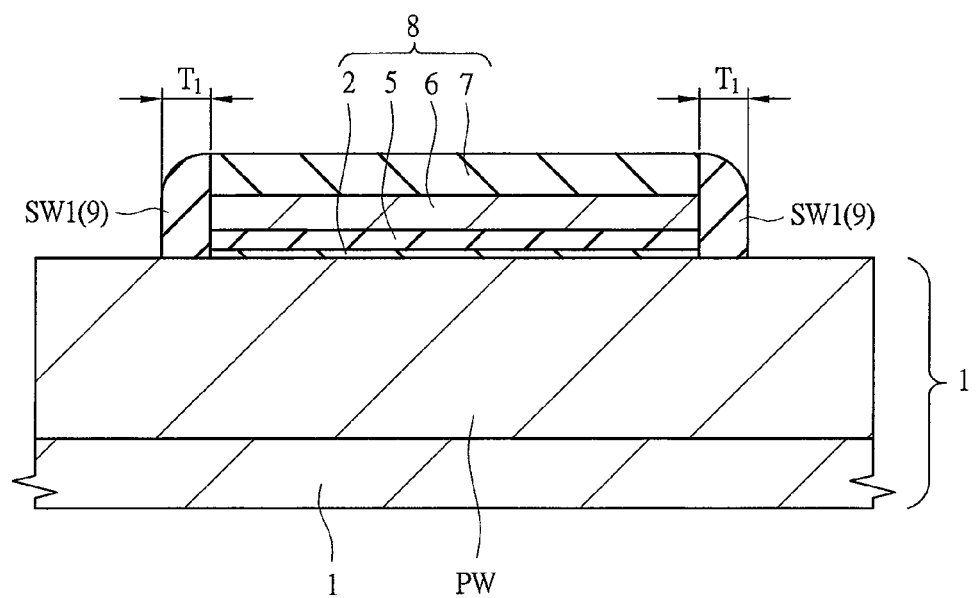
FIG. 7 is a sectional view of a main portion of the semiconductor device during the manufacturing process thereof continued from FIG. 6.

Next, a sidewall insulating film (sidewall, sidewall spacer, sidewall insulating film) SW1 made of silicon nitride or silicon oxynitride is formed on a sidewall of the stacked pattern 8 as an insulator (insulating film). Specifically, an insulating film 9 is formed on the semiconductor substrate 1 so as to cover the stacked pattern 8 as shown in FIG. 6, and thereafter anisotropic etching (etchback) is performed to this insulating film 9, thereby forming the sidewall insulating films SW1 made of the insulating film 9 left on the sidewalls of the stacked pattern 8 as shown in FIG. 7. At this time, the insulating film 9 other than the portions to be the sidewall insulating films SW1 is removed. The sidewall insulating films SW1 are formed on the sidewalls of the stacked pattern 8 in a shape of a sidewall spacer.

The insulating film 9 is made of a silicon nitride film or a silicon oxynitride film, and the silicon nitride film is more preferable. Therefore, the sidewall insulating film SW1 is made of silicon nitride (when the insulating film 9 is a silicon nitride film) or silicon oxynitride (when the insulating film 9 is a silicon oxynitride film), and it is more preferably made of silicon nitride. As described later, since the sidewall insulating film SW1 has a function of preventing the diffusion of the element for threshold reduction which the Hf-containing insulating film 5 (or Hf-containing insulating film 5a described later) contains into the device isolation region 13 described later, the sidewall insulating film SW1 needs to be formed of silicon nitride or silicon oxynitride in consideration of this function, and it is more preferable that the sidewall insulating film SW1 is made of silicon nitride.

The insulating film 9 for forming the sidewall insulating film SW1 can be formed by a thermal CVD method or a plasma CVD method, but it should be made as a film having a wet-etching resistance higher than that of the insulating film 7 by adjusting a film formation temperature, a pressure at the time of film formation and the like.

Figure 8:
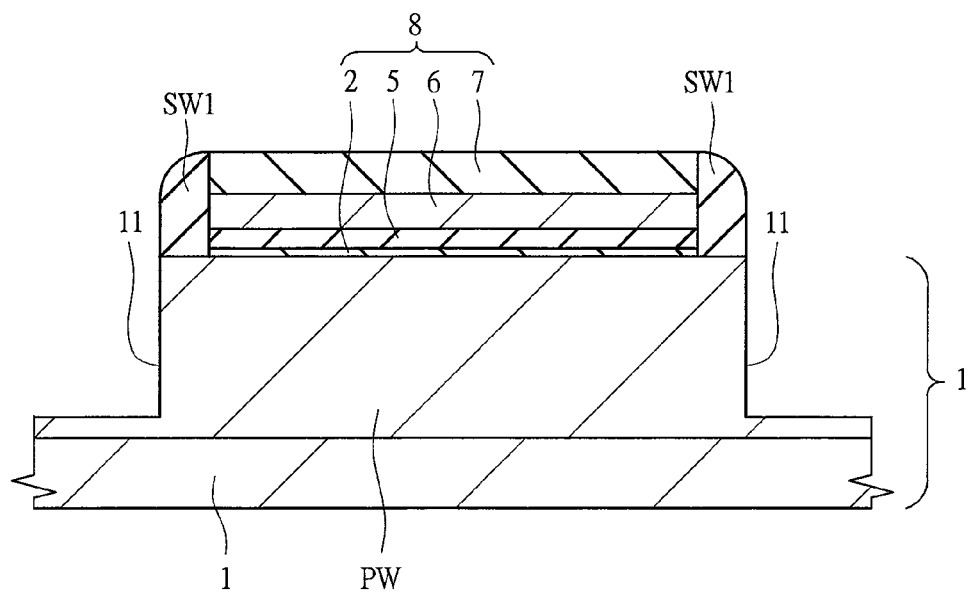
FIG. 8 is a sectional view of a main portion of the semiconductor device during the manufacturing process thereof continued from FIG. 7.

Next, as shown in FIG. 8, the semiconductor substrate 1 is etched (preferably dry-etched) down to a predetermined depth with utilizing (the insulating film 7 of) the stacked pattern 8 and the sidewall insulating films SW1 as an etching mask, thereby forming trenches (trenches for device isolation) 11 in the semiconductor substrate 1. The trenches 11 are formed so as to align with the side surfaces of the sidewall insulating films SW1 (side surfaces which are not adjacent to the stacked pattern 8). As described later, since the device isolation region 13 is formed by embedding a silicon oxide film 12 in the trench 11, the trench 11 can be regarded as a trench for device isolation.

Figure 9:
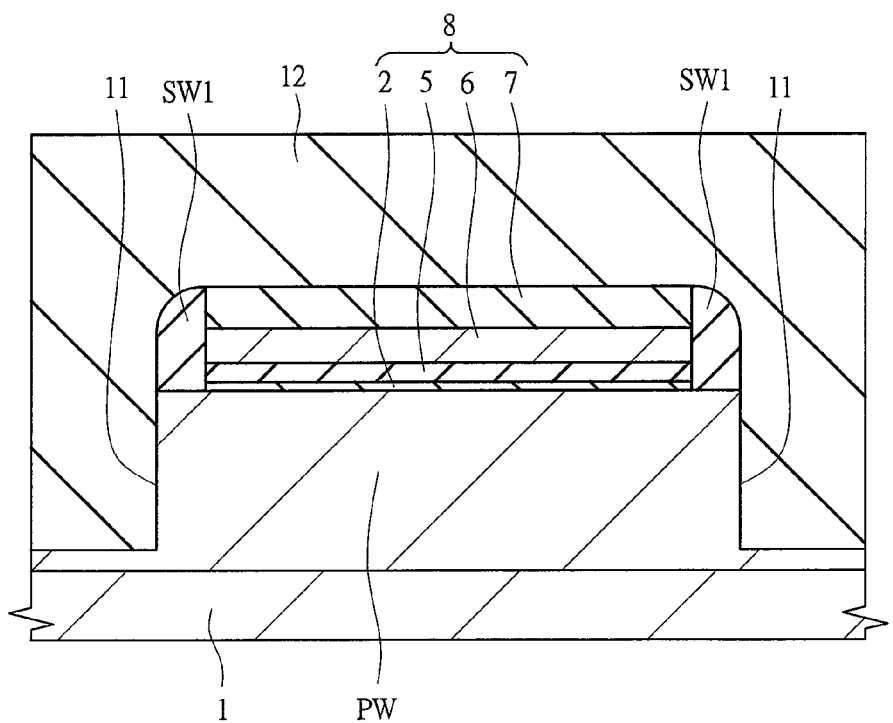
FIG. 9 is a sectional view of a main portion of the semiconductor device during the manufacturing process thereof continued from FIG. 8.

Next, as shown in FIG. 9, the silicon oxide film 12 as an insulating film is formed on the main surface of the semiconductor substrate 1 so as to fill the trench 11 by using a CVD method or the like. The silicon oxide film 12 is formed so as to fill the trench 11 and cover the stacked pattern 8 and the sidewall insulating films SW1.

Figure 10:
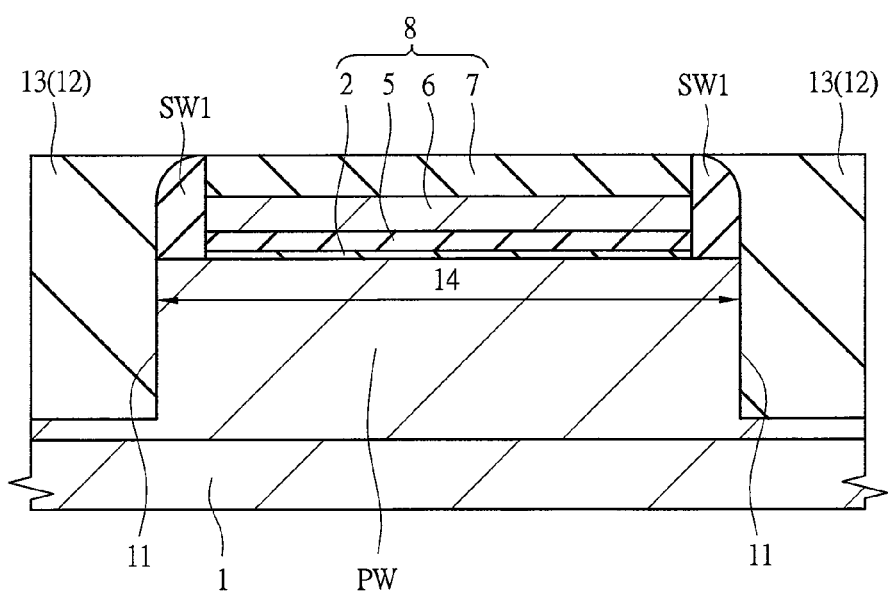
FIG. 10 is a sectional view of a main portion of the semiconductor device during the manufacturing process thereof continued from FIG. 9.

Next, as shown in FIG. 10, an upper surface of the silicon oxide film 12 is polished by a CMP (Chemical Mechanical Polishing). This polishing is finished at a stage where an upper surface of the uppermost insulating film 7 in the stacked pattern 8 has been exposed. The device isolation region 13 is formed from the silicon oxide film 12 embedded in the trench 11. As shown also in FIG. 10, an upper surface of the device isolation region 13 is located at a position higher than the surface of the semiconductor substrate 1, and it is approximately flush with an upper surface of the stacked pattern (namely, upper surface of the insulating film 7). More specifically, the device isolation regions 13 are protruded beyond the surface of the semiconductor substrate 1. Namely, by polishing the silicon oxide film 12 until the insulating film 7 in the stacked pattern 8 is exposed, the device isolation regions 13 which are made up of the silicon oxide film 12 embedded in the trenches (device isolation trenches) 11 and whose upper portions are protruded from the semiconductor substrate 1 are formed. In this state, a bottom surface of the device isolation region 13 comes in contact with (the semiconductor substrate 1 constituting) a bottom surface of the trench 11, and a side surface of the device isolation region 13 comes in contact with (the semiconductor substrate 1 constituting) a side surface of the trench 11 and a side surface of the sidewall insulating film SW1 (side surface which is not adjacent to the stacked pattern 8). Therefore, the sidewall insulating film SW1 is in a state of being sandwiched between the stacked pattern 8 and the device isolation region 13.

The sidewall insulating film SW1 is formed on the sidewall of the stacked pattern 8, but since the device isolation region 13 is formed so as to come in contact with (be adjacent to) the sidewall insulating film SW1, when the device isolation region 13 is formed, the sidewall insulating film SW1 is formed on a portion of a sidewall of the device isolation region 13 which is protruded from the surface of the semiconductor substrate 1. A region (planar region) surrounded by the device isolation regions 13 on the main surface of the semiconductor substrate 1 constitutes the active region 14. More specifically, the active region 14 is provided (defined) by the device isolation regions 13 and it is surrounded by the device isolation regions 13. The p-type well PW is formed in the active region 14. The active region 14 corresponds to a region in which the stacked pattern 8 and the sidewall isolation films SW1 formed on the sidewalls thereof are formed.

Figure 11:
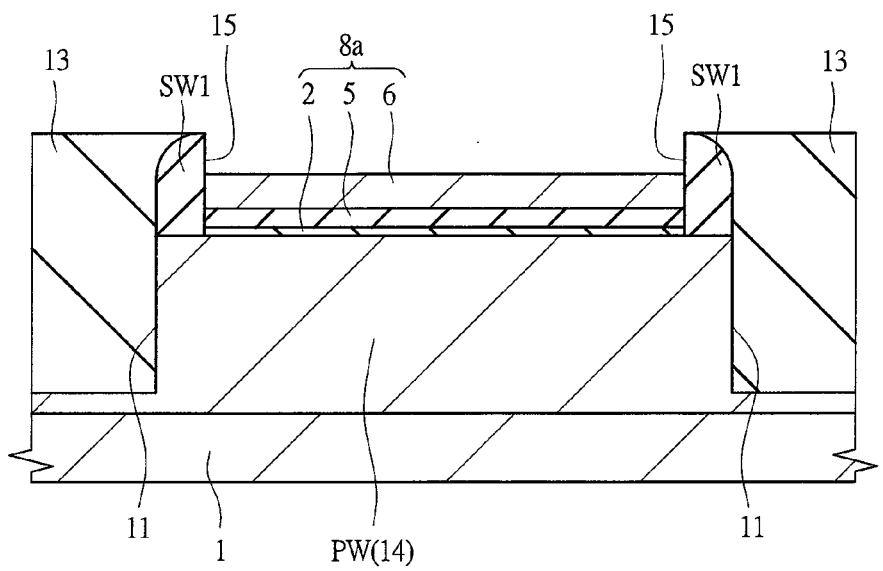
FIG. 11 is a sectional view of a main portion of the semiconductor device during the manufacturing process thereof continued from FIG. 10.

Next, as shown in FIG. 11, the insulating film 7 in the stacked pattern 8 is selectively removed by wet-etching. By removing the insulating film 7, (an upper surface of) the metal film 6 constituting the stacked pattern 8 is exposed. The stacked pattern 8 made up of the interface layer 2, the Hf-containing insulating film 5, the metal film 6 and the insulating film 7 is changed to a stacked pattern 8a made up of the interface layer 2, the Hf-containing insulating film 5 and the metal film 6 by the removal of the insulating film 7. Here, the stacked pattern 8a corresponds to a pattern obtained by removing the insulating film 7 from the stacked pattern 8.

In the etching process of the insulating film 7 (the step shown in FIG. 11), the insulating film 7 is etched by using etchant having selectivity to the sidewall insulating film SW1, the device isolation region 13 (silicon oxide film 12) and the metal film 6 in the stacked pattern 8. More specifically, the insulating film 7 is wet-etched by using the etchant by which an etching rate of the insulating film 7 becomes larger than respective etching rates of the sidewall insulating film SW1, the device isolation region 13 (silicon oxide film 12) and the metal film 6. By this means, the insulating film 7 is selectively removed and the sidewall insulating film SW1, the device isolation region 13 and the metal film 6 can be left. The Hf-containing insulating film 5 and the interface layer 2 which are located below the metal film 6 are also left without being etched.

When both the insulating film 7 and the sidewall insulating film SW1 are formed of silicon nitride, as described above, by controlling film formation conditions of the insulating film 9 (silicon nitride film) for forming the sidewall insulating film SW1 and film formation conditions of the insulating film 7 (silicon nitride film), the insulating film 7 can be selectively etched while suppressing etching of the sidewall insulating film SW1. For example, by adjusting film formation conditions such as a film formation temperature, the insulating film 9 (silicon nitride film) can be formed as a film denser than the insulating film 7 (silicon nitride film), so that it becomes possible to selectively etch the insulating film 7 while suppressing etching of the sidewall insulating film SW1.

A recess (recessed portion) 15 is formed by the removal of the insulating film 7. This recess 15 is a space where the insulating film 7 exists until it is removed. A bottom surface of the recess 15 is formed by the upper surface of the metal film 6, and side surfaces of the recess 15 are formed by side surfaces of the sidewall insulating films SW1 (side surfaces which are in contact with the insulating film 7 until the insulating film 7 is removed).

As another aspect, the etching process of the insulating film 7 (step shown in FIG. 11) may be performed by dry-etching. However, it is more preferred that the etching process of the insulating film 7 (step shown in FIG. 11) is performed by wet etching because the etching selectivity can be easily increased.

Figure 12:
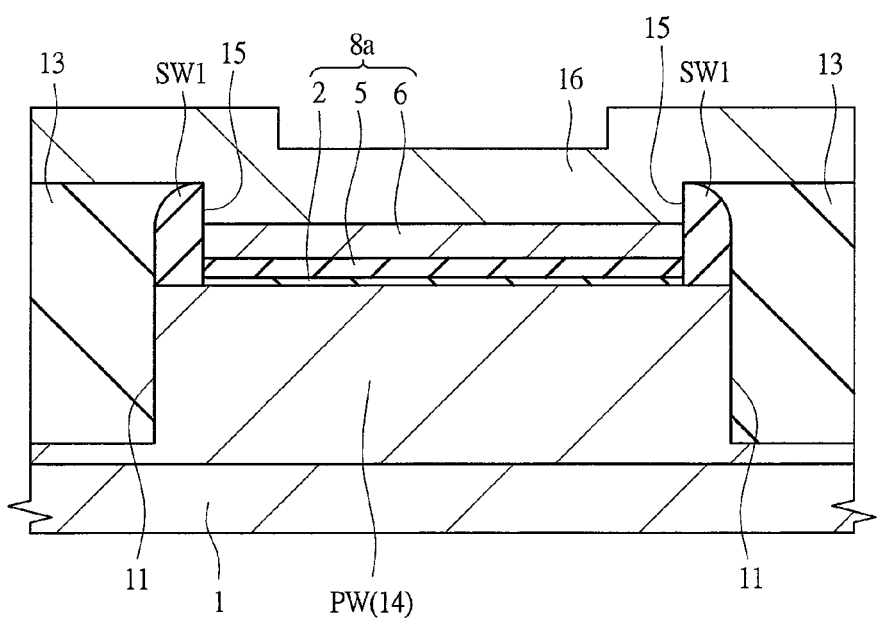
FIG. 12 is a sectional view of a main portion of the semiconductor device during the manufacturing process thereof continued from FIG. 11.
Figure 13:
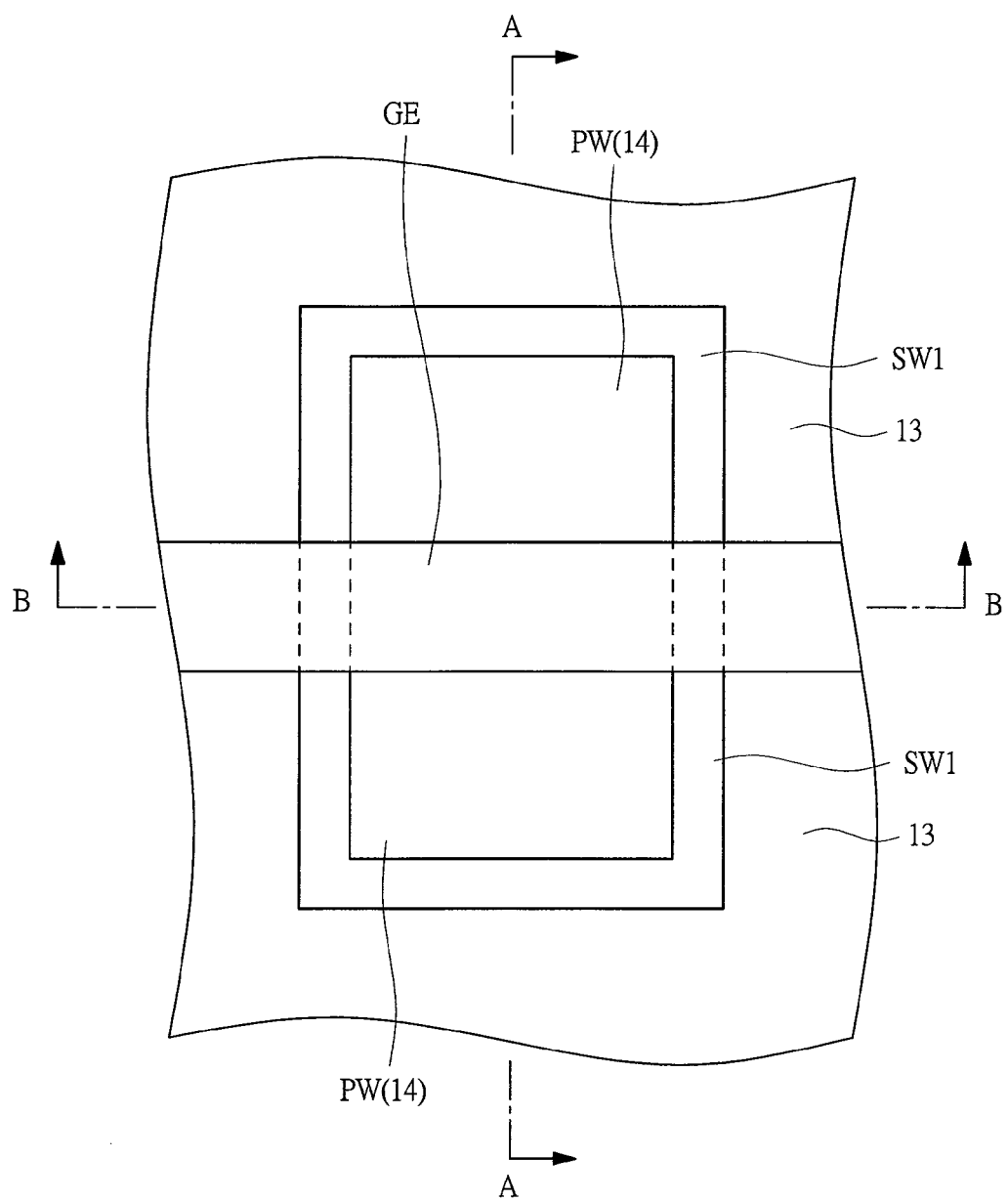
FIG. 13 is a plan view of a main portion of the semiconductor device during the manufacturing process thereof continued from FIG. 12.

Next, as shown in FIG. 12, a silicon film 16 is formed on the whole main surface of the semiconductor substrate 1. More specifically, the silicon film 16 is formed on the semiconductor substrate 1 including on the metal film 6, on the sidewall insulating film SW1 and on the device isolation region 13. The silicon film 16 is formed so as to fill the recess 15 and cover the stacked pattern 8a, the sidewall insulating film SW1 and the device isolation region 13. After the silicon film 16 is formed, the upper surface of the metal film 6 in the stacked pattern 8a is in contact and covered with the silicon film 16, and the upper surface of the device isolation region 13 is in contact and covered with the silicon film 16.

The silicon film 16 may be a polycrystal silicon film or an amorphous silicon film, but even when the silicon film 16 is an amorphous silicon film at the time of film formation thereof, it may be changed to a polycrystal silicon film by heat treatment (for example, annealing treatment for activating impurities introduced into source and drain regions) after the film formation. The film thickness (formation film thickness) of the silicon film 16 may be set to, for example, about 30 to 100 nm.

Figure 14:
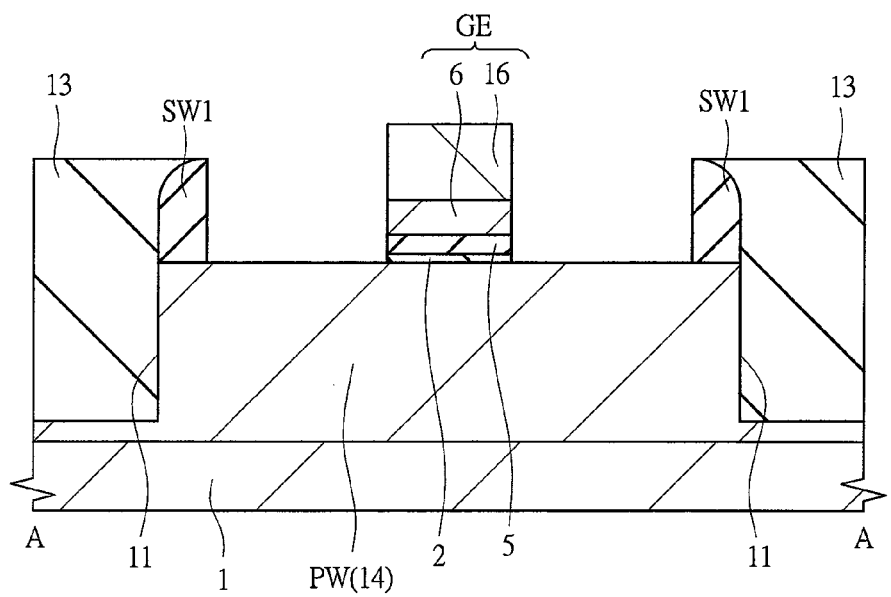
FIG. 14 is a sectional view (sectional view taken along the line A-A) of a main portion of the semiconductor device during the same manufacturing process thereof as that shown in FIG. 13.
Figure 15:
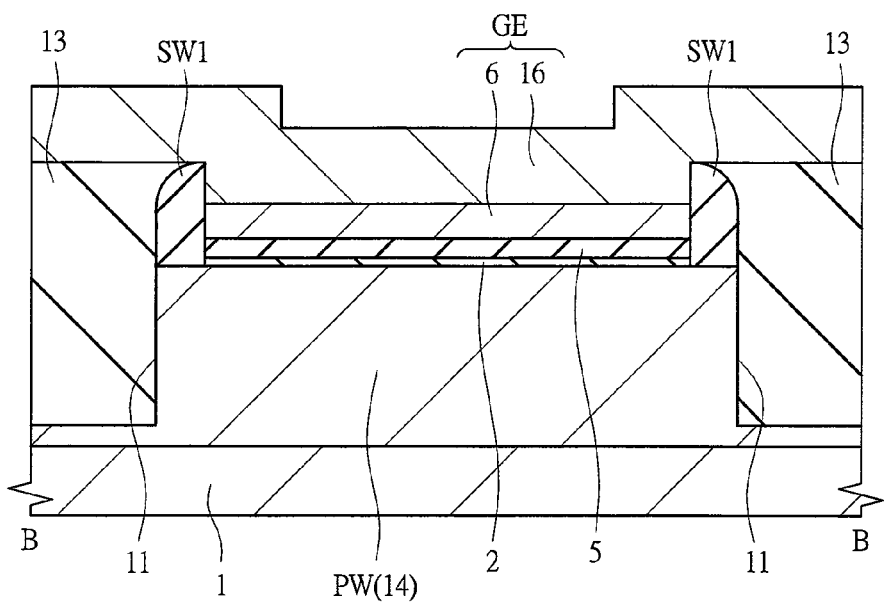
FIG. 15 is a sectional view (sectional view taken along the line B-B) of a main portion of the semiconductor device during the same manufacturing process thereof as that shown in FIG. 13 and FIG. 14.

Next, by patterning the silicon film 16 and the metal film 6 (metal film 6 constituting the stacked pattern 8a), a gate electrode GE made up of the patterned metal film 6 and silicon film 16 is formed as shown in FIG. 13 to FIG. 15. This patterning process (process of forming the gate electrode GE) can be performed by forming a photoresist pattern (not shown) on the silicon film 16 by using a photolithography technique and then etching (preferably, dry-etching) the silicon film 16 and the metal film 6 with using the photoresist pattern as an etching mask to perform patterning. Thereafter, the photoresist pattern is removed.

Figure 16:
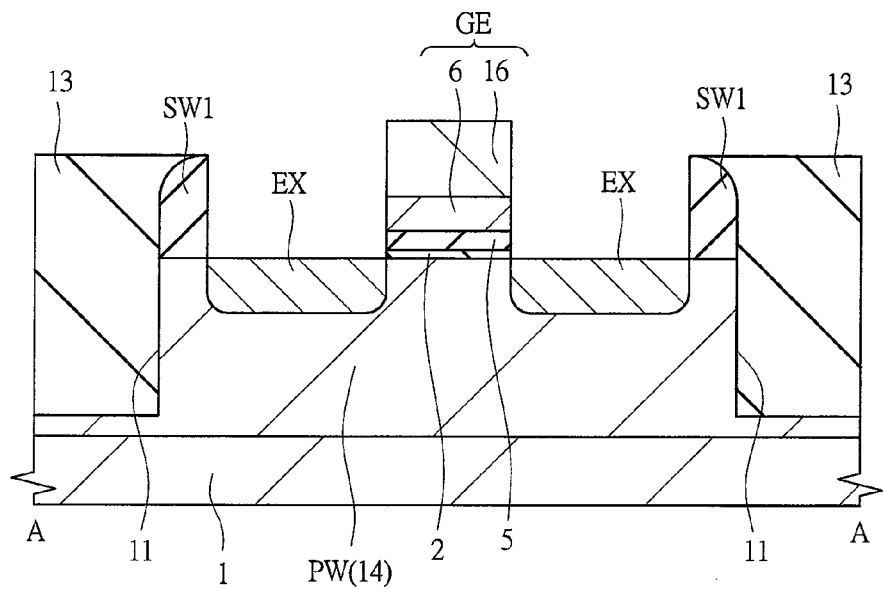
FIG. 16 is a sectional view (sectional view taken along the line A-A) of a main portion of the semiconductor device during the manufacturing process thereof continued from FIG. 13 to FIG. 15.
Figure 17:
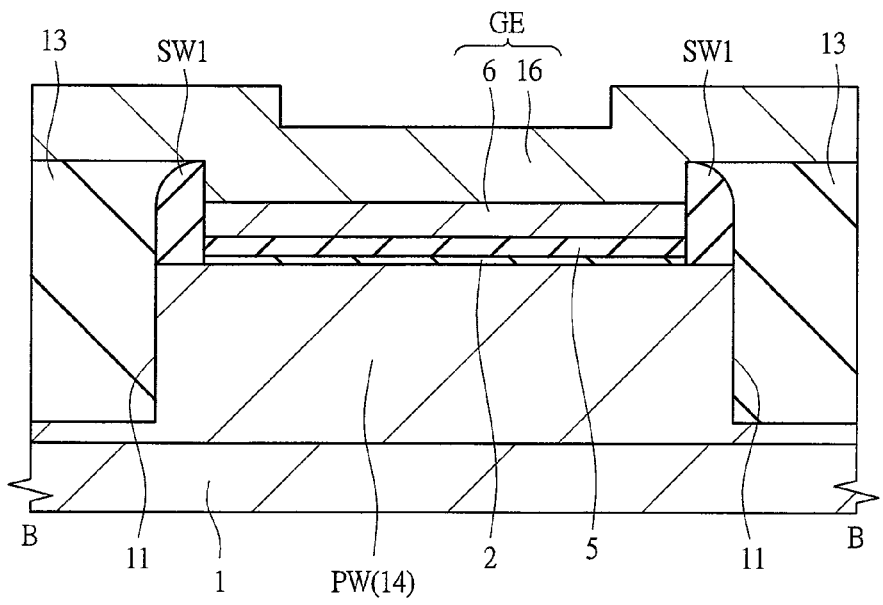
FIG. 17 is a sectional view (sectional view taken along the line B-B) of a main portion of the semiconductor device during the same manufacturing process thereof as that shown in FIG. 16.
Figure 18:
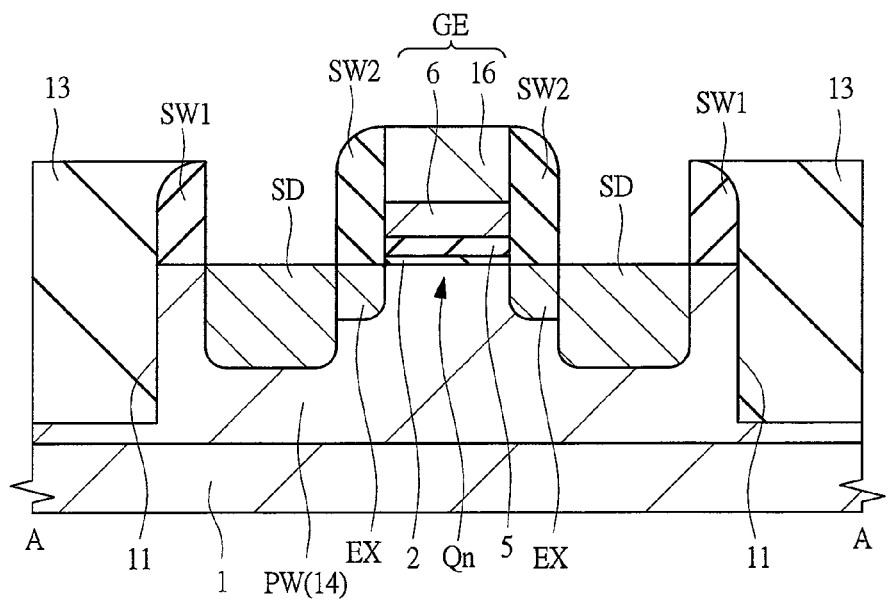
FIG. 18 is a sectional view (sectional view taken along the line A-A) of a main portion of the semiconductor device during the manufacturing process thereof continued from FIG. 16 and FIG. 17.
Figure 19:
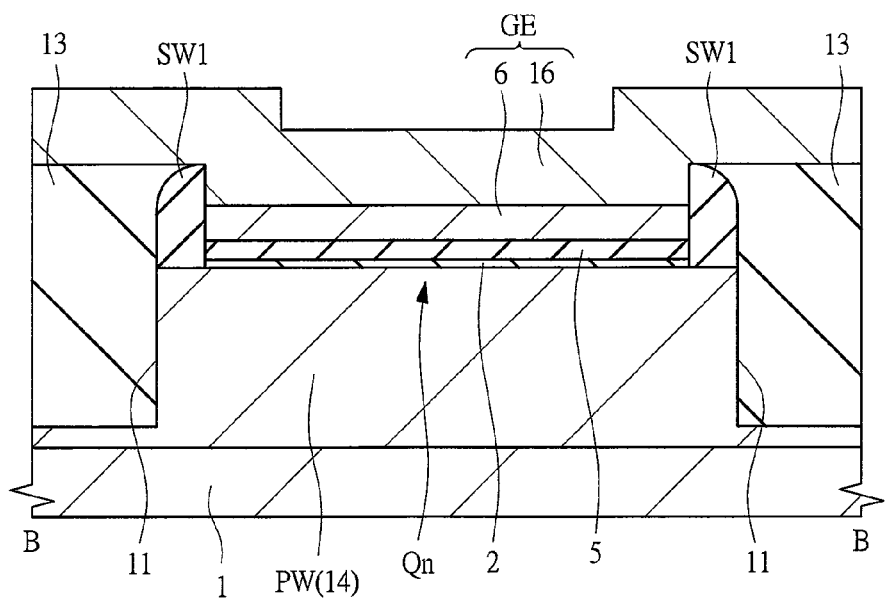
FIG. 19 is a sectional view (sectional view taken along the line B-B) of a main portion of the semiconductor device during the same manufacturing process thereof as that shown in FIG. 18.
Figure 20:
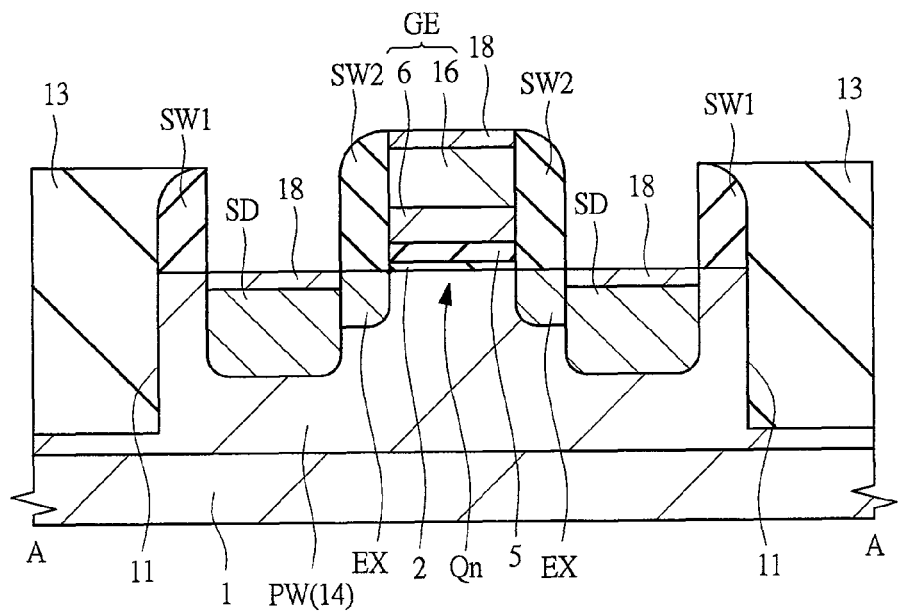
FIG. 20 is a sectional view (sectional view taken along the line A-A) of a main portion of the semiconductor device during the manufacturing process thereof continued from FIG. 18 and FIG. 19.
Figure 21:
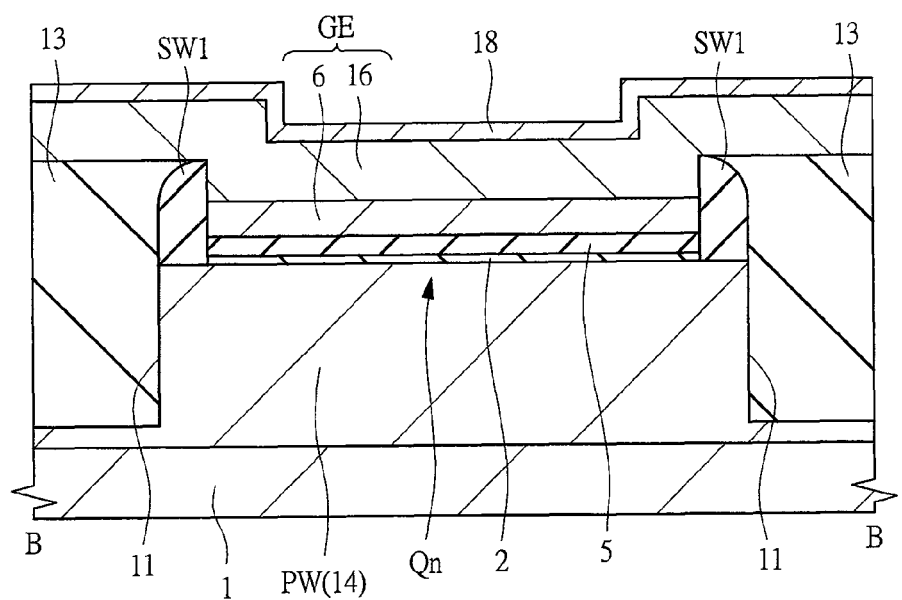
FIG. 21 is a sectional view (sectional view taken along the line B-B) of a main portion of the semiconductor device during the same manufacturing process thereof as that shown in FIG. 20.
Figure 22:
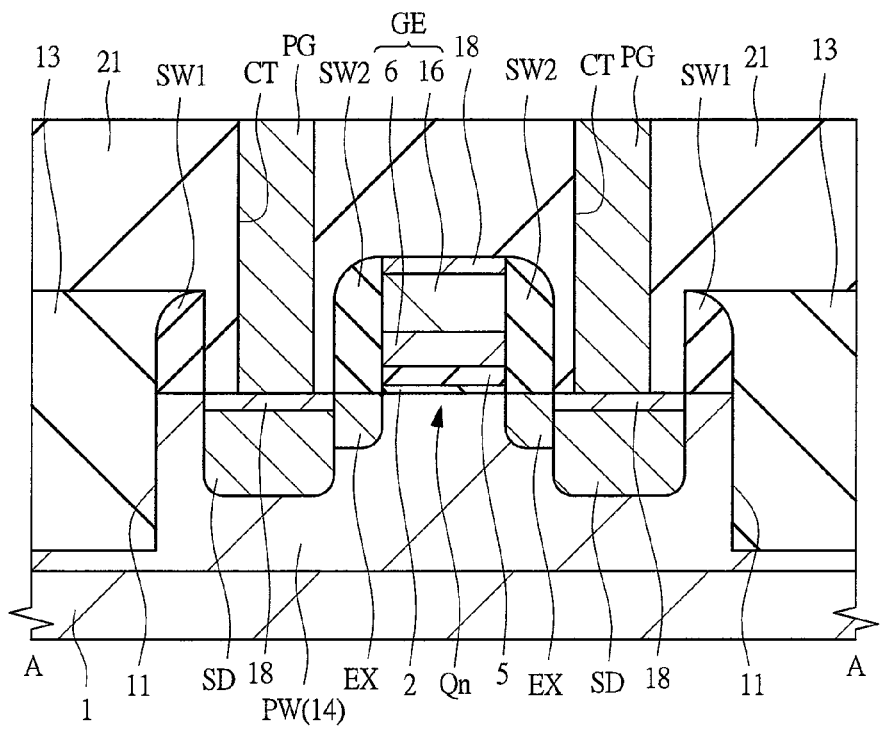
FIG. 22 is a sectional view (sectional view taken along the line A-A) of a main portion of the semiconductor device during the manufacturing process thereof continued from FIG. 20 and FIG. 21.
Figure 23:
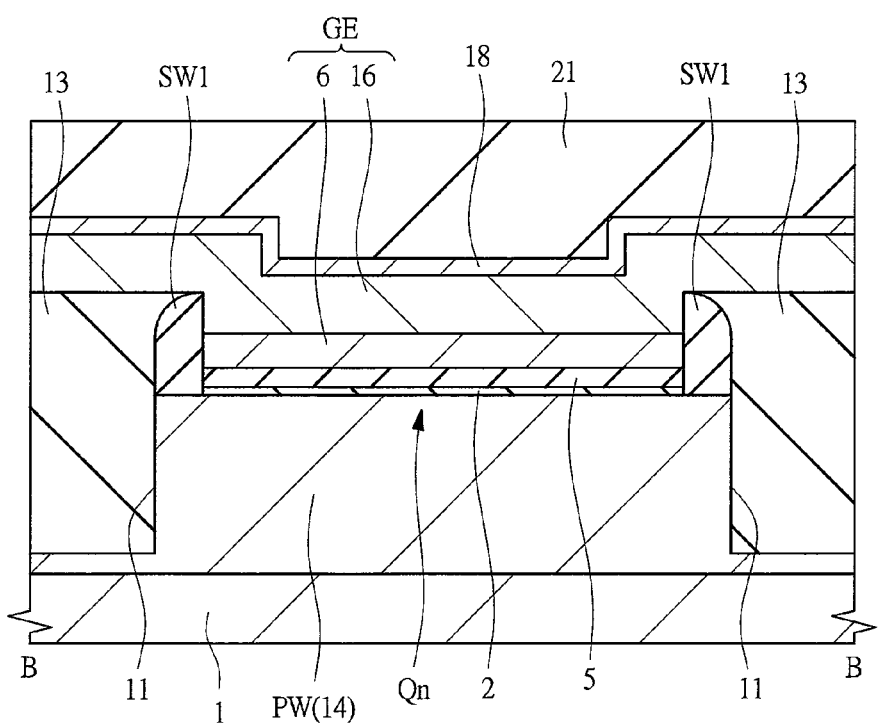
FIG. 23 is a sectional view (sectional view taken along the line B-B) of a main portion of the semiconductor device during the same manufacturing process thereof as that shown in FIG. 22.
Figure 24:
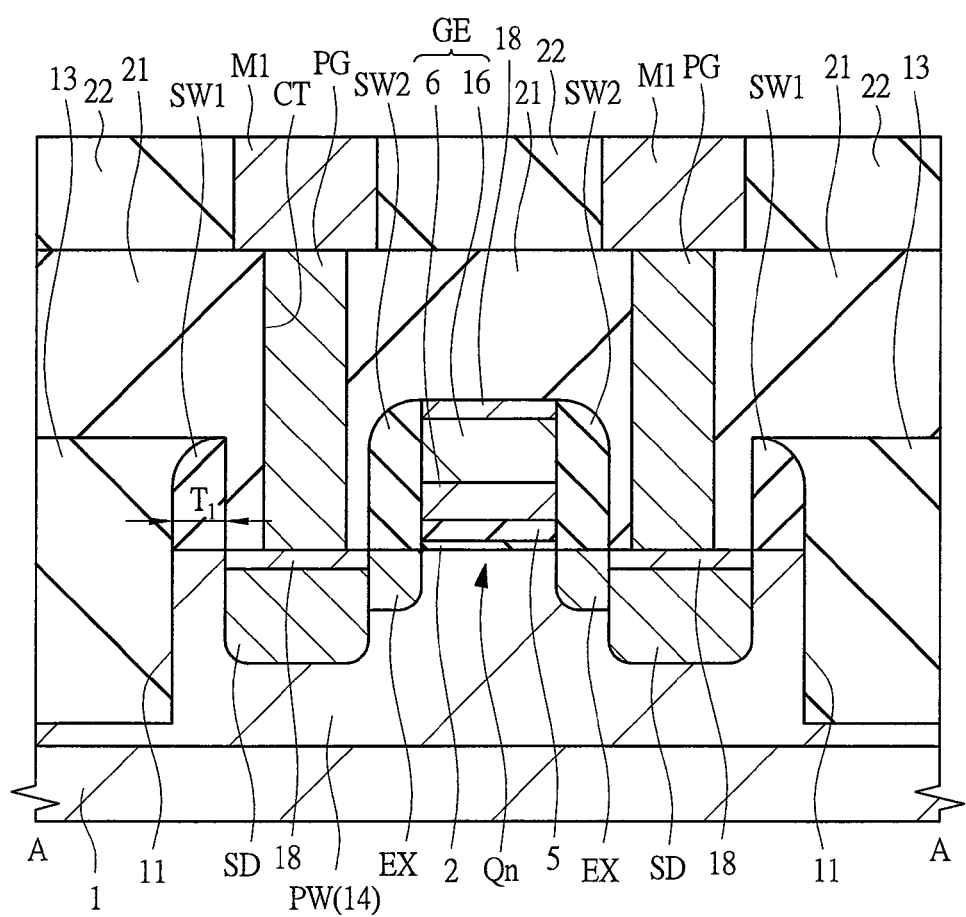
FIG. 24 is a sectional view (sectional view taken along the line A-A) of a main portion of the semiconductor device during the manufacturing process thereof continued from FIG. 22 and FIG. 23.
Figure 25:
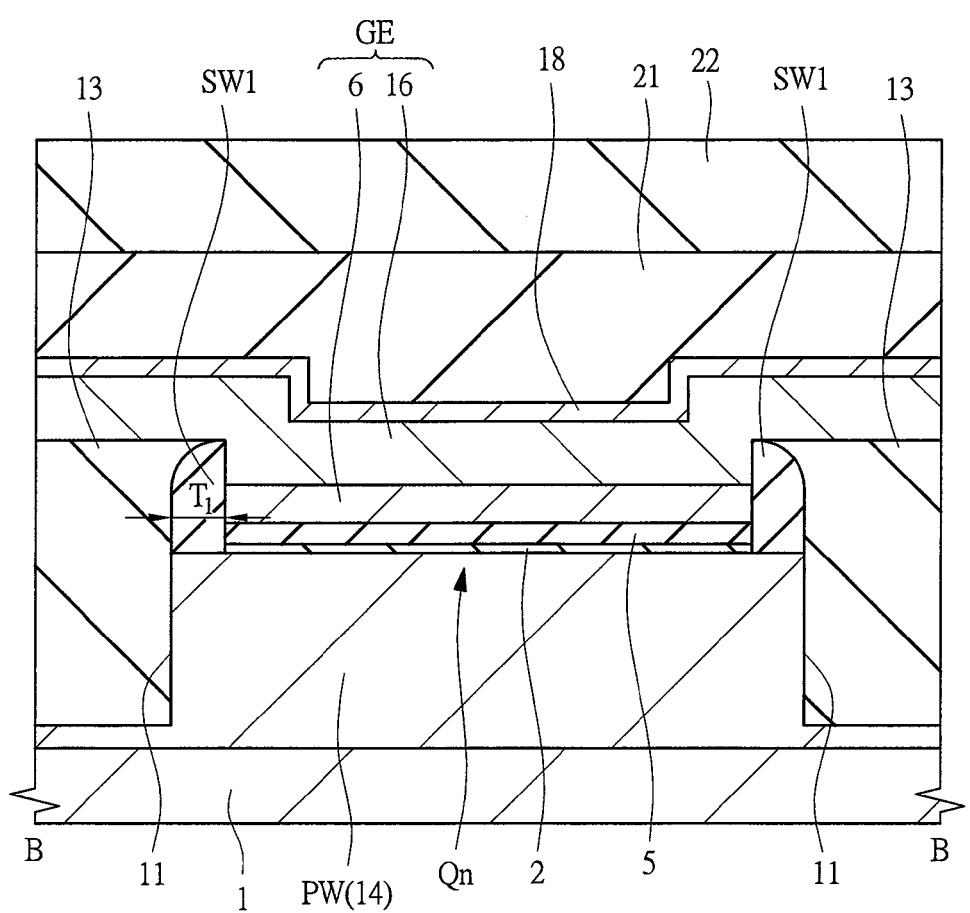
FIG. 25 is a sectional view (sectional view taken along the line B-B) of a main portion of the semiconductor device during the same manufacturing process thereof as that shown in FIG. 24.

Note that FIG. 13 is a plan view of a main portion of a semiconductor device at a stage where the gate electrode GE has been formed, and FIG. 14 and FIG. 15 are sectional views of the main portion of the semiconductor device at the stage where the gate electrode GE has been formed. A sectional view taken along the line A-A in FIG. 13 corresponds to FIG. 14, and a sectional view taken along the line B-B in FIG. 13 corresponds to FIG. 15. Among FIG. 16 to FIG. 25 described later, FIG. 16, FIG. 18, FIG. 20, FIG. 22 and FIG. 24 correspond to sectional views taken along the line A-A, and FIG. 17, FIG. 19, FIG. 21, FIG. 23 and FIG. 25 correspond to sectional views taken along the line B-B. Also, FIG. 16 and FIG. 17 show the same process stage, FIG. 18 and FIG. 19 show the same process stage, FIG. 20 and FIG. 21 show the same process stage, FIG. 22 and FIG. 23 show the same process stage, and FIG. 24 and FIG. 25 show the same process stage. Further, in the respective process stages shown in FIG. 1 to FIG. 12, sections taken along the line A-A and sections taken along the line B-B have the same sectional structures, and therefore FIG. 1 to FIG. 12 are common to the sectional views taken along the line A-A and the sectional views taken along the line B-B.

It is more preferable that, after the dry-etching process for patterning the silicon film 16 and the metal film 6 (namely, the dry-etching process for forming the gate electrode GE), wet-etching is performed to remove a portion of the Hf-containing insulating film 5 which is not covered with the gate electrode GE. The Hf-containing insulating film 5 located below the gate electrode GE is left without being removed by the dry-etching for patterning the silicon film 16 and the metal film 6 and the subsequent wet-etching, and it becomes a high-dielectric gate insulating film. On the other hand, a portion of the Hf-containing insulating film 5 which is not covered with the gate electrode GE is removed by the dry-etching performed when the silicon film 16 and the metal film 6 are patterned and the subsequent wet-etching.

The gate electrode GE is formed so that a portion thereof extends on the device isolation region 13. More specifically, the gate electrode GE is formed so as to extend from above the active region 14 to above the sidewall insulating films SW1 and the device isolation regions 13.

The gate electrode GE on the active region 14 (p-type well PW) is made up of the metal film 6 and the silicon film 16 on the metal film 6, but the gate electrode GE on the device isolation region 13 and on the sidewall insulating film SW1 is made up of the silicon film 16 and the gate electrode GE does not have the metal film 6. Since the metal film 6 is not formed on the device isolation region 13, the gate electrode GE has a larger thickness on the active region 14 (p-type well PE, channel region) compared with that on the device isolation region 13.

A portion of the gate electrode GE which can function as a gate electrode of the MISFET is a portion of the gate electrode GE which is located on the active region 14 (p-type well PW) (namely, a portion made up of a stacked film of the metal film 6 and the silicon film 16), and portions of the gate electrode GE which are located on the device isolation region 13 and on the sidewall insulating film SW1 (namely, portions which do not include the metal film 6 and are formed of the silicon film 16) do not function as the gate electrode of the MISFET. Therefore, since the portion of the gate electrode GE functioning as the gate electrode of the MISFET (namely, the portion located on the active region 14) has a stacked structure made up of the metal film 6 and the silicon film 16 on the metal film 6, it can be regarded as a so-called metal gate electrode.

Note that, in this application, the metal film (metal layer) indicates a conductive film (conductive layer) exhibiting metal conduction, and it includes not only a single metal film (pure metal film) and an alloy film but also a metal compound film exhibiting metal conduction (metal nitride film, metal carbide film and the like). Therefore, the metal film 6 is a conductive film exhibiting metal conduction and it has a resistivity as low as that of metal. A titanium nitride (TiN) film, a tantalum nitride (TaN) film, a tungsten nitride (WN) film, a titanium carbide (TiC) film, a tantalum carbide (TaC) film, a tungsten carbide (WC) film or a tantalum carbide nitride (TaCN) film is especially desirable as the metal film 6, and a titanium nitride (TiN) film is used as the metal film 6 in this embodiment from the viewpoint of easy processability and gate resistance.

In the active region 14, the interface layer 2 and the Hf-containing insulating film 5 are interposed between the semiconductor substrate 1 (p-type well PW) and the gate electrode GE, and they (interface layer 2 and Hf-containing insulating film 5) function as the gate insulating film of the MISFET. More specifically, the gate electrode GE made up of the metal film 6 and the silicon film 16 on the metal film 6 is formed on the surface of the p-type well PW of the active region 14 via the Hf-containing insulating film 5 serving as the gate insulating film (when the interface layer 2 is formed, the interface layer 2 is also interposed). The Hf-containing insulating film 5 has a dielectric constant (relative permittivity) higher than that of silicon oxide, and it functions as a high-dielectric gate insulating film.

Furthermore, the gate electrode GE partially extents also on the device isolation region 13 and on the sidewall insulating film SW1, and the Hf-containing insulating film 5 (and the interface layer 2) is interposed between the gate electrode GE and the semiconductor substrate 1 (p-type well PW), but the Hf-containing insulating film 5 (and the interface layer 2) is not interposed between the gate electrode GE and the device isolation region 13 and between the gate electrode GE and the sidewall insulating film SW1.

Next, as shown in FIG. 16 (sectional view taken along the line A-A) and FIG. 17 (sectional view taken along the line B-B), an n-type impurity such as phosphorus (P) or arsenic (As) is ion-implanted into the regions (regions which are not covered with the gate electrode GE) on both sides of the gate electrode GE in the active region 14 (p-type well PW), thereby forming n⁻-type semiconductor regions EX. In the ion-implantation for forming the n⁻-type semiconductor regions EX, the ion-implantation is performed to the active region 14 (p-type well PW) in the semiconductor substrate 1 with using the gate electrode GE as a mask. Therefore, the n⁻-type semiconductor regions EX are formed so as to align with the gate electrode GE, and they are not formed immediately below the gate electrode GE.

Next, as shown in FIG. 18 (section A-A) and FIG. 19 (section B-B), sidewalls (sidewall spacers, sidewall insulating films) SW2 made of an insulator (insulating film) are formed on sidewalls of the gate electrode GE. For example, after a silicon oxide film and a silicon nitride film are formed on the semiconductor substrate 1 in this order from the bottom so as to cover the gate electrode GE, the device isolation region 13 and the sidewall insulating film SW1, anisotropic etching (etchback) of the stacked film of the silicon oxide film and the silicon nitride film is performed, thereby forming the sidewalls SW2 made up of the silicon oxide film and the silicon nitride film left on the sidewalls of the gate electrode GE. Note that, for the simplification of the drawings, the silicon oxide film and the silicon nitride film constituting the sidewall SW2 are shown in an integrated fashion in FIG. 18. Further, when the sidewalls SW2 are formed on the sidewalls of the gate electrode GE, a sidewall SW2 may be formed on a side surface of the sidewall insulating film SW1 (side surface which is not adjacent to the device isolation region 13 and the gate electrode GE).

Next, an n+-type semiconductor region SD is formed in the active region 14 (p-type well PW) by ion-implantation.

The n+-type semiconductor regions SD can be formed by ion-implanting an n-type impurity such as phosphorus (P) or arsenic (As) into the regions on both sides of the gate electrode GE and the sidewalls SW2 in the active region 14 (p-type well PW). The n+-type semiconductor region SD has a higher impurity concentration and a deeper junction depth compared with those of the n−-type semiconductor region EX. In this ion-implantation for forming the n+-type semiconductor regions SD, the ion-implantation is performed to the semiconductor substrate 1 (p-type well PW) in the active region 14 with using the gate electrode GE and the sidewalls SW2 on the sidewalls thereof as a mask. Therefore, the n−-type semiconductor regions EX are formed so as to align with the gate electrode GE, the n+-type semiconductor regions SD are formed so as to align with the sidewalls SW2 formed on the sidewalls of the gate electrode GE, and the n+-type semiconductor region SD is not formed immediately below the gate electrode GE and the sidewall SW2.

The silicon film 16 constituting the gate electrode GE of the n-channel MISFET can be formed as an n-type silicon film by the introduction of an n-type impurity in the ion-implantation process for forming the n−-type semiconductor regions EX and in the ion-implantation process for forming the n+-type semiconductor regions SD.

After the ion implantation for forming the n+-type semiconductor regions SD is performed, heat treatment (annealing treatment, activation annealing) for activating the introduced impurity is performed. The impurities which have been introduced into the n−-type semiconductor region EX, the n+-type semiconductor region SD, the silicon film 16 and the like can be activated by this heat treatment. This heat treatment can be conducted at a heat treatment temperature in a range of, for example, 900° C. to 1100° C. in an inert gas atmosphere, more preferably, in a nitrogen atmosphere.

In this manner, the structure as shown in FIG. 18 (sectional view taken along the line A-A) and FIG. 19 (sectional view taken along the line B-B) can be obtained, and an n-channel MISFET Qn serving as a field effect transistor is formed in the active region 14.

The gate electrode GE functions as a gate electrode (metal gate electrode) of the n-channel MISFET Qn, and the Hf-containing insulating film 5 (and the interface layer 2 below the Hf-containing insulating film 5) located below the gate electrode GE functions as a gate insulating film of the n-channel MISFET Qn. Also, the n-type semiconductor regions (impurity diffusion layers) functioning as source and drain of the n-channel MISFET Qn are formed from the n+-type semiconductor regions SD and the n−-type semiconductor regions EX.

Next, metal silicide layers 18 made of cobalt silicide, nickel silicide or the like are formed on upper portions (upper layer portions) of the n+-type semiconductor regions SD constituting the source and drain and on an upper portion (upper layer portion) of the silicon film 16 constituting the gate electrode GE by a salicide (Self Aligned Silicide) process. A state that the metal silicide layers 18 have been formed is shown in FIG. 20 (sectional view taken along the line A-A) and FIG. 21 (sectional view taken along the line B-B). For forming the metal silicide layer 18, for example, a metal film such as a nickel (Ni) film or a cobalt (Co) film is deposited on the semiconductor substrate 1 and is then subjected to a heat treatment, thereby forming the metal silicide layer, and thereafter an unreacted metal film is removed. The diffusion resistance, contact resistance and the like can be reduced by forming the metal silicide layer 18, but the formation of the metal silicide layer 18 can be omitted in some cases. Further, when the metal silicide layer 18 is formed on (the silicon film 16 constituting) the gate electrode GE, the metal silicide layer 18 formed on the gate electrode GE can be regarded as a part of the gate electrode GE.

Next, as shown in FIG. 22 (sectional view taken along the line A-A) and FIG. 23 (sectional view taken along the line B-B), an insulating film (interlayer insulating film) 21 is formed on the main surface of the semiconductor substrate 1 so as to cover the device isolation regions 13, the gate electrode GE and the sidewalls SW2. The insulating film 21 is made up of, for example, a single film of a silicon oxide film or a stacked film of a thin silicon nitride film and a thick silicon oxide film located thereon. After the formation of the insulating film 21, a surface (upper surface) of the insulating film 21 is planarized by, for example, a CMP method.

Next, contact holes (through-holes, holes) CT are formed in the insulating film 21 by dry-etching the insulating film 21 with using a photoresist pattern (not shown) formed on the insulating film 21 as an etching mask. The contact holes CT are formed in upper portions of the n+-type semiconductor regions SD, the gate electrode GE, and the like.

Next, a conductive plug (conductor portion for connection) PG made of tungsten (W) or the like is formed in the contact hole CT. For forming the plug PG, for example, a barrier conductor film (for example, titanium film, titanium nitride film or stacked film thereof) is formed on the insulating film 21 including the interior (on bottom and sidewall) of the contact hole CT. Then, a main conductor film made of a tungsten film or the like is formed on the barrier conductor film so as to fill the contact hole CT and unnecessary main conductor film and barrier conductor film on the insulating film 21 are removed by a CMP method, an etchback method or the like, thereby forming the plug PG. Note that, for the simplification of the drawings, the barrier conductor film and the main conductor film (tungsten film) constituting the plug PG are shown in an integrated fashion. The plugs PG come in contact with the metal silicide layer 18 on the surface of the n+-type semiconductor region SD, the metal silicide layer 18 on the gate electrode GE, and the like at the bottom portions thereof and are electrically connected thereto.

Next, as shown in FIG. 24 (sectional view taken along the line A-A) and FIG. 25 (sectional view taken along the line B-B), an insulating film 22 is formed on the insulating film 21 in which the plugs PG have been embedded. The insulating film 22 may be formed of a stacked film of a plurality of insulating films.

Next, a wiring M1 which is a first-layer wiring is formed by a single damascene method. Specifically, the wiring M1 can be formed in the following manner. First, after a wiring trench is formed in a predetermined region on the insulating film 22 by dry-etching using a photoresist pattern (not shown) as a mask, a barrier conductor film (for example, titanium nitride film, tantalum film or tantalum nitride film) is formed on the insulating film 22 including a bottom portion and a sidewall of the wiring trench. Subsequently, after a copper seed layer is formed on the barrier conductor film by a CVD method, a sputtering method or the like, a copper plating film is further formed on the seed layer by using an electrolytic plating method or the like to fill the wiring trench with the copper plating film. Thereafter, the main conductor film (copper plating film and seed layer) and the barrier metal film in the regions other than the wiring trench are removed by a CMP method, thereby forming the first-layer wiring M1 containing copper embedded into the wiring trench as a main conductive material. For the simplification of the drawings, the barrier conductor film, the seed film and the copper plating film constituting the wiring M1 are shown in an integrated fashion.

The wiring M1 is electrically connected to the $n^+$-type semiconductor regions SD for forming the source and drain of the n-channel MISFET Qn or the like through the plugs PG. Thereafter, a second-layer wiring and wirings subsequent thereto are formed by a dual damascene method or the like, but illustrations and descriptions of the formation thereof are omitted here. Further, the wiring M1 and upper-layer wirings thereof are not limited to damascene wirings, and they can be formed by patterning conductor films for wiring, and for example, they may be tungsten wirings, aluminum wirings or the like.

The semiconductor device according to the present embodiment is manufactured in the above-described manner.

Next, main features and advantages of the semiconductor device according to the present embodiment will be described.

In the present embodiment, the gate electrode GE of the n-channel MISFET Qn has the metal layer 6 located on the gate insulating film (here, interface layer 2 and Hf-containing insulating film 5), and it is the so-called metal gate electrode. Therefore, since a depletion phenomenon of the gate electrode can be suppressed and a parasitic capacitance can be eliminated, size reduction of a MISFET device (thinning of the gate insulating film) can also be achieved.

Furthermore, in the present embodiment, the Hf-containing insulating film 5 having a dielectric constant higher than that of silicon oxide is used as the gate insulating film of the n-channel MISFET Qn. More specifically, the material film having a dielectric constant (relative permittivity) higher than that of silicon oxide, namely, the Hf-containing insulating film 5 which is the so-called High-k film (high-dielectric film) is used for the gate insulating film of the n-channel MISFET Qn. Therefore, since the physical film thickness of the Hf-containing insulating film 5 can be increased as compared with the case where a silicon oxide film is used for the gate insulating film of the n-channel MISFET Qn, a leakage current can be reduced.

Further, in the present embodiment, since the rare earth element is introduced into the Hf-containing insulating film 5 that is the Hf-based high-dielectric gate insulating film of the n-channel MISFET Qn, threshold reduction of the n-channel MISFET Qn can be achieved. Here, reducing (lowering) the absolute value of the threshold voltage of the MISFET is referred to as "threshold reduction". Furthermore, the gate insulating film containing Hf as a main component (high-dielectric gate insulating film) is referred to as Hf-based gate insulating film (Hf-based high-dielectric gate insulating film).

Threshold reduction can be achieved by introducing a rare earth element into the Hf-based high-dielectric gate insulating film of the n-channel MISFET as an element for threshold reduction. However, according to the studies by the inventor of the present invention, it has been found that the rare earth element introduced into the Hf-based high-dielectric gate insulating film diffuses into the silicon oxide film constituting the device isolation region, so that the rare earth concentration in the Hf-based high-dielectric gate insulating film decreases, which may result in degradation of the effect of threshold reduction. This will be described with reference to a semiconductor device of a comparative example shown in FIG. 26 and FIG. 27.

Figure 26:
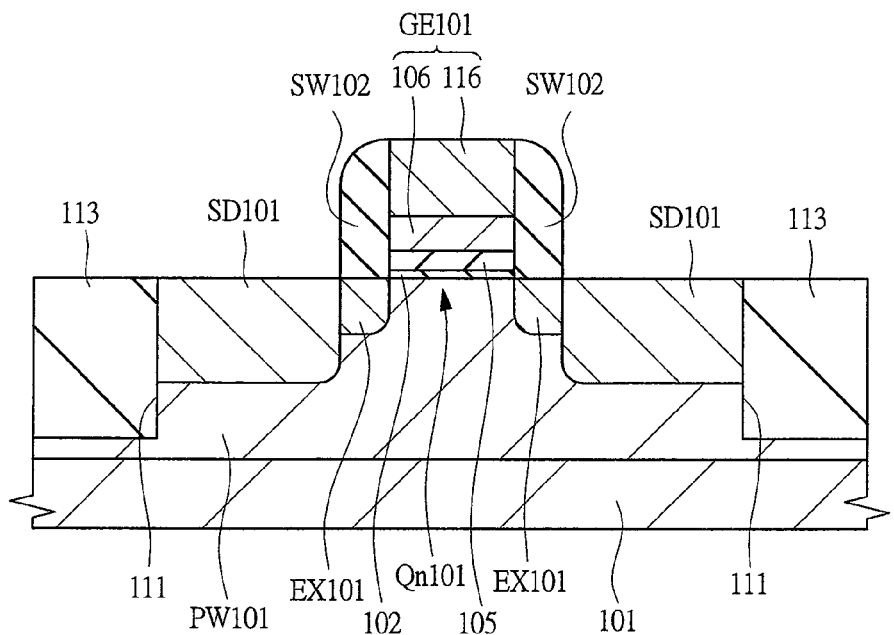
FIG. 26 is a sectional view of a main portion of a semiconductor device of a comparative example.
Figure 27:
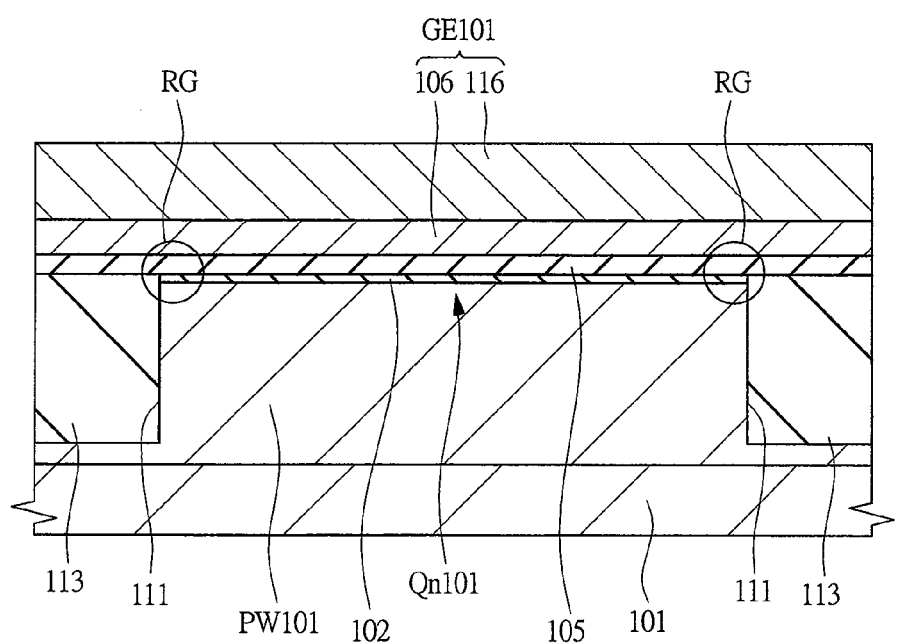
FIG. 27 is a sectional view of a main portion of the semiconductor device of the comparative example.

FIG. 26 and FIG. 27 are sectional views of a main portion of the semiconductor device of the comparative example. FIG. 26 shows a section (section at a position corresponding to the line A-A described above) taken along a gate length direction of a gate electrode GE101 in the semiconductor device of the comparative example, and FIG. 27 shows a section (section at a position corresponding to the line B-B described above) taken along a gate width direction of the gate electrode GE101 in the semiconductor device of the comparative example.

In the semiconductor device of the comparative example shown in FIG. 26 and FIG. 27, device isolation regions 113 are formed in a semiconductor substrate 101, and a p-type well PW101 is formed in an active region of the semiconductor substrate 101 defined by the device isolation regions 113. The gate electrode GE101 is formed on the p-type well PW101 via an interface layer 102 and an Hf-containing insulating film 105. The gate electrode GE101 is a so-called metal gate electrode having a stacked structure of a metal film 106 and a silicon film 116 thereon, and it functions as a gate electrode (metal gate electrode) of an n-channel MISFET Qn101. The interface layer 102 and the Hf-containing insulating film 105 interposed between the gate electrode GE101 and the p-type well PW101 function as a gate insulating film of the n-channel MISFET Qn101. Since the interface layer 102, the Hf-containing insulating film 105, the metal film 106 and the silicon film 116 are material films similar to the above-described interface layer 2, Hf-containing insulating film 5, metal film 6 and silicon film 16, respectively, repetitive descriptions thereof are omitted here. Sidewalls SW102 corresponding to the above-described sidewalls SW2 are formed on sidewalls of the gate electrode GE101, and n-type semiconductor regions (impurity diffusion layers) functioning as source and drain of the n-channel MISFET Qn101 are formed from $n^+$-type semiconductor regions SD101 and $n^-$-type semiconductor regions EX101 in the p-type well PW101.

In the semiconductor device of the comparative example shown in FIG. 26 and FIG. 27, the device isolation regions 113 are formed in the semiconductor substrate 101, but the device isolation regions 113 are formed by an STI (Shallow Trench Isolation) method and are formed by forming trenches (device isolation trenches) 111 in the semiconductor substrate 101 and then embedding a silicon oxide film into the trenches 111. Unlike the present embodiment described above, in the semiconductor device of the comparative example shown in FIG. 26 and FIG. 27, the height of an upper surface of the device isolation region 113 is approximately the same as that of a main surface (surface) of the semiconductor substrate 101, and a member corresponding to the above-described sidewall insulating film SW1 is not formed.

Generally, the gate electrode partially extends on the device isolation region. This is because, when the contact hole is formed on the gate electrode and the plug embedded in the contact hole is connected to the gate electrode, the contact hole (and the plug embedded therein) is disposed on a portion of the gate electrode which is located on the device isolation region. Further, when one gate electrode serves as gate electrodes of a plurality of MISFETs, the gate electrode must extend on the device isolation regions between MISFETs. Therefore, even in the semiconductor device of the comparative example shown in FIG. 26 and FIG. 27, the gate electrode GE101 partially extends on the device isolation region 113 as can be seen also from FIG. 27.

Since the interface layer 102 is formed by heat oxidation, it is formed on a surface of the semiconductor substrate 101 in the active region. The Hf-containing insulating film 105 is formed by the method similar to that for forming the above-described Hf-containing insulating film 5. Specifically, it is formed by forming an Hf-containing film (for example, HfSiON film, HfSiO film, HfON film or HfO film) and a rare earth-containing film (for example, lanthanum oxide film) on the main surface of the semiconductor substrate 1 in this order from the bottom and causing these films to react with each other by heat treatment. Since the Hf-containing film and the rare earth-containing film are formed not only on the active region of the semiconductor substrate 101 but also on the device isolation region 113, the Hf-containing insulating film 105 is eventually formed also on the device isolation region 113. Therefore, when the gate electrode GE101 is formed so as to partially extend also on the device isolation region 113 after forming the Hf-containing insulating film 105, the Hf-containing insulating film 105 is interposed also between the gate electrode GE101 and the device isolation region 113 as shown in FIG. 27.

In the semiconductor device of the comparative example shown in FIG. 26 and FIG. 27, since a rare earth element as an element for threshold reduction is introduced into the Hf-containing insulating film 105 that is an Hf-based high-dielectric gate insulating film of the n-channel MISFET Qn101, further threshold reduction of the n-channel MISFET Qn101 can be achieved as compared with the case where a rare earth element is not introduced. However, the rare earth element introduced into the Hf-containing insulating film 105 has such a property that it easily diffuses into the silicon oxide film constituting the device isolation region 113. This is because, when an Hf-based gate insulating film to which a rare earth element is introduced is in contact with a silicon oxide film, in addition to that the rare earth element introduced into the Hf-based gate insulating film easily diffuses toward the silicon oxide film, the silicon oxide film constituting the device isolation region has a large volume and so has a large capacity for absorbing the rare earth element and much of the rare earth element introduced into the Hf-based gate insulating film diffuses into the device isolation region. The phenomenon that the rare earth element introduced into the Hf-containing insulating film 105 diffuses into the device isolation region 113 tends to occur especially when activation annealing (heat treatment for activating introduced impurities) is performed after forming the source and drain regions.

Therefore, in the semiconductor device of the comparative example shown in FIG. 26 and FIG. 27, the rare earth concentration lowers in a portion of the Hf-containing insulating film 105 located on the device isolation region 113 and a portion adjacent thereto because the rare earth element diffuses into the device isolation region 113. Therefore, although an entire portion of the Hf-containing insulating film 105 located on the p-type well PW101 functions as the gate insulating film of the n-channel MISFET Qn101, the rare earth concentration in the Hf-containing insulating film 105 lowers in a region RG (shown in FIG. 27) adjacent to the device isolation region 113.

When the rare earth concentration of the Hf-containing insulating film 105 lowers in the region RG adjacent to the device isolation region 113, there is a possibility that the effect of threshold reduction obtained by introducing the rare earth element into the Hf-containing insulating film 105 is degraded and the absolute value of the threshold voltage of the n-channel MISFET Qn101 becomes large.

On the other hand, in the semiconductor device according to the present embodiment, the gate electrode GE partially extends on the device isolation region 13. This device isolation region 13 is made of the silicon oxide film 12 embedded into the trench 11 for device isolation formed in the semiconductor substrate 1, but an upper portion of the device isolation region 13 is protruded from (the main surface of) the semiconductor substrate 1, and the sidewall insulating films SW1 are formed on sidewalls of the portion of the device isolation regions 13 which have been protruded from the semiconductor substrate 1. Also, the sidewall insulating film SW1 is made of silicon nitride or silicon oxynitride. The gate insulating film of the n-channel MISFET Qn is made of the Hf-containing insulating film 5 (and the interface layer 2) formed between the gate electrode GE and the active region 14 (p-type well PW) of the semiconductor substrate 1, but the sidewall insulating film SW1 is interposed between the gate insulating film (Hf-containing insulating film 5) located between the gate electrode GE and the active region 14 (p-type well PW) of the semiconductor substrate 1 and the device isolation region 13.

In the semiconductor device according to the present embodiment, the portion of the Hf-containing insulating film 5 functioning as the gate insulating film (namely, the portion of the Hf-containing insulating film 5 located between the gate electrode GE and the active region 14 (p-type well PW) of the semiconductor substrate 1) is not located adjacent to (near) the device isolation region 13, and the sidewall insulating film SW1 is interposed between the portion and the device isolation region 13. Since the sidewall insulating film SW1 is made of silicon nitride or silicon oxynitride, even if the Hf-containing insulating film 5 is located adjacent to the sidewall insulating film SW1, it is difficult for the rare earth element to diffuse from the Hf-containing insulating film 5 to the sidewall insulating film SW1.

This is because, when an Hf-based gate insulating film to which a rare earth element is introduced is in contact with a silicon oxide film, the rare earth element introduced into the Hf-based gate insulating film easily diffuses toward the silicon oxide film, but even if an Hf-based gate insulating film to which a rare earth element is introduced is in contact with a silicon nitride film or a silicon oxynitride film, it is difficult for the rare earth element introduced into the Hf-based gate insulating film to diffuse toward the silicon nitride film or the silicon oxynitride film.

Therefore, by forming the sidewall insulating film SW1 from silicon nitride or silicon oxynitride into which the rare earth element is difficult to diffuse and interposing the sidewall insulating film SW1 between the portion of the Hf-containing insulating film 5 which functions as the gate insulating film and the device isolation region 13, the sidewall insulating film SW1 can be made to function as a diffusion barrier for the rare earth element (element for threshold reduction). By this means, the diffusion of the rare earth element from the portion of the Hf-containing insulating film 5 which functions as the gate insulating film to the device isolation region 13 can be suppressed or prevented, and lowering of the rare earth concentration in the portion of the Hf-containing insulating film 5 which functions as the gate insulating film can be suppressed or prevented. Accordingly, the effect of threshold reduction attained by introducing the rare earth element into the Hf-containing insulating film 5 can be obtained adequately, and the absolute value of the threshold voltage of the n-channel MISFET Qn can be lowered adequately. Therefore, the performance of the semiconductor device can be improved.

Further, the sidewall insulating film SW1 is made of silicon nitride or silicon oxynitride, and it is more preferably made of silicon nitride. This is because, when the case where an Hf-based gate insulating film to which a rare earth element is introduced is in contact with a silicon nitride film and the case where it is in contact with a silicon oxynitride film are compared with each other, the rare earth element introduced into the Hf-based gate insulating film is less likely to diffuse in the case of the silicon nitride film.

Figure 28:
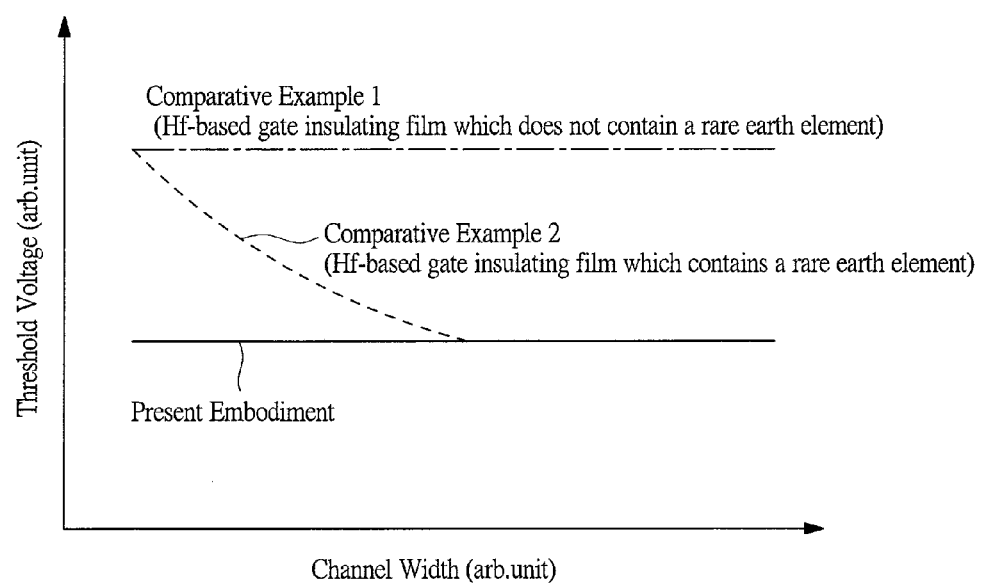
FIG. 28 is a graph showing dependency of a threshold voltage of an n-channel MISFET on a channel width.

FIG. 28 is a graph showing dependency of a threshold voltage of an n-channel MISFET on a channel width. The vertical axis of the graph shown in FIG. 28 corresponds to a threshold voltage of the n-channel MISFET and is shown by an arbitrary unit, and the horizontal axis of the graph shown in FIG. 28 corresponds to a channel width of the n-channel MISFET and is shown by an arbitrary unit. In the structure of the semiconductor device of the comparative example shown in FIG. 26 and FIG. 27, the case where a rare earth element has not been introduced into the Hf-containing insulating film 105 is shown as "comparative example 1" by a chain line in the graph in FIG. 28, and in the structure of the semiconductor device of the comparative example shown in FIG. 26 and FIG. 27, the case where a rare earth element has been introduced into the Hf-containing insulating film 105 is shown as "comparative example 2" by a dotted line in the graph in FIG. 28. Further, the case of the structure of the semiconductor device according to the present embodiment (rare earth element has been introduced into the Hf-containing insulating film 5) is shown as "present embodiment" by a solid line in the graph in FIG. 28.

In the structure of the semiconductor device of the comparative example shown in FIG. 26 and FIG. 27, when a rare earth element has not been introduced into the Hf-containing insulating film 105, the threshold voltage becomes high as shown by the chain line in the graph in FIG. 28. On the other hand, by introducing the rare earth element into the Hf-based high-dielectric gate insulating film (Hf-containing insulating film 5, 105) of the n-channel MISFET, the absolute value of the threshold voltage of the n-channel MISFET can be lowered as shown by the dotted line (comparative example 1) and the solid line (present embodiment) in the graph in FIG. 28. However, in the case of the comparative example 2 (structure of the semiconductor device of the comparative example shown in FIG. 26 and FIG. 27), the effect of threshold reduction attained by introducing the rare earth element into the Hf-containing insulating film 105 can be obtained when the channel width is large to a certain extent, but the effect of threshold reduction becomes smaller as the channel width decreases, and the threshold voltage comes close to the threshold voltage of the comparative example 1 (case where the rare earth element has not been introduced into the Hf-containing insulating film 105). It is considered that this is because, since the rare earth concentration of the Hf-containing insulating film 105 lowers in the region RG adjacent to the device isolation region 113 in the case of the structure of the semiconductor device of the comparative example shown in FIG. 26 and FIG. 27, the proportion of a portion of the Hf-containing insulating film 105 where the rare earth concentration has lowered is increased in the portion of the Hf-containing insulating film 105 which functions as the gate insulating film as the channel width becomes smaller.

More specifically, when the channel width is sufficiently large, even if the rare earth concentration of the Hf-containing insulating film 105 lowers in the region RG adjacent to the device isolation region 113, lowering of the rare earth concentration is slight in view of the whole portion of the Hf-containing insulating film 105 which functions as the gate insulating film. Therefore, the influence of the lowering is small and the effect of threshold reduction attained by introducing the rare earth element into the Hf-containing insulating film 105 can be sufficiently obtained. However, when the channel width becomes small, the influence due to the lowering of the rare earth concentration of the Hf-containing insulating film 105 becomes relatively larger in the region RG adjacent to the device isolation region 113 in view of the whole portion of the Hf-containing insulating film 105 which functions as the gate insulating film. Therefore, the effect of threshold reduction attained by introducing the rare earth element into the Hf-containing insulating film 105 lowers and the threshold voltage comes close to the threshold voltage of the comparative example 1. Accordingly, in the structure of the semiconductor device of the comparative example shown in FIG. 26 and FIG. 27, the channel width dependency of the threshold voltage is increased.

On the other hand, in the embodiment, diffusion of the rare earth element from the portion of the Hf-containing insulating film 5 which functions as the gate insulating film to the device isolation region 13 can be suppressed or prevented by the sidewall insulating film SW1 as described above, and the lowering of the rare earth concentration of the portion of the Hf-containing insulating film 5 which functions as the gate insulating film can be suppressed or prevented. Therefore, as shown by the solid line in the graph in FIG. 28, the effect of threshold reduction attained by introducing the rare earth element into the Hf-containing insulating film 5 can be adequately obtained regardless of the channel width, and the absolute value of the threshold voltage of the MISFET can be adequately reduced. Further, in the present embodiment, the channel width dependency of the threshold voltage can be reduced. The present embodiment is especially effective when applied to the case where a channel width of a MISFET is 1 μm or less, and this holds true for the second to fourth embodiments described later.

Further, it is much effective to introduce a rare earth element (especially, lanthanum) into an Hf-based gate insulating film of an n-channel MISFET for the threshold reduction of the n-channel MISFET, but introduction of an element belonging to any one of Group 1 (Ia group), Group 2 (IIa group) and Group 3 (IIIa group) other than the rare earth element into the Hf-based gate insulating film of the n-channel MISFET can achieve the threshold reduction of the n-channel MISFET. Therefore, in the present embodiment, a material film containing an element belonging to any one of Group 1 (Ia group), Group 2 (IIa group) and Group 3 (IIIa group) as a main component can be used instead of the rare earth-containing film 4. In this case, the formed Hf-containing insulating film 5 contains an element belonging to any one of Group 1 (Ia group), Group 2 (IIa group) and Group 3 (IIIa group) as an element for threshold reduction instead of the rare earth element. Therefore, the present embodiment is effective also when a material film containing an element belonging to any one of Group 1 (Ia group), Group 2 (IIa group) and Group 3 (IIIa group) as a main component is used instead of the rare earth-containing film 4, namely, when the Hf-containing insulating film 5 contains an element belonging to any one of Group 1 (Ia group), Group 2 (IIa group) and Group 3 (IIIa group) instead of the rare earth element as an element for threshold reduction, and this holds true for the second to fourth embodiments described below. However, in order to achieve the adequate threshold reduction of the n-channel MISFET, the element for threshold reduction introduced into the Hf-containing insulating film 5 is preferably the rare earth elements or Mg (magnesium), the rare earth elements are more preferable than Mg (magnesium), and La (lanthanum) is especially preferable among the rare earth elements.

Figure 29:
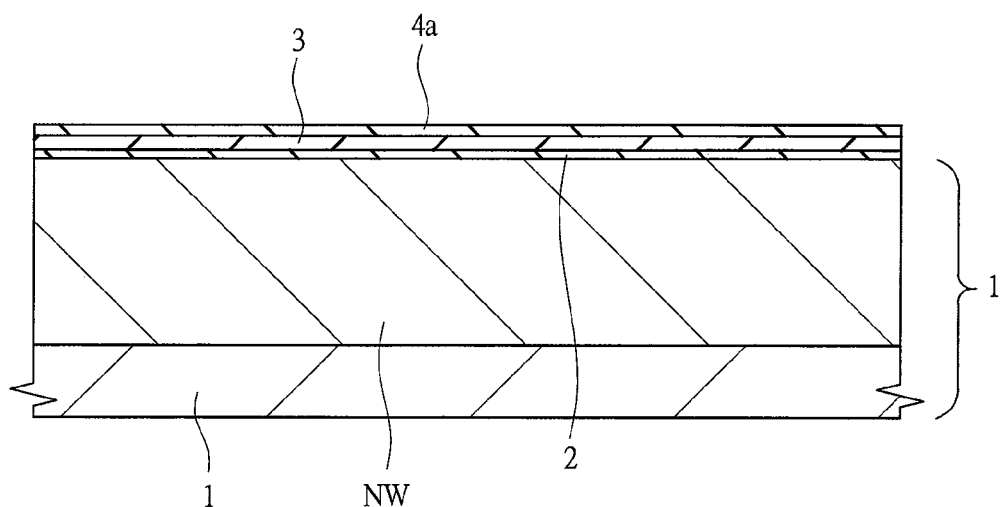
FIG. 29 is a sectional view of a main portion of a semiconductor device of a modified example of the first embodiment of the present invention during a manufacturing process thereof.

Further, the case where the n-channel MISFET is formed has been described in the present embodiment, but the invention can be applied also to a p-channel MISFET. FIG. 29 to FIG. 32 are sectional views of a main portion of a semiconductor device during the manufacturing process thereof according to a modified example of the present embodiment, and the sectional views show the case of forming a p-channel MISFET. FIG. 29 corresponds to FIG. 2 shown above, FIG.

30 corresponds to FIG. 3 shown above, FIG. 31 corresponds to FIG. 24 shown above, and FIG. 32 corresponds to FIG. 25 shown above.

The p-channel MISFET Qp can also be formed basically in the same manner as the n-channel MISFET Qn, and different points from the case of forming the n-channel MISFET will be described here.

As shown in FIG. 29, an n-type well NW is formed instead of the p-type well PW, and the n-type well NW is similar to the p-type well PW in formation method and constitution except that the conductivity type thereof is opposite (reverse) to that of the p-type well PW.

Further, as shown in FIG. 29, instead of the above-described rare earth-containing film 4, a material film 4a is formed on the Hf-containing film 3. The material film 4a is a material film containing at least one of Al (aluminum), Ti (titanium) and Ta (tantalum). As the material film 4a, an oxide film (aluminum oxide film, titanium oxide film or tantalum oxide film) is preferred in view of stability, but the material film 4a may be an oxynitride film (aluminum oxynitride film, titanium oxynitride film or tantalum oxynitride film) or a single metal film (aluminum film, titanium film or tantalum film) other than the oxide film. The material film 4a can be formed by a sputtering method, an ALD method or the like, and a film thickness (formation film thickness) thereof may be set to, for example, about 0.5 nm.

Figure 30:
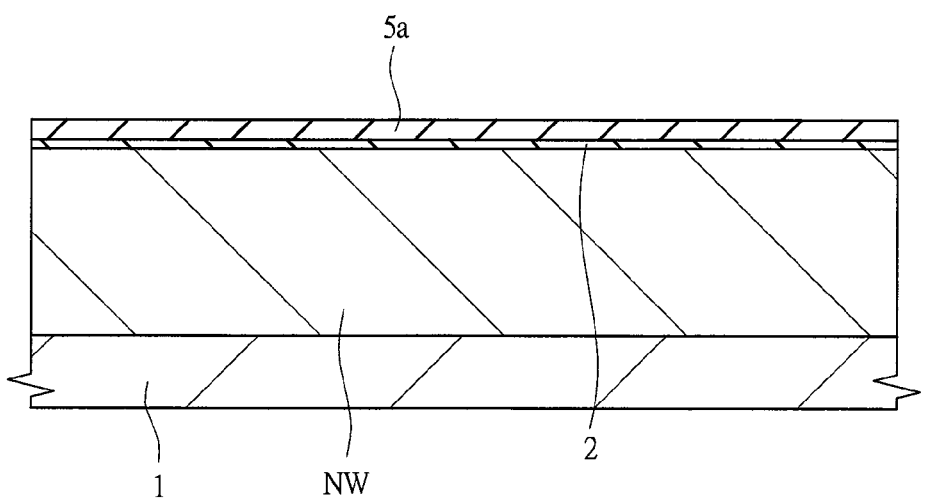
FIG. 30 is a sectional view of a main portion of the semiconductor device during the manufacturing process thereof continued from FIG. 29.

After the material film 4a is formed instead of the above-described rare earth-containing film 4, heat treatment similar to the above-described heat treatment (heat treatment for causing the Hf-containing film 3 and the rare earth-containing film 4 to react with each other) is performed, and the Hf-containing film 3 and the material film 4a are reacted with (mixed with, mutually diffused in) each other by this heat treatment, thereby forming an Hf-containing insulating film 5a which is a reaction layer (mixed layer, mixing layer) of the Hf-containing film 3 and the material film 4a as shown in FIG. 30. In other words, the Hf-containing insulating film 5a is formed instead of the above-described Hf-containing insulating film 5.

A different point between the Hf-containing insulating film 5a shown in FIG. 30 and the Hf-containing insulating film 5 shown in FIG. 3 lies in that the Hf-containing insulating film 5 shown in FIG. 3 contains the rare earth element as the element for threshold reduction, while the Hf-containing insulating film 5a shown in FIG. 30 contains Al (aluminum), Ti (titanium) or Ta (tantalum) as the element for threshold reduction instead of the rare earth element. Since the Hf-containing insulating film 5a shown in FIG. 30 has a constitution similar to that of the Hf-containing insulating film 5 shown in FIG. 3 except that the Hf-containing insulating film 5a contains Al (aluminum), Ti (titanium) or Ta (tantalum) instead of the rare earth element, repetitive description thereof is omitted here. The Hf-containing insulating film 5a also has a dielectric constant higher than that of silicon oxide, and it is a so-called High-k film (high-dielectric film) like the Hf-containing insulating film 5.

Thereafter, $p^-$-type semiconductor regions EXa are formed instead of the $n^-$-type semiconductor regions EX and $p^+$-type semiconductor regions SDa are formed instead of the $n^+$-type semiconductor regions SD. The $p^-$-type semiconductor regions EXa are similar to the $n^-$-type semiconductor regions EX in formation method and constitution except that the conductivity type thereof is opposite to that of the $n^-$-type semiconductor regions EX, and the $p^+$-type semiconductor regions SDa are similar to the $n^+$-type semiconductor regions SD in formation method and constitution except that the conductivity type thereof is opposite to that of the $n^+$-type semiconductor regions SD.

Figure 31:
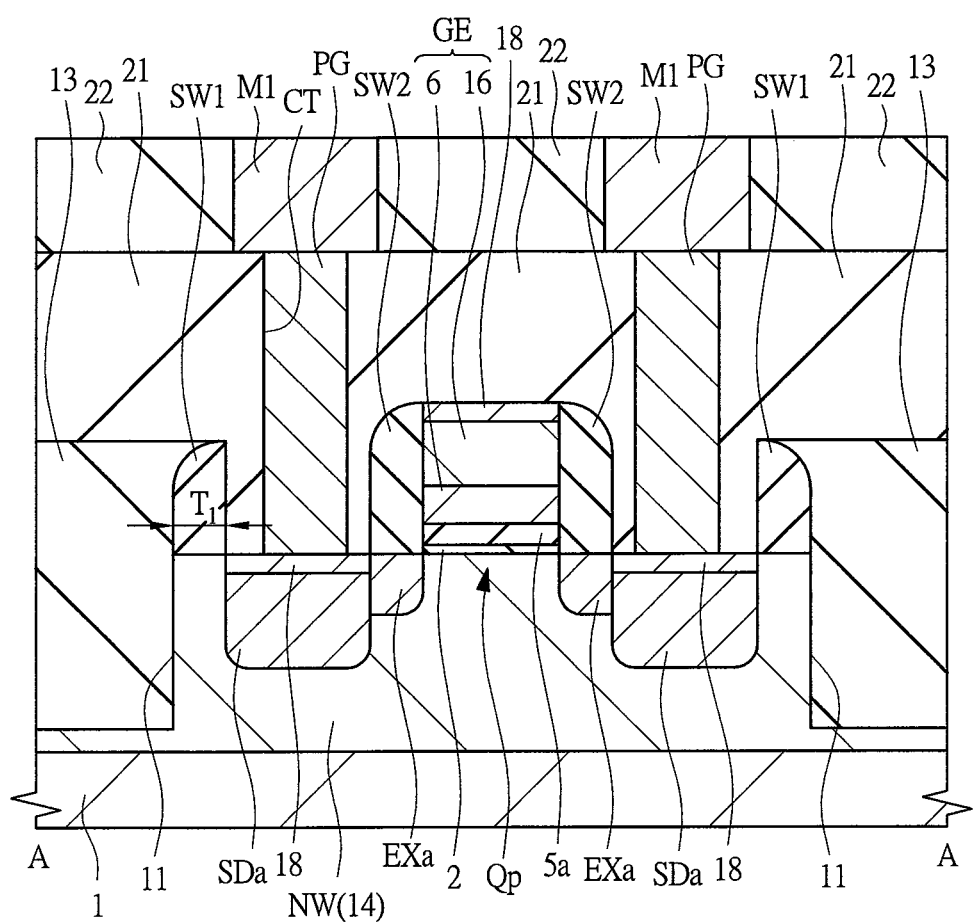
FIG. 31 is a sectional view (sectional view taken along the line A-A) of a main portion of the semiconductor device during the manufacturing process thereof continued from FIG. 30.
Figure 32:
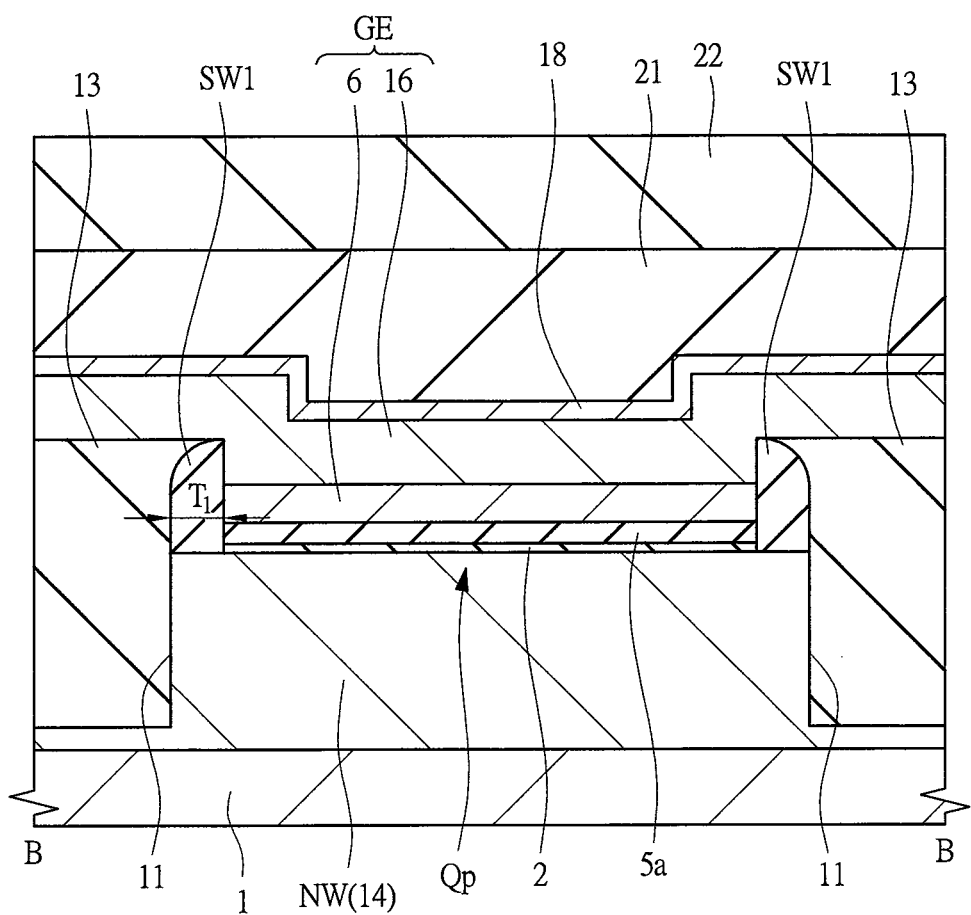
FIG. 32 is a sectional view (sectional view taken along the line B-B) of a main portion of the semiconductor device during the same manufacturing process thereof as that shown in FIG. 31.

In the above-described manner, the structure shown in FIG. 31 (sectional view taken along the line A-A) and FIG. 32 (sectional view taken along the line B-B) corresponding to FIG. 24 (sectional view taken along the line A-A) and FIG. 25 (sectional view taken along the line B-B) can be obtained.

Different points of the semiconductor device shown in FIG. 31 and FIG. 32 from the semiconductor device shown in FIG. 24 and FIG. 25 lie in that the conductivity types of the above-described p-type well PW, $n^-$-type semiconductor regions EX and $n^+$-type semiconductor regions SD are reversed to form the n-type well NW, the $p^-$-type semiconductor regions EXa and the $p^+$-type semiconductor regions SDa and that the element for threshold reduction (rare earth element) contained in the Hf-containing insulating film 5 is changed to Al, Ti or Ta to form the Hf-containing insulating film 5a. The other constitutions of the semiconductor device shown in FIG. 31 and FIG. 32 are approximately similar to those of the semiconductor device shown in FIG. 24 and FIG. 25.

Note that the portion of the Hf-containing insulating film 5 which functions as the gate insulating film is a portion of the Hf-containing insulating film 5 located between the gate electrode GE and the active region 14 (p-type well PW) of the semiconductor substrate 1 and is also a portion of the Hf-containing insulating film 5 located on the channel (channel region of the n-channel MISFET Qn). Further, the portion of the Hf-containing insulating film 5a which functions as the gate insulating film is a portion of the Hf-containing insulating film 5a located between the gate electrode GE and the active region 14 (n-type well NW) of the semiconductor substrate 1 and is also a portion of the Hf-containing insulating film 5a located on the channel (channel region of the p-channel MISFET Qp). The same holds true for the second to fourth embodiments described later.

In the case of the semiconductor device shown in FIG. 24 and FIG. 25 in which the n-channel MISFET Qn has been formed, the element for threshold reduction which the Hf-containing insulating film 5 contains and whose diffusion from the Hf-containing insulating film 5 to the device isolation region 13 is prevented by the sidewall insulating film SW1 is the rare earth element. On the other hand, in the case of the semiconductor device shown in FIG. 31 and FIG. 32 in which the p-channel MISFET Qp has been formed, the element for threshold reduction which the Hf-containing insulating film 5a contains and whose diffusion from the Hf-containing insulating film 5a to the device isolation region 13 is prevented by the sidewall insulating film SW1 is Al (aluminum), Ti (titanium) or Ta (tantalum).

Even when the p-channel MISFET Qp is formed, diffusion of the element for threshold reduction (Al, Ti or Ta) from the portion of the Hf-containing insulating film 5a which functions as the gate insulating film to the device isolation region 13 can be suppressed or prevented by the sidewall insulating film SW1 in the present embodiment. Therefore, lowering of the concentration of the element for threshold reduction (Al, Ti or Ta) in the portion of the Hf-containing insulating film 5a which functions as the gate insulating film can be suppressed or prevented. Accordingly, also in the p-channel MISFET, like in the n-channel MISFET, the effect of the threshold reduction attained by introducing Al (aluminum), Ti (titanium) or Ta (tantalum) into the Hf-containing insulating film 5a can be adequately obtained as shown by the solid line in the graph in FIG. 28 regardless of the channel width, and the absolute value of the threshold voltage of the MISFET can be adequately lowered. Further, the channel width dependency of the threshold voltage can be reduced. Accordingly, the performance of the semiconductor device can be improved.

For the threshold reduction of the p-channel MISFET (namely, lowering the absolute value of the threshold voltage), it is effective to introduce at least one of Al (aluminum), Ti (titanium) and Ta (tantalum) into the Hf-based gate insulating film of the p-channel MISFET. However, in order to achieve more adequate threshold reduction of the n-channel MISFET, Al (aluminum) is especially preferable among Al (aluminum), Ti (titanium) and Ta (tantalum) as the element for threshold reduction to be introduced into the Hf-containing insulating film 5a, and this holds true for the second to fourth embodiments described below.

As described above, the element for threshold reduction which the Hf-based gate insulating film (Hf-containing insulating film 5) of the n-channel MISFET contains is an element belonging to any one of Group 1 (Ia group), Group 2 (IIa group) and Group 3 (IIIa group), and it is preferably the rare earth elements or Mg (magnesium), the rare earth elements are more preferable, and La (lanthanum) is especially preferable. Further, the element for threshold reduction which the Hf-based gate insulating film (Hf-containing insulating film 5a) of the p-channel MISFET contains is Al (aluminum), Ti (titanium) or Ta (tantalum), and Al (aluminum) is especially preferable. When these elements for threshold reduction are introduced into the Hf-based gate insulating film, the problem that the element for threshold reduction introduced into the Hf-based gate insulating film diffuses into the device isolation region 113 occurs in the structure of the semiconductor device of the comparative example shown in FIG. 26 and FIG. 27. Therefore, when these elements for threshold reduction are introduced into the Hf-based gate insulating film (Hf-containing insulating film 5 or Hf-containing insulating film 5a), the problem due to the diffusion of the element for threshold reduction introduced into the Hf-based gate insulating film into the device isolation region can be solved by applying the structures and the manufacturing processes of the semiconductor devices as described in the present embodiment and the second to fourth embodiments described later.

Further, it is also possible to apply the present embodiment and the second to fourth embodiments described later to a semiconductor device in which both an n-channel MISFET and a p-channel MISFET are formed on the semiconductor substrate 1, namely, a semiconductor device having a CMISFET (Complementary Metal Insulator Semiconductor Field Effect Transistor).

Further, a thickness (width) $T_1$ of the sidewall insulating film SW1 is preferably 5 nm or more (namely, $T_1 \geq 5$ nm). Here, the thickness $T_1$ of the sidewall insulating film SW1 is also shown in FIG. 7, FIG. 24 and FIG. 25, and it corresponds to the thickness in a direction parallel with the main surface of the semiconductor substrate 1. The thickness $T_1$ of the sidewall insulating film SW1 can be controlled by a deposition film thickness of the insulating film 9. By setting the thickness $T_1$ of the sidewall insulating film SW1 to 5 nm or more, the diffusion of the element for threshold reduction from the Hf-containing insulating film 5 (or Hf-containing insulating film 5a) to the device isolation region 13 can be adequately prevented by the sidewall insulating film SW1. Further, since excessive increase of the thickness $T_1$ of the sidewall insulating film SW1 is disadvantageous for size reduction (area reduction) of the semiconductor device, it is more preferable that the thickness $T_1$ of the sidewall insulating film SW1 is set to 5 to 10 nm (namely, 10 nm$\geq T_1 \geq 5$ nm). By this means, the effect that the diffusion of the element for threshold reduction into the device isolation region 13 is prevented by the sidewall insulating film SW1 can be adequately obtained, and the size reduction (area reduction) of the semiconductor device can also be achieved. The same holds true for the thickness of a sidewall insulating film SW1 of the second embodiment described later and the thickness of a sidewall insulating film SW1a of the third embodiment described later.

Further, in the manufacturing process of the present embodiment, the Hf-containing insulating film 5 is first formed by forming the interface layer 2, the Hf-containing film 3 and the rare earth-containing film 4, and the stacked pattern 8 and the like are then formed. Therefore, it also has an advantage that it is easy to form a clean gate insulating film (Hf-containing insulating film 5).

Second Embodiment

The manufacturing process of a semiconductor device according to the second embodiment will be described with reference to the drawings. FIG. 33 to FIG. 47 are sectional views and a plan view of a main portion of a semiconductor device according to the present embodiment during the manufacturing process thereof. Among FIG. 33 to FIG. 47, FIG. 33 to FIG. 42 and FIG. 44 to FIG. 47 are sectional views of the main portion, and FIG. 43 is a plan view of the main portion. Note that, also in this embodiment, the case where an n-channel MISFET is formed as the MISFET will be described as an example like in the first embodiment described above.

Figure 33:
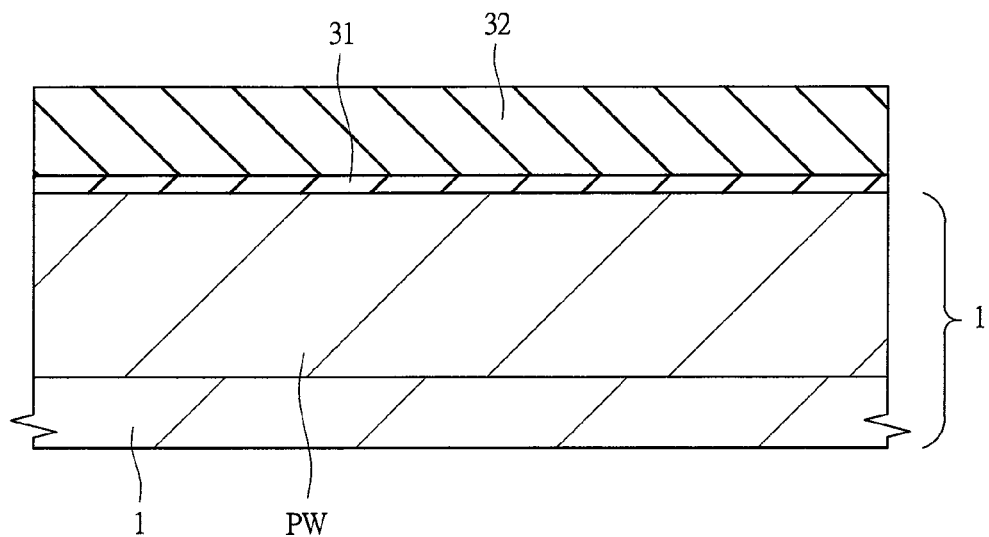
FIG. 33 is a sectional view of a main portion of a semiconductor device according to a second embodiment of the present invention during a manufacturing process thereof.

First, as shown in FIG. 33, a p-type well PW is formed in a region of a semiconductor substrate 1 in which an n-channel MISFET is to be formed like in the first embodiment described above.

Next, an insulating film 31 and an insulating film 32 are formed on a surface of the semiconductor substrate 1 (namely, a surface of the p-type well PW) in this order from the bottom. The insulating film 31 is preferably made of a silicon oxide film and it can be formed by a thermal oxidation method or the like. The insulating film 32 is preferably made of a silicon nitride film, and it can be formed by a method similar to the method for forming the insulating film 7 of the above-described first embodiment. The insulating film 32 is thicker than the insulating film 31, and the film thickness (formation film thickness) of the insulating film 31 may be set to, for example, about 2 to 10 nm, and the film thickness (formation film thickness) of the insulating film 32 may be set to, for example, about 30 to 100 nm. The formation of the insulating film 31 can be omitted, and in this case, the insulating film 32 is formed on the surface of the semiconductor substrate 1.

The insulating film 32 is preferably a silicon nitride film, but it may be another material film. However, it is necessary to select the insulating film 32 so that the insulating film 32 can be selectively removed at a step shown in FIG. 39 described later while suppressing the etching of the device isolation region 13 and the sidewall insulating film SW1.

Figure 34:
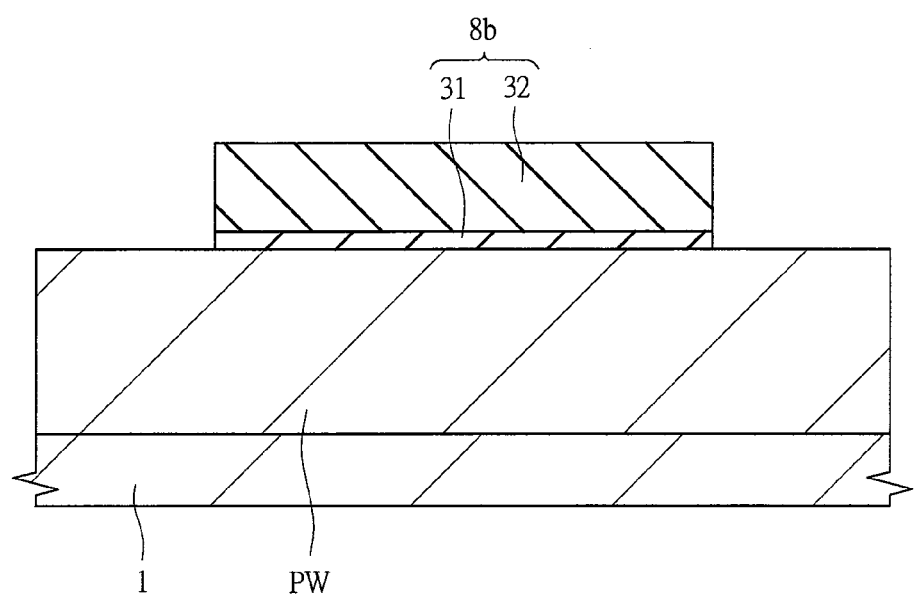
FIG. 34 is a sectional view of a main portion of the semiconductor device during the manufacturing process thereof continued from FIG. 33.

Next, as shown in FIG. 34, the insulating films 32 and 31 are patterned by using a photolithography technique and a dry-etching technique.

At this time, the insulating film 32 and the insulating film 31 are etched by using a photoresist pattern (not shown) formed on the insulating film 32 as an etching mask, and the photoresist pattern is then removed. Alternatively, after the insulating film 32 is etched with using a photoresist pattern (not shown) formed on the insulating film 32 as an etching mask and the photoresist pattern is removed, the insulating film 31 can be etched with using the remaining insulating film 32 as an etching mask (hard mask).

By patterning the insulating films 32 and 31, a stacked pattern (stacked film pattern, material film pattern) 8b in which the insulating film 31 and the insulating film 32 are stacked in this order from the bottom is formed. Since a region in which the stacked pattern 8b has been formed becomes an active region 14 described later, the stacked pattern 8b is formed in the region to be the active region 14 in advance. When the formation of the insulating film 31 is omitted, the stacked pattern 8b is formed of a single film of the insulating film 32. Since the stacked pattern 8b is formed by patterning the material films (here, the stacked film of the insulating films 31 and 32 or the single film of the insulating film 32) formed on the semiconductor substrate 1, it can be regarded as a material film pattern.

Figure 35:
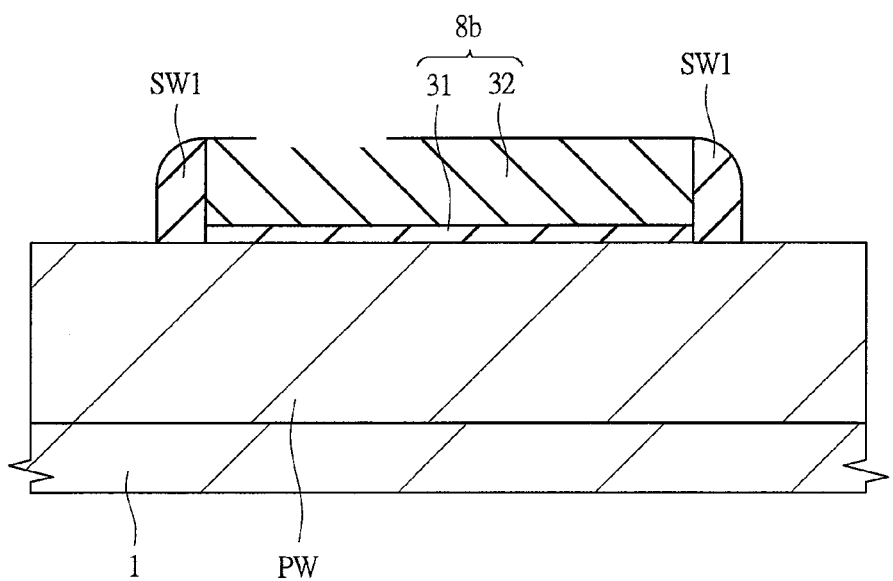
FIG. 35 is a sectional view of a main portion of the semiconductor device during the manufacturing process thereof continued from FIG. 34.

Next, as shown in FIG. 35, sidewall insulating films SW1 are formed on sidewalls of the stacked pattern 8b. A formation method of the sidewall insulating films SW1 is similar to that of the above-described first embodiment. A difference from the first embodiment lies in that the sidewall insulating films SW1 are formed on the sidewalls of the stacked pattern 8 made up of the interface layer 2, the Hf-containing insulating film 5, the metal film 6 and the insulating film 7 in the first embodiment, while the sidewall insulating films SW1 are formed on the sidewalls of the stacked pattern 8b made up of the insulating film 31 and the insulating film 32 in the present embodiment. The sidewall insulating films SW1 are formed on the sidewalls of the stacked pattern 8b in a shape of a sidewall spacer. The sidewall insulating film SW1 is made of silicon nitride or silicon oxynitride like in the above-described first embodiment and is more preferably made of silicon nitride.

The silicon nitride film for the sidewall insulating film SW1 can be formed by a thermal CVD method or a plasma CVD method, and it is formed as a film having a wet-etching resistance higher than that of the insulating film 32 by adjusting a film formation temperature, a pressure at the time of film formation and the like.

Figure 36:
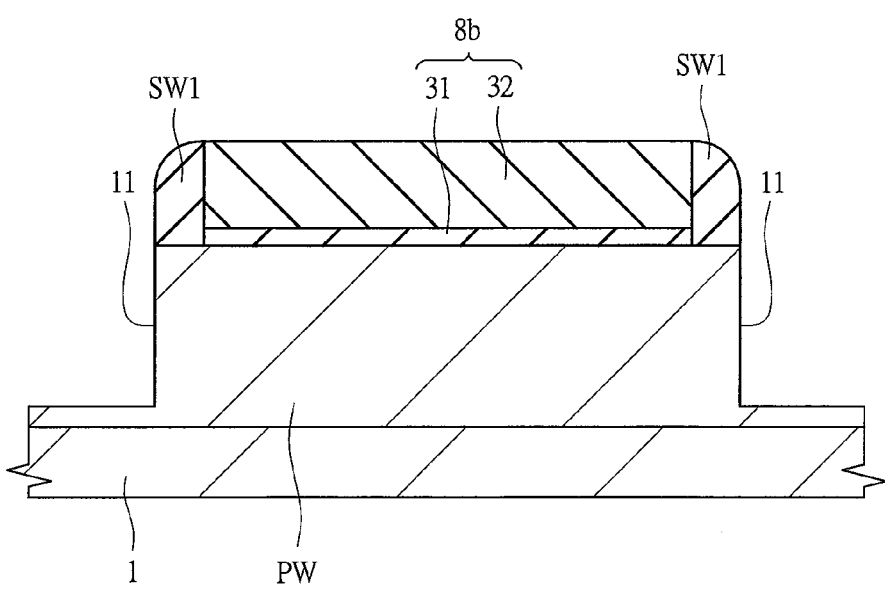
FIG. 36 is a sectional view of a main portion of the semiconductor device during the manufacturing process thereof continued from FIG. 35.

Next, as shown in FIG. 36, the semiconductor substrate 1 is etched (preferably dry-etched) down to a predetermined depth with utilizing (the insulating film 32 of) the stacked pattern 8b and the sidewall insulating films SW1 as an etching mask, thereby forming trenches (trenches for device isolation) 11 in the semiconductor substrate 1. The trenches 11 are formed so as to align with the side surfaces of the sidewall insulating films SW1 (side surfaces which are not adjacent to the stacked pattern 8b).

Next, the device isolation regions 13 are formed in the same manner as the above-described first embodiment.

Figure 37:
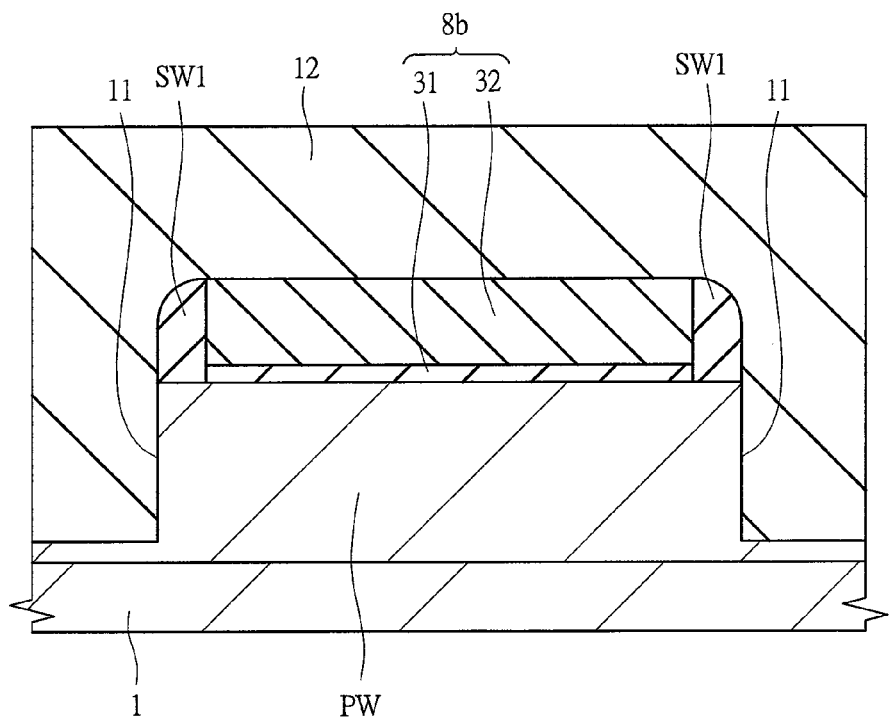
FIG. 37 is a sectional view of a main portion of the semiconductor device during the manufacturing process thereof continued from FIG. 36.
Figure 38:
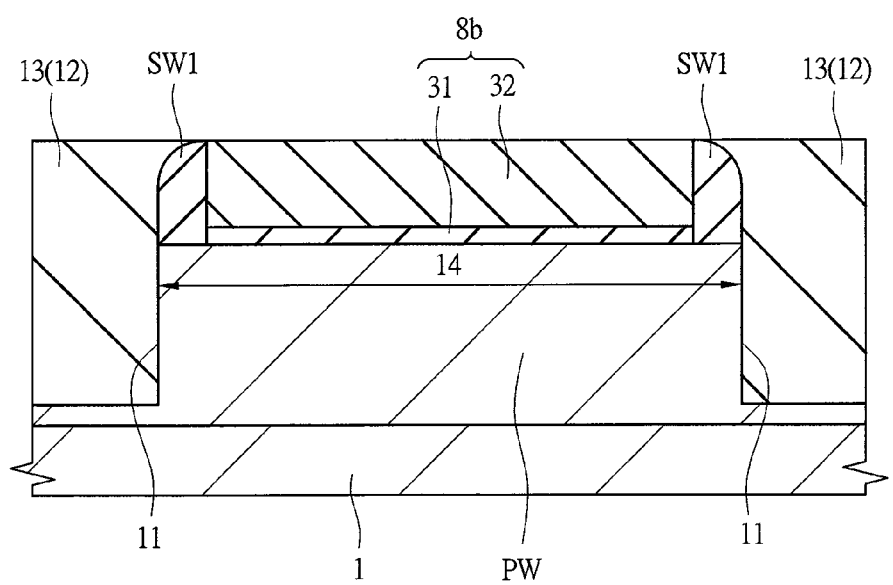
FIG. 38 is a sectional view of a main portion of the semiconductor device during the manufacturing process thereof continued from FIG. 37.

The formation method of the device isolation regions 13 is similar to that of the above-described first embodiment. More specifically, as shown in FIG. 37, a silicon oxide film 12 as an insulating film is first formed on the main surface of the semiconductor substrate 1 so as to fill the trenches 11 by using a CVD method or the like. The silicon oxide film 12 is formed so as to fill the trenches 11 and cover the stacked pattern 8b and the sidewall insulating films SW1. Then, an upper surface of the silicon oxide film 12 is polished by CMP as shown in FIG. 38. This polishing is finished at a stage where an upper surface of the uppermost insulating film 32 in the stacked pattern 8b has been exposed. The device isolation region 13 is formed from the silicon oxide film 12 embedded in the trench 11. As shown also in FIG. 38, an upper surface of the device isolation region 13 is located at a position higher than the surface of the semiconductor substrate 1, and it is approximately flush with an upper surface of the stacked pattern 8b (namely, upper surface of the insulating film 32). More specifically, the device isolation regions 13 are protruded beyond the surface of the semiconductor substrate 1. Namely, by polishing the silicon oxide film 12 until (the insulating film 32 in) the stacked pattern 8b is exposed, the device isolation regions 13 which are made up of the silicon oxide film 12 embedded in the trenches (device isolation trenches) 11 and whose upper portions are protruded from the semiconductor substrate 1 are formed.

A bottom surface of the device isolation region 13 is in contact with (the semiconductor substrate 1 constituting) a bottom surface of the trench 11, and a side surface of the device isolation region 13 is in contact with (the semiconductor substrate 1 constituting) a side surface of the trench 11 and a side surface of the sidewall insulating film SW1 (side surface on the side which is not located adjacent to the stacked pattern 8b). The sidewall insulating film SW1 is in a state of being sandwiched between the stacked pattern 8b and the device isolation region 13.

The sidewall insulating film SW1 is formed on the sidewall of the stacked pattern 8b, but since the device isolation region 13 is formed so as to come in contact with (be adjacent to) the sidewall insulating film SW1, when the device isolation region 13 is formed, the sidewall insulating film SW1 is formed on a portion of a sidewall of the device isolation region 13 which is protruded from the surface of the semiconductor substrate 1. A region (planar region) surrounded by the device isolation regions 13 on the main surface of the semiconductor substrate 1 constitutes the active region 14. More specifically, the active region 14 is provided (defined) by the device isolation regions 13 and it is surrounded by the device isolation regions 13. The p-type well PW is formed in the active region 14. The active region 14 corresponds to a region in which the stacked pattern 8b and the sidewall isolation films SW1 formed on the sidewalls thereof are formed.

Next, the insulating film 32 in the stacked pattern 8b is selectively removed by wet-etching. At this time, the insulating film 32 is etched by using etchant having selectivity to the sidewall insulating film SW1, the device isolation region 13 (silicon oxide film 12) and the insulating film 31 in the stacked pattern 8b. More specifically, the insulating film 32 is wet-etched by using the etchant by which an etching rate of the insulating film 32 becomes larger than respective etching rates of the sidewall insulating film SW1, the device isolation region 13 (silicon oxide film 12) and the insulating film 31. By this means, the insulating film 32 is selectively removed and the sidewall insulating film SW1 and the device isolation region 13 can be left.

When both the insulating film 32 and the sidewall insulating film SW1 are formed of silicon nitride, as described above, by controlling film formation conditions of the silicon nitride film for forming the sidewall insulating film SW1 (corresponding to the insulating film 9 described above) and film formation conditions of the insulating film 32 (silicon nitride film), the insulating film 32 can be selectively etched while suppressing etching of the sidewall insulating film SW1. For example, by adjusting film formation conditions such as a film formation temperature, the silicon nitride film for forming the sidewall insulating film SW1 (corresponding to the insulating film 9 described above) can be formed as a film denser than the insulating film 32 (silicon nitride film), so that it becomes possible to selectively etch the insulating film 32 while suppressing etching of the sidewall insulating film SW1.

Figure 39:
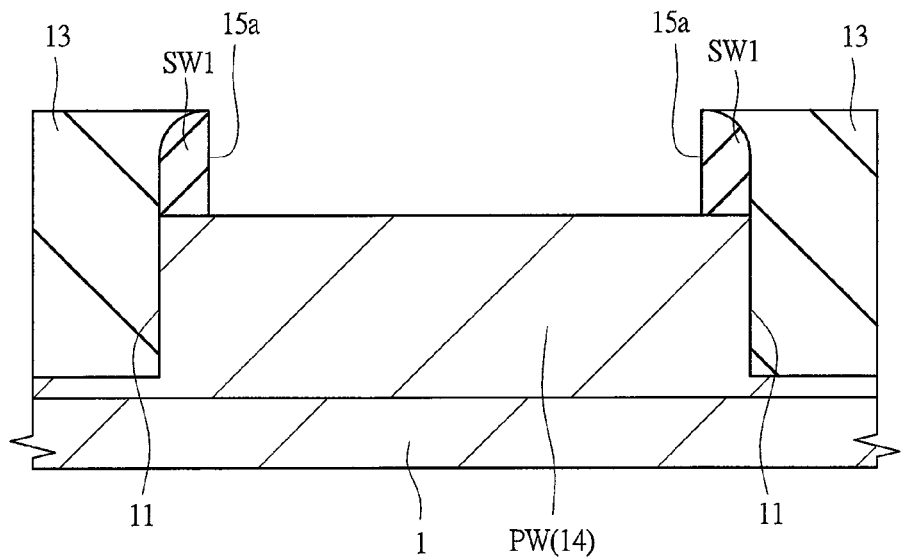
FIG. 39 is a sectional view of a main portion of the semiconductor device during the manufacturing process thereof continued from FIG. 38.

Next, the insulating film 31 which has been exposed by the removal of the insulating film 32 is selectively removed by wet-etching. At this time, the insulating film 31 is etched by using etchant having selectivity to the sidewall insulating film SW1. More specifically, the insulating film 31 is wet-etched by using the etchant by which an etching rate of the insulating film 31 becomes larger than an etching rate of the sidewall insulating film SW1. FIG. 39 shows a state that the insulating film 32 and the insulating film 31 have been removed (namely, the state that the stacked pattern 8b has been removed).

When the insulating film 31 is made of a silicon oxide film, the device isolation region 13 is slightly etched in some cases when the insulating film 31 is etched. However, since the formation thickness of the insulating film 31 is smaller than the formation thickness of the insulating film 32, an etching amount (etching thickness) of the film to be etched is smaller in the etching process of the insulating film 31 than in the etching process of the insulating film 32. Therefore, in the etching process (removal step) of the insulating film 31, an etching amount of the device isolation region 13 can be suppressed. For this reason, the state that the upper portion of the device isolation region 13 is protruded from the semiconductor substrate 1 and the sidewall insulating film SW1 is disposed on the sidewall of the portion of the device isolation region 13 which is protruded from the semiconductor substrate is maintained.

Further, as another aspect, the etching process of the insulating film 32 performed after the formation of the device isolation region 13 can be performed by dry-etching, and the etching process of the insulating film 31 performed after the formation of the device isolation region 13 and after the removal of the insulating film 32 can be performed by dry-etching. However, it is more preferable to perform these etching processes (etching process of the insulating film 32 and etching process of the insulating film 31) by wet-etching because the etching selectivity can be easily increased.

A recess (recessed portion) 15a is formed by the removal of the insulating films 31 and 32 (namely, removal of the stacked pattern 8b) as shown in FIG. 39. This recess 15a is a space where the stacked pattern 8b exists until it is removed. A bottom surface of the recess 15a is formed by the surface of the semiconductor substrate 1 (p-type well PW), and a side surface of the recess 15a is formed by a side surface of the sidewall insulating film SW1 (side surface which is in contact with the stacked pattern 8b until the stacked pattern 8b is removed).

Figure 40:
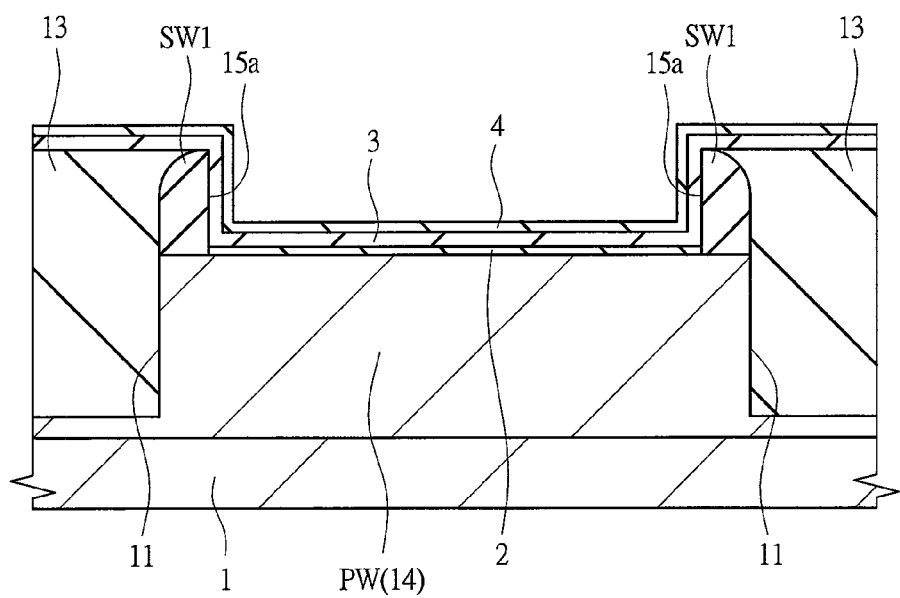
FIG. 40 is a sectional view of a main portion of the semiconductor device during the manufacturing process thereof continued from FIG. 39.

Next, as shown in FIG. 40, an interface layer 2 made of a silicon oxide film or a silicon oxynitride film is formed on the surface of the semiconductor substrate 1 (namely, the surface of the p-type well PW of the active region 14). A formation method of the interface layer 2 is similar to that of the above-described first embodiment. However, in the first embodiment, since the interface layer 2 is formed before the formation of the device isolation region 13 and the sidewall insulating film SW1, the interface layer 2 is formed on the whole main surface of the semiconductor substrate 1 at the time of formation of the interface layer 2 as shown in FIG. 2. On the other hand, in the present embodiment, since the interface layer 2 is formed after the formation of the device isolation region 13 and the sidewall insulating film SW1, the interface layer 2 is formed on the surface of the semiconductor substrate 1 (here, p-type well PW) exposed on a bottom surface of the recess 15a, and it is not formed on the device isolation region 13 and on the sidewall insulating film SW1.

Next, an Hf-containing film 3 is formed on the main surface of the semiconductor substrate 1. A constitution and a formation method of the Hf-containing film 3 are similar to those of the above-described first embodiment. Since the Hf-containing film 3 is formed on the whole main surface of the semiconductor substrate 1, the Hf-containing film 3 is formed on the interface layer 2 in the region where the interface layer 2 has been formed (namely, bottom surface of the recess 15a), and the Hf-containing film 3 is formed on the device isolation region 13 and the sidewall insulating film SW1 in the device isolation region 13 and the sidewall insulating film SW1 where the interface layer 2 has not been formed.

Next, a rare earth-containing film 4 is formed on the main surface of the semiconductor substrate 1, namely, on the Hf-containing film 3 so as to come in contact with the Hf-containing film 3. A constitution and a formation method of the rare earth-containing film 4 are similar to those of the above-described first embodiment.

By this means, the interface layer 2, the Hf-containing film 3 and the rare earth-containing film 4 have been stacked on the semiconductor substrate 1 (p-type well PW) in this order from the bottom on the bottom surface of the recess 15a (active region 14), and the Hf-containing film 3 and the rare earth-containing film 4 have been stacked on the device isolation region 13 and the sidewall insulating film SW1 in this order from the bottom.

Next, heat treatment is applied to the semiconductor substrate 1. This heat treatment process can be performed in the same manner as the heat treatment performed after the formation of the rare earth-containing film 4 in the first embodiment (namely, heat treatment for forming the Hf-containing insulating film 5).

Figure 41:
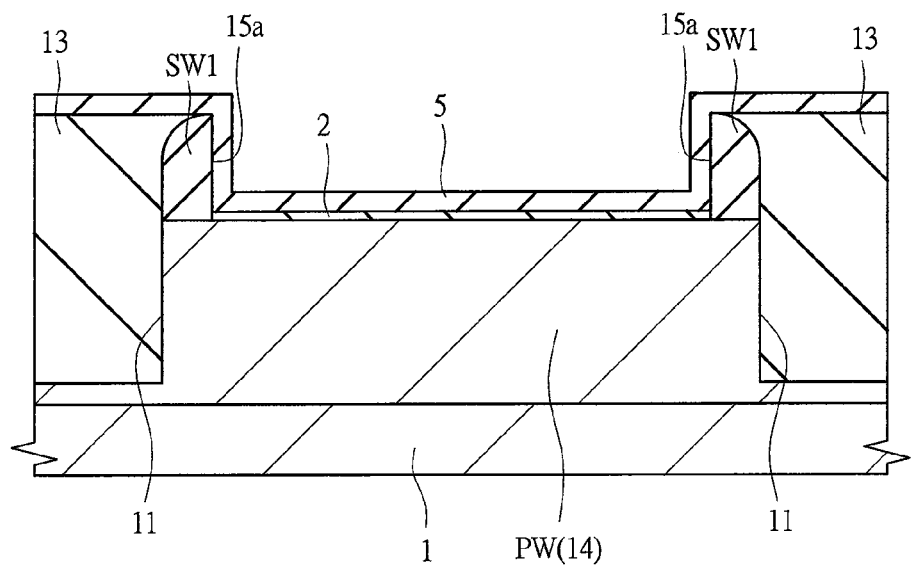
FIG. 41 is a sectional view of a main portion of the semiconductor device during the manufacturing process thereof continued from FIG. 40.

By this heat treatment, the Hf-containing film 3 and the rare earth-containing film 4 are reacted with (mixed with, mutually diffused in) each other, and an Hf-containing insulating film 5 which is a reaction layer (mixed layer) between the Hf-containing film 3 and the rare earth-containing film 4 is formed as shown in FIG. 41. That is, the rare earth element in the rare earth-containing film 4 is introduced into the Hf-containing film 3, and the Hf-containing film 3 is changed to the Hf-containing insulating film 5.

In the above-described first embodiment, after the Hf-containing insulating film 5 is formed, the stacked pattern 8 is formed by patterning the Hf-containing insulating film 5 and the like, and the sidewall insulating film SW1 and the device isolation region 13 are then formed in the region which is not covered with the stacked pattern 8. Therefore, in the above-described first embodiment, the Hf-containing insulating film 5 is not formed on the device isolation region 13 and on the sidewall insulating film SW1. On the other hand, in the present embodiment, after the sidewall insulating film SW1 and the device isolation region 13 are formed, the Hf-containing film 3 and the rare earth-containing film 4 are formed, and the Hf-containing film 3 and the rare earth-containing film 4 are caused to react with each other, thereby forming the Hf-containing insulating film 5. Therefore, in the present embodiment, as shown in FIG. 41, the Hf-containing insulating film 5 is formed not only on the semiconductor substrate 1 (p-type well PW) on the bottom surface (active layer 14) of the recess 15a (this is formed via the interface layer 2 when the interface layer 2 has been formed) but also on the device isolation region 13 and on the sidewall insulating film SW1. More specifically, the Hf-containing insulating film 5 is formed on the semiconductor substrate 1 (p-type well PW) located in the region (active region 14) which is surrounded by the device isolation region 13 and is not covered with the sidewall insulating film SW1, and the Hf-containing insulating film 5 is formed also on the sidewall insulating film SW1 and the device isolation region 13.

In the case where the interface layer 2 is formed before the Hf-containing film 3 is formed, it is preferred that the silicon oxide film or the silicon oxynitride film as the interface layer 2 is left by suppressing the reaction between the Hf-containing film 3 and the interface layer 2 located below it during the heat treatment for forming the Hf-containing insulating film 5. More specifically, it is preferred that the silicon oxide film or the silicon oxynitride film as the interface layer 2 is left between the Hf-containing insulating film 5 and the semiconductor substrate 1 (p-type well PW) on the bottom surface (active region 14) of the recess 15a. By this means, an excellent device where degradation of a driving force and reliability has been suppressed can be manufactured. However, the rare earth from the rare earth-containing film 4 is somewhat introduced into the interface layer 2 in some cases.

Since the composition of the Hf-containing insulating film 5 is basically the same as the first embodiment, repetitive description thereof is omitted here.

Figure 42:
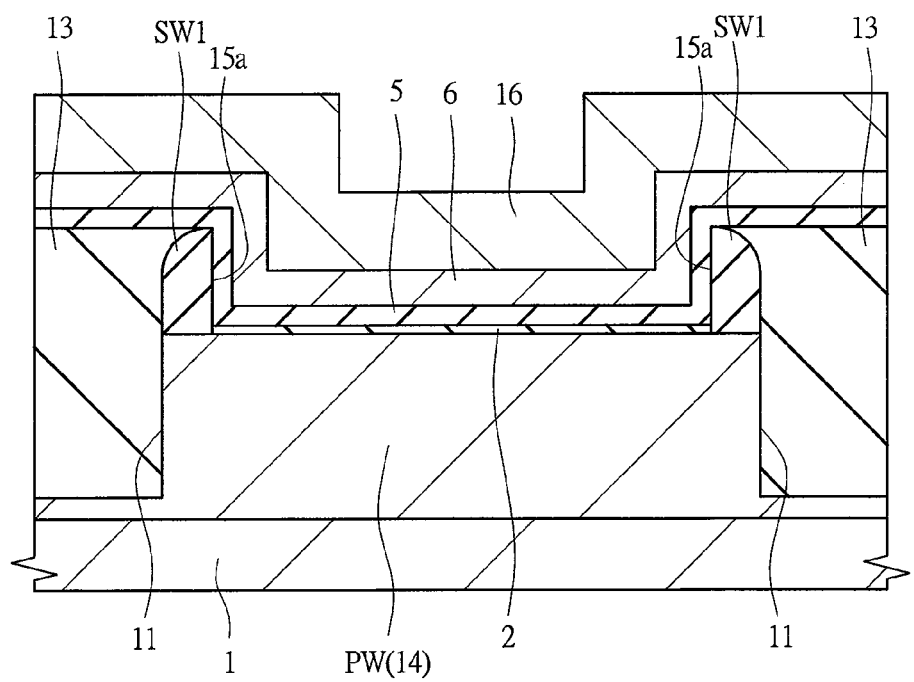
FIG. 42 is a sectional view of a main portion of the semiconductor device during the manufacturing process thereof continued from FIG. 41.
Figure 43:
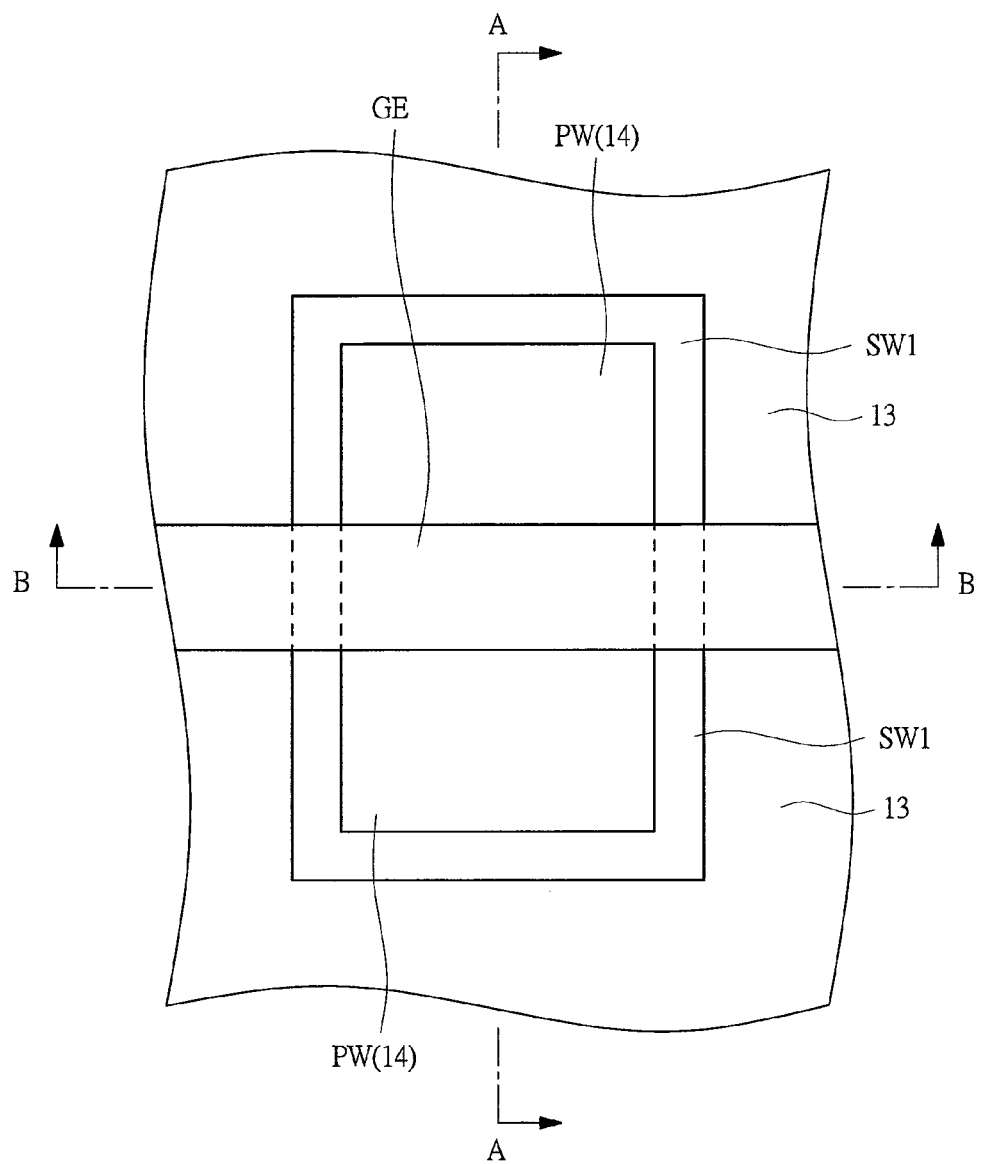
FIG. 43 is a plan view of a main portion of the semiconductor device during the manufacturing process thereof continued from FIG. 42.

Next, as shown in FIG. 42, a metal film 6 for a metal gate (metal gate electrode) is formed on the main surface of the semiconductor substrate 1, namely, on the Hf-containing insulating film 5. A constitution and a formation method of the metal film 6 are similar to those of the above-described first embodiment.

Next, a silicon film 16 is formed on the main surface of the semiconductor substrate 1, namely, on the metal film 6. A constitution and a formation method of the silicon film 16 are similar to those of the above-described first embodiment. In this stage, as shown in FIG. 42, the interface layer 2, the Hf-containing insulating film 5, the metal film 6 and the silicon film 16 have been stacked in this order from the bottom on the semiconductor substrate 1 (p-type well PW) on the bottom surface (active region 14) of the recess 15a, and the Hf-containing insulating film 5, the metal film 6 and the silicon film 16 have been stacked in this order from the bottom on the device isolation region 13 and on the sidewall insulating film SW1.

It is also possible to omit the formation process of the silicon film 16 by making the thickness of the metal film 6 large (in this case, the gate electrode GE is made up of the metal film 6 without the silicon film 16), but it is more preferable that the silicon film 16 is formed on the metal film 6 (namely, the gate electrode GE is formed of the stacked film of the metal film 6 and the silicon film 16 thereon). The reason is as follows. That is, when the thickness of the metal film 6 is excessively large, a problem that the metal film 6 is likely to fall away and a problem that the substrate is damaged by over-etching when the metal film 6 is patterned may occur, but by forming the gate electrode from the stacked film of the metal film 6 and the silicon film 16, the thickness of the metal film 6 can be made smaller as compared with the case where the gate electrode is made up of only the metal film 6, and therefore the above problems can be mended. Further, when the silicon film 16 is formed on the metal film 6, since it is possible to follow the conventional processing method and the process for a polysilicon gate electrode (gate electrode made of polysilicon), this is advantageous also in terms of microfabrication processability, manufacturing cost and yield.

Figure 44:
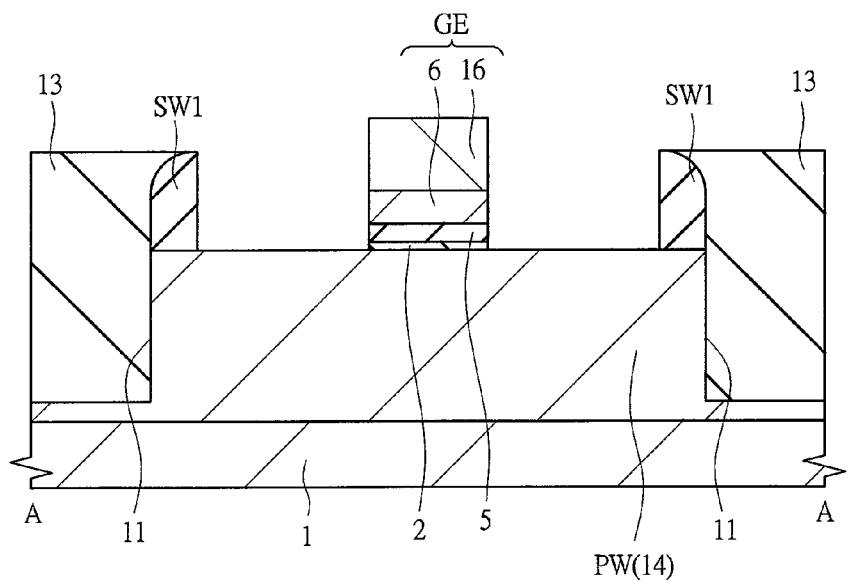
FIG. 44 is a sectional view (sectional view taken along the line A-A) of a main portion of the semiconductor device during the same manufacturing process thereof as that shown in FIG. 43.

Next, by patterning the stacked film of the silicon film 16 and the metal film 6, the gate electrode GE made up of the metal film 6 and silicon film 16 on the metal film 6 is formed as shown in FIG. 43 and FIG. 44. This patterning process (process of forming the gate electrode GE) can be performed by forming a photoresist pattern (not shown) on the silicon film 16 by using a photolithography technique and then etching (preferably, dry-etching) the stacked film of the silicon film 16 and the metal film 6 with using the photoresist pattern as an etching mask to perform patterning. Thereafter, the photoresist pattern is removed.

Figure 45:
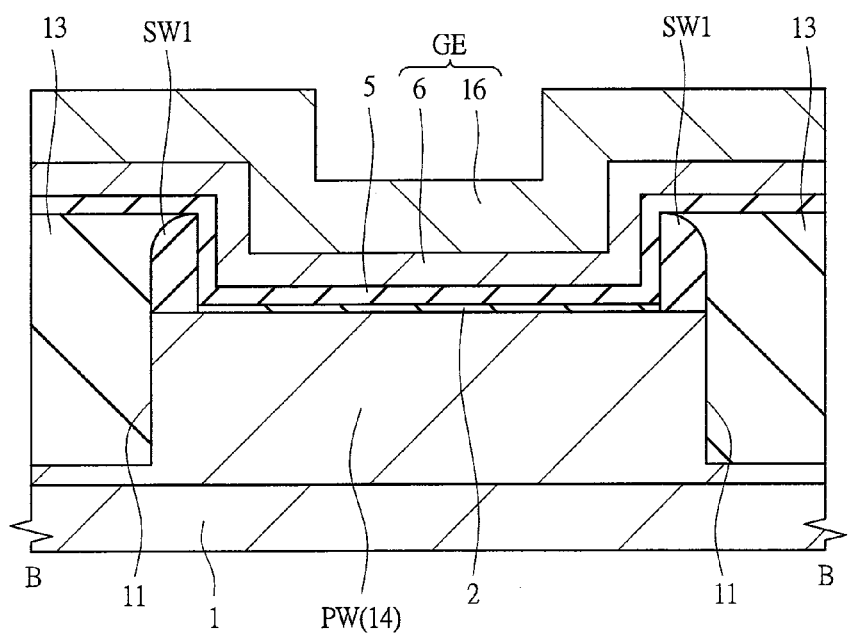
FIG. 45 is a sectional view (sectional view taken along the line B-B) of a main portion of the semiconductor device during the same manufacturing process thereof as that shown in FIG. 43 and FIG. 44.
Figure 46:
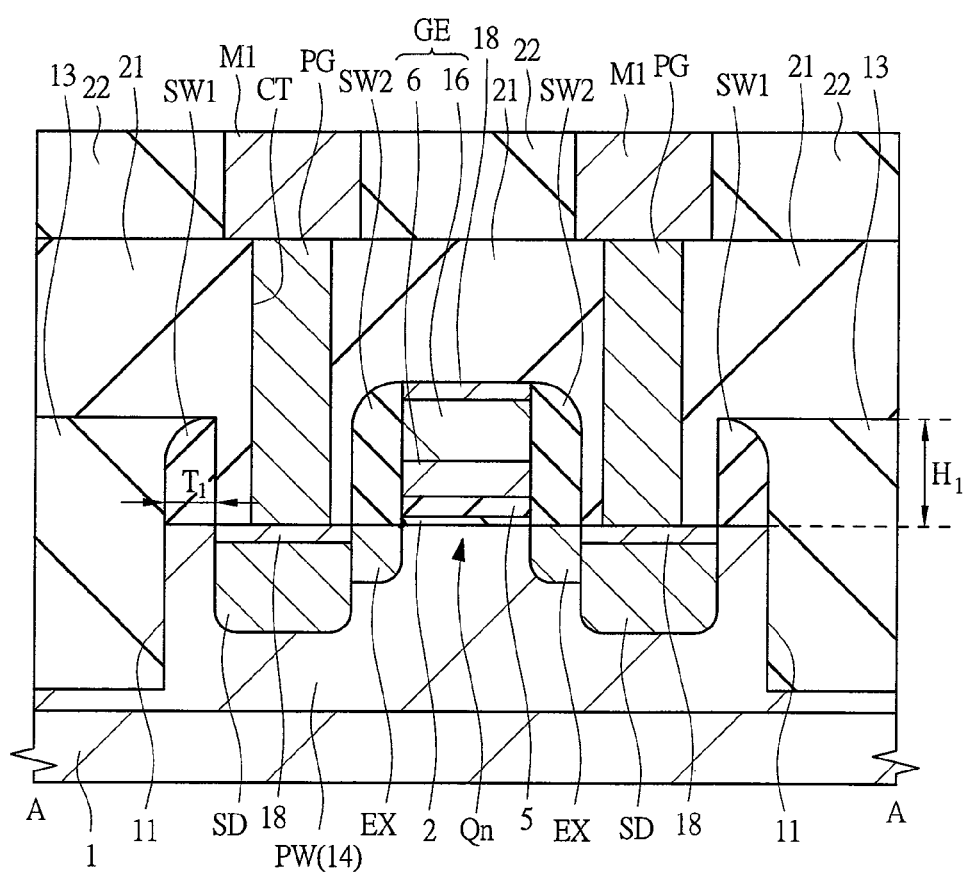
FIG. 46 is a sectional view (sectional view taken along the line A-A) of a main portion of the semiconductor device during the manufacturing process thereof continued from FIG. 43 to FIG. 45.
Figure 47:
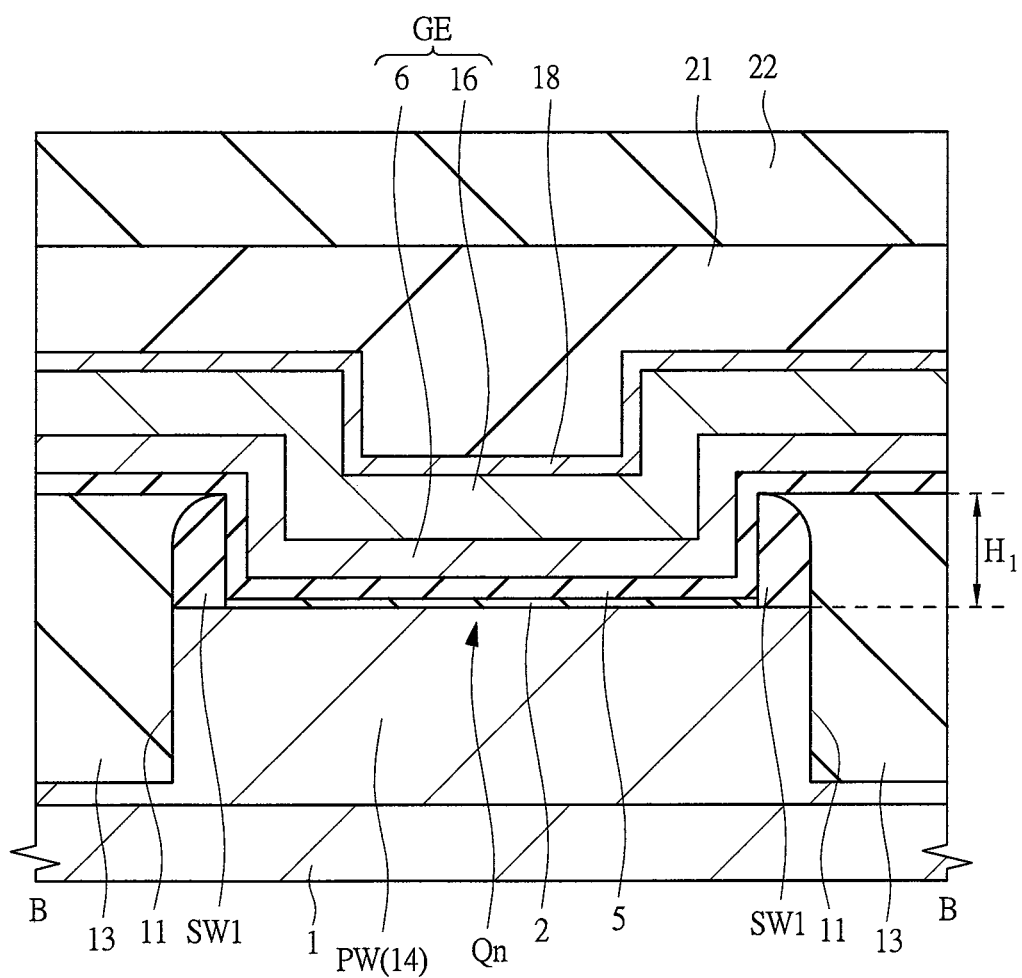
FIG. 47 is a sectional view (sectional view taken along the line B-B) of a main portion of the semiconductor device during the same manufacturing process thereof as that shown in FIG. 46.

Note that FIG. 43 is a plan view of a main portion of a semiconductor device at a stage where the gate electrode GE has been formed. FIG. 44 and FIG. 45 are sectional views of the main portion of the semiconductor device at the stage where the gate electrode GE has been formed. A sectional view taken along the line A-A in FIG. 43 corresponds to FIG. 44, and a sectional view taken along the line B-B in FIG. 43 corresponds to FIG. 45. Therefore, FIG. 43, FIG. 44 and FIG. 45 correspond to FIG. 13, FIG. 14 and FIG. 15 of the above-described first embodiment, respectively. FIG. 46 described later corresponds to a sectional view taken along the line A-A, and FIG. 47 described later corresponds to a sectional view taken along the line B-B. Also, FIG. 46 and FIG. 47 show the same process stage. Further, in the respective process stages shown in FIG. 33 to FIG. 42, sections taken along the line A-A and sections taken along the line B-B have the same sectional structures, and therefore FIG. 33 to FIG. 42 are common to the sectional views taken along the line A-A and the sectional views taken along the line B-B.

It is more preferable that, after the dry-etching process for patterning the silicon film 16 and the metal film 6 (namely, the dry-etching process for forming the gate electrode GE), wet-etching is performed to remove a portion of the Hf-containing insulating film 5 which is not covered with the gate electrode GE. The Hf-containing insulating film 5 located below the gate electrode GE is left without being removed by the dry-etching for patterning the silicon film 16 and the metal film 6 and the subsequent wet-etching, and it becomes a high-dielectric gate insulating film. On the other hand, a portion of the Hf-containing insulating film 5 which is not covered with the gate electrode GE is removed by the dry-etching performed when the silicon film 16 and the metal film 6 are patterned and the subsequent wet-etching.

The gate electrode GE is formed so that a portion thereof extends on the device isolation region 13. More specifically, the gate electrode GE is formed so as to extend from above the active region 14 to above the sidewall insulating films SW1 and the device isolation regions 13.

Since the gate electrode GE has a stacked structure of the metal film 6 and the silicon film 16 on the metal film 6, it can be regarded as a so-called metal gate electrode.

In the present embodiment, not only a portion of the gate electrode GE located on the active region 14 (p-type well PW) but also portions thereof located on the device isolation region 13 and on the sidewall insulating film SW1 have the stacked structure of the metal film 6 and the silicon film 16 on the metal film 6. In other words, the whole gate electrode GE has the stacked structure of the metal film 6 and the silicon film 16 on the metal film 6.

In the active region 14, the interface layer 2 and the Hf-containing insulating film 5 are interposed between the semiconductor substrate 1 (p-type well PW) and the gate electrode GE, and they (interface layer 2 and Hf-containing insulating film 5) function as the gate insulating film of the MISFET. More specifically, the gate electrode GE made up of the metal film 6 and the silicon film 16 on the metal film 6 is formed on the surface of the p-type well PW of the active region 14 via the Hf-containing insulating film 5 serving as the gate insulating film (when the interface layer 2 is formed, the interface layer 2 is also interposed). The Hf-containing insulating film 5 has a dielectric constant (relative permittivity) higher than that of silicon oxide, and it functions as a high-dielectric gate insulating film.

The gate electrode GE partially extents also on the device isolation region 13 and on the sidewall insulating film SW1, and the Hf-containing insulating film 5 is interposed between the gate electrode GE and the semiconductor substrate 1 (p-type well PW), between the gate electrode GE and the device isolation region 13 and between the gate electrode GE and the sidewall insulating film SW1. Further, the interface layer 2 is also interposed between the gate electrode GE and the semiconductor substrate 1 (p-type well PW), but the interface layer 2 is not interposed between the gate electrode GE and the device isolation region 13 and between the gate electrode GE and the sidewall insulating film SW1.

The subsequent process is approximately similar to that in the above-described first embodiment.

That is, as shown in FIG. 46 and FIG. 47, n⁻-type semiconductor regions EX are formed in regions (regions which are not covered with the gate electrode GE) on both sides of the gate electrode GE in the active region 14 (p-type well PW) in the same manner as the above-described first embodiment. Then, after sidewalls SW2 are formed on the sidewalls of the gate electrode GE in the same manner as the above-described first embodiment, n⁺-type semiconductor regions SD are formed in the active region 14 (p-type well PW) in the same manner as the above-described first embodiment, and heat treatment for activating introduced impurities is then performed in the same manner as the above-described first embodiment. Since constitutions, formation methods and formation positions of the n⁻-type semiconductor regions EX, the sidewalls SW2 and the n⁺-type semiconductor regions SD are similar to those in the above-described first embodiment, description thereof is omitted here.

An n-channel MISFET Qn as a field effect transistor is formed in the active region 14 in the above-described manner.

The gate electrode GE functions as the gate electrode (metal gate electrode) of the n-channel MISFET Qn, and the Hf-containing insulating film 5 (and the interface layer 2 below it) located below the gate electrode GE functions as the gate insulating film of the n-channel MISFET Qn. Also, n-type semiconductor regions (impurity diffusion layers) functioning as source and drain of the n-channel MISFET Qn are formed from the n⁺-type semiconductor regions SD and the n⁻-type semiconductor regions EX.

Next, as shown in FIG. 46 and FIG. 47, metal silicide layers 18 are formed on upper portions (upper layer portions) of the n⁺-type semiconductor regions SD constituting the source and drain and on an upper portion (upper layer portion) of the silicon film 16 constituting the gate electrode GE by a salicide process like in the above-described first embodiment. Then, like in the above-described first embodiment, an insulating film 21 is formed on the main surface of the semiconductor substrate 1 so as to cover the device isolation regions 13, the gate electrode GE and the sidewalls SW2, contact holes CT are formed in the insulating film 21, and conductive plugs PG are formed in the contact holes CT. Then, like in the above-described first embodiment, an insulating film 22 is formed on the insulating film 21 in which the plugs PG have been embedded, and a wiring M1 is formed in the insulating film 22 by a damascene method. Thereafter, a second-layer wiring and wirings subsequent thereto are formed by a dual damascene method or the like, but illustrations and descriptions of the formation thereof are omitted here.

The semiconductor device according to the present embodiment is manufactured in the above-described manner.

A difference of the semiconductor device of the present embodiment (semiconductor device shown in FIG. 46 and FIG. 47) from the semiconductor device of the above-described first embodiment (semiconductor device shown in FIG. 24 and FIG. 25) lies in the following points.

That is, in the semiconductor device of the above-described first embodiment, the Hf-containing insulating film 5 is not formed on the sidewall insulating film SW1 and on the device isolation region 13, but the Hf-containing insulating film 5 is formed also on the sidewall insulating film SW1 and on the device isolation region 13 in the semiconductor device of the present embodiment. In other words, in the semiconductor device of the first embodiment, the Hf-containing insulating film 5 is formed between the gate electrode GE and the active region 14 (p-type well PW) of the semiconductor substrate 1, but it is not formed between the gate electrode GE and the sidewall insulating film SW1 and between the gate electrode GE and the device isolation region 13. On the other hand, in the semiconductor device of the present embodiment, the Hf-containing insulating film 5 is formed between the gate electrode GE and the active region 14 (p-type well PW) of the semiconductor substrate 1, between the gate electrode GE and the sidewall insulating film SW1 and between the gate electrode GE and the device isolation region 13. Further, in the semiconductor device of the first embodiment, a portion of the gate electrode GE which is formed on the active region 14 (p-type well PW) of the semiconductor substrate 1 via the gate insulating film (Hf-containing insulating film 5 and interface layer 2) has the stacked structure of the metal film 6 and the silicon film 16 on the metal film 6, and a portion of the gate electrode GE which is located on the device isolation region 13 does not have the metal film 6 and it is made of the silicon film 16. On the other hand, in the semiconductor device of the present embodiment, the whole gate electrode GE has the stacked structure of the metal film 6 and the silicon film 16 on the metal film 6. The other constitutions of the semiconductor device of the present embodiment are approximately similar to those of the semiconductor device of the first embodiment described above.

Also in the present embodiment, an effect approximately similar to that in the first embodiment can be obtained.

That is, like in the above-described first embodiment, the gate electrode GE partially extends on the device isolation region 13 and the device isolation region 13 is made of the silicon oxide film 12 embedded into the trench 11 for device isolation formed in the semiconductor substrate 1 also in the semiconductor device of the present embodiment, and an upper portion of the device isolation region 13 is protruded from (the main surface of) the semiconductor substrate 1 and the sidewall insulating film SW1 is formed on the sidewall of the portion of the device isolation film 13 protruded from the semiconductor substrate 1. Also, the sidewall insulating film SW1 is made of silicon nitride or silicon oxynitride. The gate insulating film of the n-channel MISFET Qn is made of the Hf-containing insulating film 5 (and the interface layer 2) formed between the gate electrode GE and the active region 14 (p-type well PW) of the semiconductor substrate 1, and the sidewall insulating film SW1 is interposed between the gate insulating film (Hf-containing insulating film 5) located between the gate electrode GE and the active region 14 (p-type well PW) of the semiconductor substrate 1 and the device isolation region 13.

Also in the semiconductor device of the present embodiment, the portion of the Hf-containing insulating film 5 functioning as the gate insulating film (namely, the portion of the Hf-containing insulating film 5 located between the gate electrode GE and the active region 14 (p-type well PW) of the semiconductor substrate 1) is not located adjacent to (near) the device isolation region 13, and the sidewall insulating film SW1 is interposed between the portion and the device isolation region 13. The Hf-containing insulating film 5 is located adjacent to the sidewall insulating film SW1 (namely, the Hf-containing insulating film 5 is formed also on the sidewall insulating film SW1), but since the sidewall insulating film SW1 is made of silicon nitride or silicon oxynitride, the rare earth element is difficult to diffuse from the Hf-containing insulating film 5 to the sidewall insulating film SW1.

Therefore, by forming the sidewall insulating film SW1 from silicon nitride or silicon oxynitride into which the rare earth element is difficult to diffuse and interposing the sidewall insulating film SW1 between the portion of the Hf-containing insulating film 5 which functions as the gate insulating film and the device isolation region 13, the sidewall insulating film SW1 can be made to function as a diffusion barrier for the rare earth element. By this means, the diffusion of the rare earth element from the portion of the Hf-containing insulating film 5 which functions as the gate insulating film to the device isolation region 13 can be suppressed or prevented, and lowering of the rare earth concentration in the portion of the Hf-containing insulating film 5 which functions as the gate insulating film can be suppressed or prevented. Accordingly, the effect of threshold reduction attained by introducing the rare earth element into the Hf-containing insulating film 5 can be obtained adequately, and the absolute value of the threshold voltage of the n-channel MISFET Qn can be lowered adequately. Further, since the effect of threshold reduction attained by introducing the rare earth element into the Hf-containing insulating film 5 can be adequately obtained regardless of the channel width as shown by the solid line in the graph in FIG. 28 in the first embodiment and the absolute value of the threshold voltage of the MISFET can be adequately lowered, the channel width dependency of the threshold voltage can be reduced. Therefore, the performance of the semiconductor device can be improved.

Figure 48:
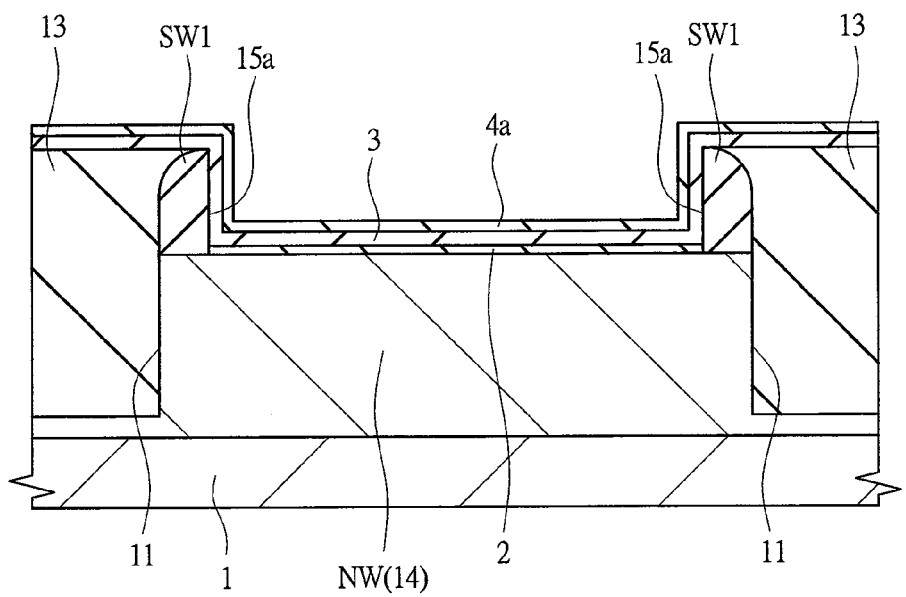
FIG. 48 is a sectional view of a main portion of a semiconductor device of a modified example of the second embodiment of the present invention during a manufacturing process thereof.

Further, the case where the n-channel MISFET is formed has been described in the present embodiment, but the invention can be applied also to a p-channel MISFET. FIG. 48 to FIG. 51 are sectional views of a main portion of a semiconductor device during the manufacturing process thereof according to a modified example of the present embodiment, and the sectional views show the case of forming a p-channel MISFET. FIG. 48 corresponds to FIG. 40 shown above, FIG. 49 corresponds to FIG. 41 shown above, FIG. 50 corresponds to FIG. 46 shown above, and FIG. 51 corresponds to FIG. 47 shown above.

The p-channel MISFET Qp can also be formed basically in the same manner as the n-channel MISFET Qn, and different points from the case of forming the n-channel MISFET will be described here.

As shown in FIG. 48, an n-type well NW is formed instead of the p-type well PW, and the n-type well NW is similar to the p-type well PW in formation method and constitution except that the conductivity type thereof is opposite (reverse) to that of the p-type well PW.

Further, as shown in FIG. 48, a material film 4a is formed on the Hf-containing film 3 instead of the rare earth-containing film 4. Since the material film 4a has been described in the first embodiment (description associated with FIG. 29), repetitive description thereof is omitted here.

Figure 49:
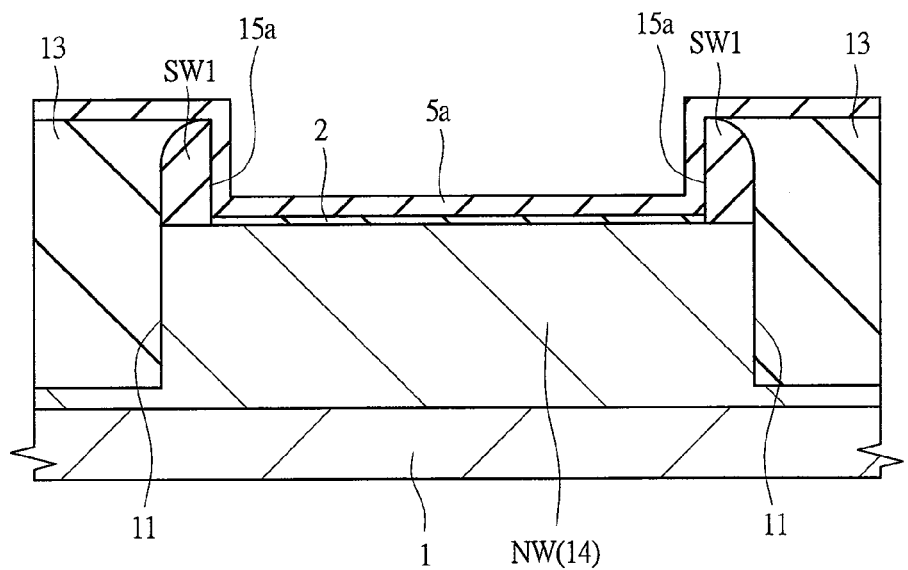
FIG. 49 is a sectional view of a main portion of the semiconductor device during the manufacturing process thereof continued from FIG. 48.

After the material film 4a is formed instead of the above-described rare earth-containing film 4, heat treatment similar to the above-described heat treatment (heat treatment for causing the Hf-containing film 3 and the rare earth-containing film 4 to react with each other) is performed, and the Hf-containing film 3 and the material film 4a are reacted with (mixed with, mutually diffused in) each other by this heat treatment, thereby forming an Hf-containing insulating film 5a which is a reaction layer (mixed layer, mixing layer) of the Hf-containing film 3 and the material film 4a as shown in FIG. 49. In other words, the Hf-containing insulating film 5a is formed instead of the above-described Hf-containing insulating film 5.

A different point between the Hf-containing insulating film 5a shown in FIG. 49 and the Hf-containing insulating film 5 shown in FIG. 41 lies in that the Hf-containing insulating film 5 shown in FIG. 41 contains the rare earth element as the element for threshold reduction, while the Hf-containing insulating film 5a shown in FIG. 49 contains Al (aluminum), Ti (titanium) or Ta (tantalum) as the element for threshold reduction instead of the rare earth element. Since the Hf-containing insulating film 5a shown in FIG. 49 has a constitution similar to that of the Hf-containing insulating film 5 shown in FIG. 41 except that the Hf-containing insulating film 5a contains Al (aluminum), Ti (titanium) or Ta (tantalum) as the element for threshold reduction instead of the rare earth element, repetitive description thereof is omitted here.

Thereafter, p$^-$-type semiconductor regions EXa are formed instead of the n$^-$-type semiconductor regions EX and p$^+$-type semiconductor regions SDa are formed instead of the n$^+$-type semiconductor regions SD. The p$^-$-type semiconductor regions EXa are similar to the n$^-$-type semiconductor regions EX in formation method and constitution except that the conductivity type thereof is opposite to that of the n$^-$-type semiconductor regions EX, and the p$^+$-type semiconductor regions SDa are similar to the n$^+$-type semiconductor regions SD in formation method and constitution except that the conductivity type thereof is opposite to that of the n$^+$-type semiconductor regions SD.

Figure 50:
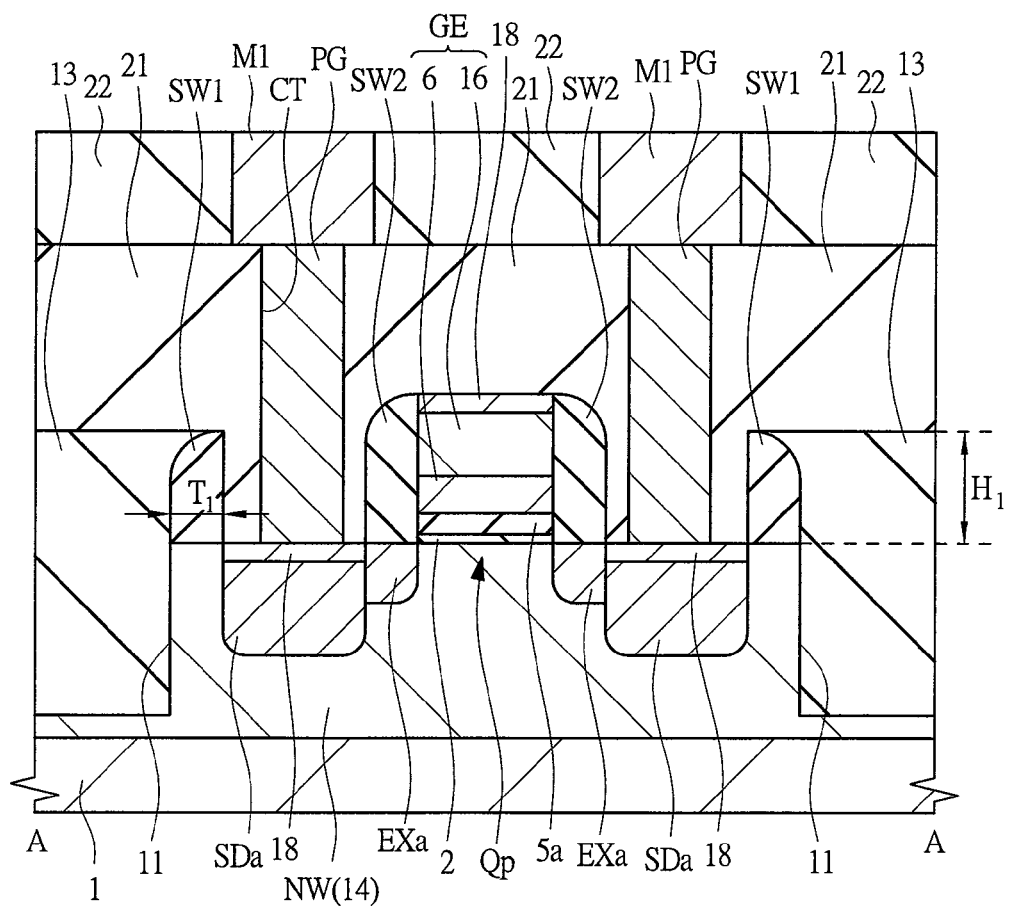
FIG. 50 is a sectional view (sectional view taken along the line A-A) of a main portion of the semiconductor device during the manufacturing process thereof continued from FIG. 49.
Figure 51:
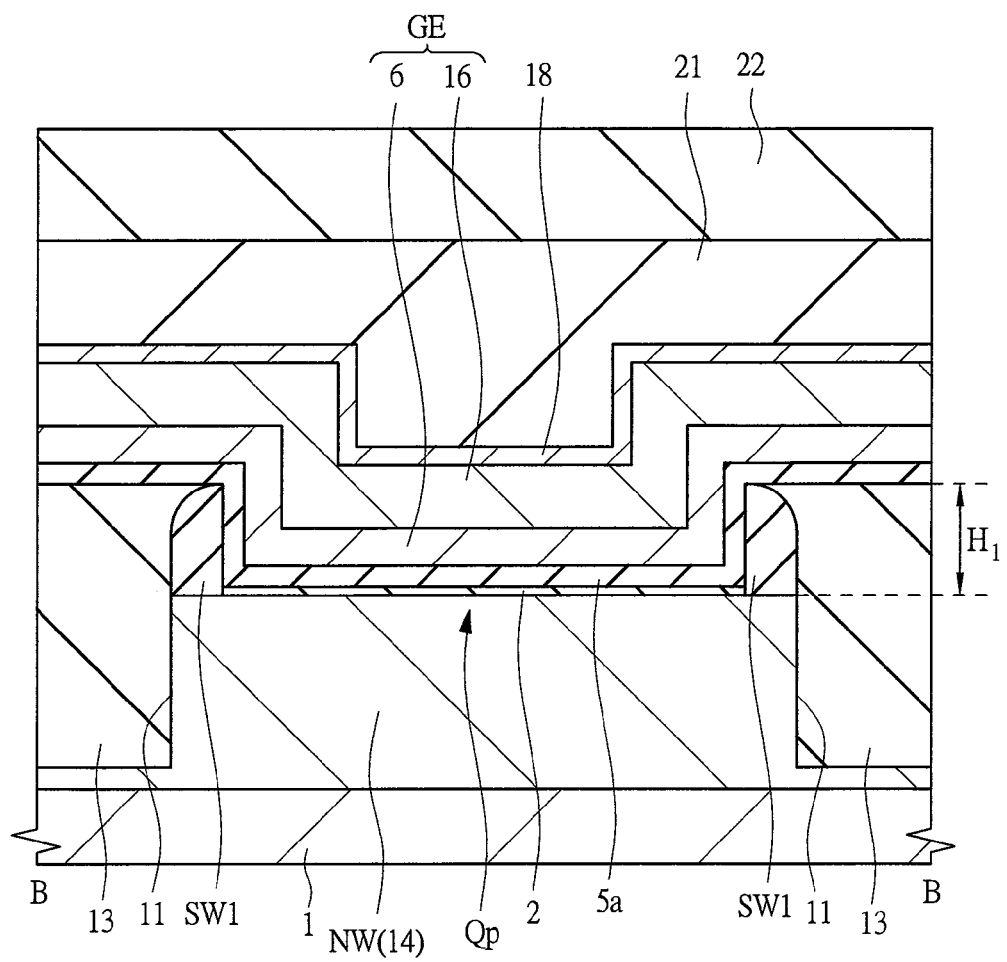
FIG. 51 is a sectional view (sectional view taken along the line B-B) of a main portion of the semiconductor device during the same manufacturing process thereof as that shown in FIG. 50.

The structure shown in FIG. 50 (section taken along the line A-A) and FIG. 51 (section taken along the line B-B) corresponding to FIG. 46 (section taken along the line A-A) and FIG. 47 (section taken along the line B-B), respectively, can be obtained in this manner.

Different points of the semiconductor device shown in FIG. 50 and FIG. 51 from the semiconductor device shown in FIG. 46 and FIG. 47 lie in that the conductivity types of the above-described p-type well PW, n$^-$-type semiconductor regions EX and n$^+$-type semiconductor regions SD are reversed to form the n-type well NW, the p$^-$-type semiconductor regions EXa and the p$^+$-type semiconductor regions SDa and that the element for threshold reduction contained in the Hf-containing insulating film 5 is changed to Al, Ti or Ta to form the Hf-containing insulating film 5a. The other constitutions of the semiconductor device shown in FIG. 50 and FIG. 51 are approximately similar to those of the semiconductor device shown in FIG. 46 and FIG. 47.

Even when the p-channel MISFET Qp is formed, diffusion of the element for threshold reduction (Al, Ti or Ta) from the portion of the Hf-containing insulating film 5a which functions as the gate insulating film to the device isolation region 13 can be suppressed or prevented by the sidewall insulating film SW1 in the present embodiment. Therefore, lowering of the concentration of the element for threshold reduction (Al, Ti or Ta) in the portion of the Hf-containing insulating film 5a which functions as the gate insulating film can be suppressed or prevented. Accordingly, also in the p-channel MISFET, like in the n-channel MISFET, the effect of the threshold reduction attained by introducing Al (aluminum), Ti (titanium) or Ta (tantalum) into the Hf-containing insulating film 5a can be adequately obtained as shown by the solid line in the graph in FIG. 28 regardless of the channel width, and the absolute value of the threshold voltage of the MISFET can be adequately lowered. Further, the channel width dependency of the threshold voltage can be reduced.

Further, in the above-described first embodiment, the Hf-containing insulating film 5 (or Hf-containing insulating film 5a) is formed between the gate electrode GE and the active region 14 (p-type well PW or n-type well NW) in the semiconductor substrate 1, but it is not formed between the gate electrode GE and the sidewall insulating film SW1 and between the gate electrode GE and the device isolation region 13. Therefore, since the Hf-containing insulating film 5 (5a) does not have a portion in contact with the device isolation region 13, the diffusion of the element for threshold reduction from the Hf-containing insulating film 5 (5a) to the device isolation region 13 can be reliably prevented.

On the other hand, in the present embodiment, the Hf-containing insulating film 5 (or Hf-containing insulating film 5a) is formed between the gate electrode GE and the active region 14 (p-type well PW or n-type well NW) in the semiconductor substrate 1, between the gate electrode GE and the sidewall insulating film SW1 and between the gate electrode GE and the device isolation region 13. Therefore, in the present embodiment, since the Hf-containing insulating film 5 (5a) has a portion in contact with the device isolation region 13 (portion formed between the device isolation region 13 and the gate electrode GE corresponds to this portion), there is a possibility that the element for threshold reduction diffuses from the portion of the Hf-containing insulating film 5 (5a) in contact with the device isolation region 13 to the device isolation region 13.

In the present embodiment, however, a portion of the Hf-containing insulating film 5 (5a) located between the gate electrode GE and the sidewall insulating film SW1 is interposed between a portion of the Hf-containing insulating film 5 (5a) located between the gate electrode GE and the active region 14 (p-type well PW or n-type well NW) in the semiconductor substrate 1 and a portion of the Hf-containing insulating film 5 (5a) located between the gate electrode GE and the device isolation region 13. More specifically, the portion of the Hf-containing insulating film 5 (5a) functioning as the gate insulating film (portion of the Hf-containing insulating film 5 (5a) located between the gate electrode GE and the active region 14 in the semiconductor substrate 1) is not located adjacent to the device isolation region 13 and the portion of the Hf-containing insulating film 5 (5a) located between the gate electrode GE and the sidewall insulating film SW1 is interposed between the portion of the Hf-containing insulating film 5 (5a) contacting with the device isolation region 13 and the portion of the Hf-containing insulating film 5 (5a) located between the gate electrode GE and the active region 14. Also, the sidewall insulating film SW1 is made of silicon nitride or silicon oxynitride (more preferably silicon nitride) into which the element for threshold reduction is difficult to diffuse. Therefore, in the present embodiment, even if the element for threshold reduction diffuses from the portion of the Hf-containing insulating film 5 (5a) in contact with the device isolation region 13 to the device isolation region 13, the concentration of the element for threshold reduction hardly decreases in the portion of the Hf-containing insulating film 5 (5a) functioning as the gate insulating film (portion of the Hf-containing insulating film 5 (5a) located between the gate electrode GE and the active region 14 in the semiconductor substrate 1), and the effect of threshold reduction can be adequately obtained. Further, the threshold reduction can be achieved even in a MISFET with a small channel width. The same holds true for the third embodiment described later, but the sidewall insulating film SW1 should be read as a sidewall insulating film SW1a in the third embodiment described later.

In the present embodiment, the gate electrode GE is formed so as to extend from above the active region to above the device isolation region 13, and the Hf-containing insulating film 5 (or Hf-containing insulating film 5a) is formed below the whole gate electrode GE. In this case, it is effective to interpose a portion of the Hf-containing insulating film 5 (5a) located on the sidewall insulating film SW1 made of silicon nitride or silicon oxynitride between the portion of the Hf-containing insulating film 5 (5a) functioning as the gate insulating film (namely, the portion located on the active region) and the portion of the Hf-containing insulating film 5 (5a) located on the device isolation region 13 like in the present embodiment. By this means, lowering of the concentration of the element for threshold reduction in the portion of the Hf-containing insulating film 5 (5a) functioning as the gate insulating film can be suppressed or prevented, and the effect of threshold reduction achieved by introducing the element for threshold reduction into the Hf-containing insulating film 5 (5a) can be adequately obtained, and the threshold reduction can be achieved even in a MISFET with a small channel width. The same holds true for the third embodiment described later, but the sidewall insulating film SW1 should be read as a sidewall insulating film SW1a in the third embodiment described later.

Further, in the manufacturing process of the present embodiment, after the device isolation region 13 is formed by forming the stacked pattern 8b, the Hf-containing insulating film 5 and others are formed. Therefore, it has such an advantage that the manufacturing process of the semiconductor device can be performed easily.

Further, it is preferred that a protrusion amount $H_1$ of the device isolation region 13 from the main surface (surface) of the semiconductor substrate 1 is 10 nm or more ($H_1 \geq 10$ nm). Here, the protrusion amount $H_1$ is shown also in FIG. 46, FIG. 47, FIG. 50 and FIG. 51, and it corresponds to a difference in height (difference in level) between the main surface (surface) of the semiconductor substrate 1 and the upper surface of the device isolation region 13 (height mentioned here is a height in a direction perpendicular to the main surface of the semiconductor substrate 1). By setting the protrusion amount $H_1$ of the device isolation region 13 from the main surface (surface) of the semiconductor substrate 1 to 10 nm or more, it becomes possible to easily dispose the sidewall insulating film SW1 on the sidewall of the portion of the device isolation region 13 protruded from the semiconductor substrate 1, and the effect of preventing the diffusion of the element for threshold reduction from the portion of the Hf-containing insulating film 5 (or Hf-containing insulating film 5a) functioning as the gate insulating film to the device isolation region 13 by the sidewall insulating film SW1 can be enhanced.

Third Embodiment

The manufacturing process of a semiconductor device according to the third embodiment will be described with reference to the drawings. FIG. 52 to FIG. 60 are sectional views of a main portion of the semiconductor device according to the present embodiment during manufacturing process thereof. Note that, also in this embodiment, the case where an n-channel MISFET is formed as the MISFET will be described as an example like in the second embodiment described above.

First, the structure shown in the FIG. 33 is obtained in the same manner as the above-described second embodiment. Since the process similar to that of the second embodiment is performed until the structure shown in FIG. 33 is obtained (namely, until the insulating film 32 is formed), description thereof is omitted here.

Figure 52:
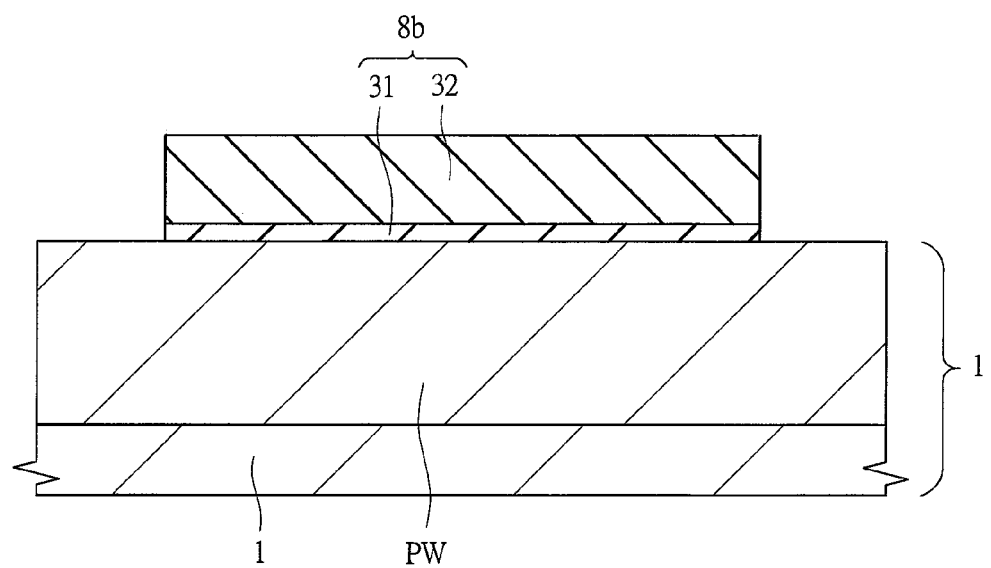
FIG. 52 is a sectional view of a main portion of a semiconductor device according to a third embodiment of the present invention during a manufacturing process thereof.

Next, as shown in FIG. 52, a stacked pattern 8b is formed by patterning the insulating film 32 and the insulating film 31 by using a photolithography technique and a dry-etching technique in the same manner as the second embodiment. Constitutions, formation methods and patterning methods of the insulating film 31 and the insulating film 32 are similar to those of the second embodiment and a constitution of the stacked pattern 8b is also similar to that of the second embodiment.

In the second embodiment described above, after the formation of the stacked pattern 8b, the device isolation region 13 is formed after the sidewall insulating film SW1 is formed. In the present embodiment, however, after the formation of the stacked pattern 8b, the device isolation region 13 is formed without forming the sidewall insulating film SW1. Hereinafter, this embodiment will be specifically described.

Figure 53:
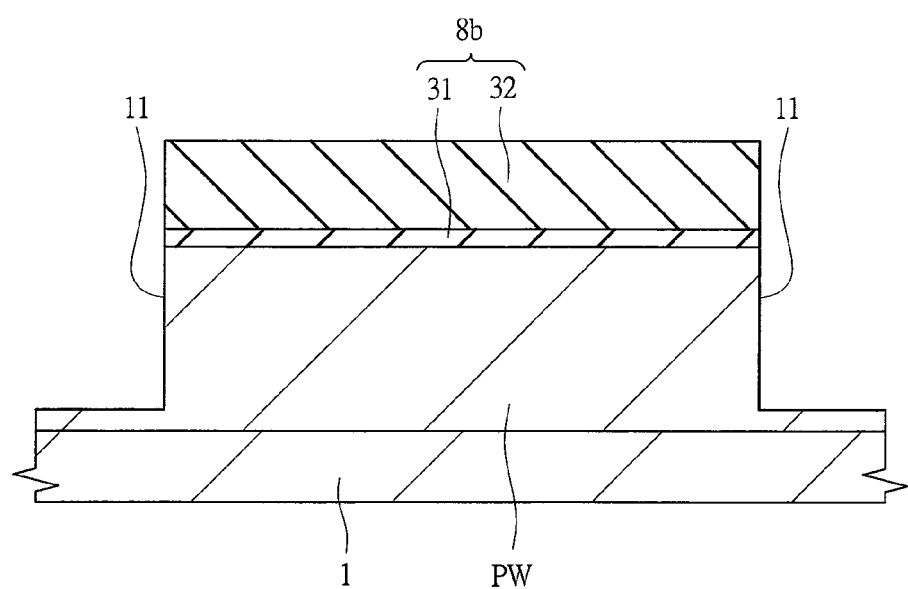
FIG. 53 is a sectional view of a main portion of the semiconductor device during the manufacturing process thereof continued from FIG. 52.

After the formation of the stacked pattern 8b, as shown in FIG. 53, the semiconductor substrate 1 is etched (preferably dry-etched) down to a predetermined depth with utilizing (the insulating film 32 of) the stacked pattern 8b as an etching mask, thereby forming trenches (trenches for device isolation) 11 in the semiconductor substrate 1. Although the trenches 11 are formed so as to align with the side surfaces of the sidewall insulating films SW1 (side surfaces which are not adjacent to the stacked pattern 8b) in the first and second embodiments described above, the trenches 11 are formed so as align with the side surfaces of the stacked pattern 8b in the present embodiment.

Next, device isolation regions 13 are formed in the same manner as the first and second embodiments described above.

Figure 54:
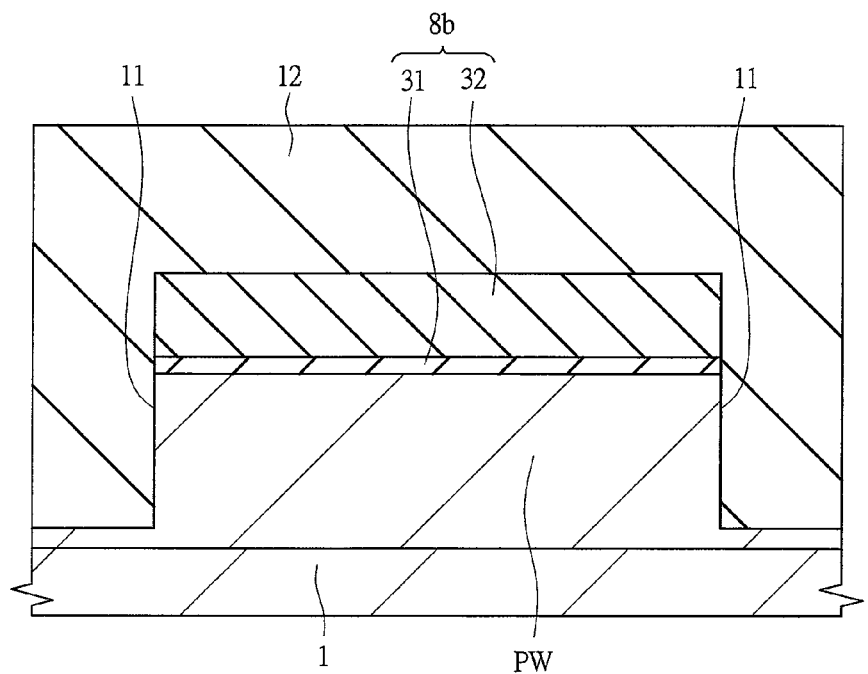
FIG. 54 is a sectional view of a main portion of the semiconductor device during the manufacturing process thereof continued from FIG. 53.
Figure 55:
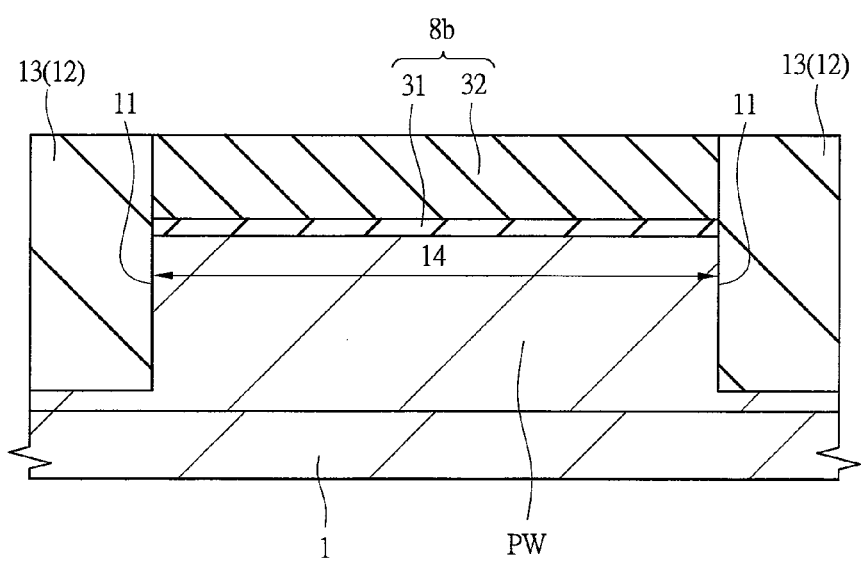
FIG. 55 is a sectional view of a main portion of the semiconductor device during the manufacturing process thereof continued from FIG. 54.

A formation method of the device isolation region 13 is similar to that of the second embodiment. More specifically, as shown in FIG. 54, a silicon oxide film 12 as an insulating film is first formed on the main surface of the semiconductor substrate 1 by using a CVD method or the like so as to fill the trenches 11. The silicon oxide film 12 is formed so as to fill the trenches 11 and cover the stacked pattern 8b. Then, as shown in FIG. 55, an upper surface of the silicon oxide film 12 is polished by CMP. This polishing is finished at a stage where an upper surface of the uppermost insulating film 32 in the stacked pattern 8b has been exposed. The device isolation region 13 is formed from the silicon oxide film 12 embedded in the trench 11. As shown also in FIG. 55, an upper surface of the device isolation region 13 is located at a position higher than the surface of the semiconductor substrate 1, and it is approximately flush with an upper surface of the stacked pattern 8b (namely, upper surface of the insulating film 32). More specifically, the device isolation regions 13 are protruded beyond the surface of the semiconductor substrate 1. Namely, by polishing the silicon oxide film 12 until (the insulating film 32 in) the stacked pattern 8b is exposed, the device isolation regions 13 which are made up of the silicon oxide film 12 embedded in the trenches (device isolation trenches) 11 and whose upper portions are protruded from the semiconductor substrate 1 are formed. A bottom surface of the device isolation region 13 comes in contact with (the semiconductor substrate 1 constituting) a bottom surface of the trench 11, and a side surface of the device isolation region 13 comes in contact with (the semiconductor substrate 1 constituting) a side surface of the trench 11 and a side surface of the stacked pattern 8b.

In the second embodiment described above, the side surface of the device isolation region 13 is in contact with the side surface of the trench 11 and the side surface of the sidewall insulating film SW1 (side surface on the side which is not adjacent to the stacked pattern 8b). In the present embodiment, however, since the sidewall insulating film SW1 is not formed yet, the side surface of the device isolation region 13 is in contact with the side surface of the trench 11 and the side surface of the stacked pattern 8b. More specifically, when the device isolation region 13 is formed, the stacked pattern 8b is adjacent to the sidewall of the portion of the device isolation region 13 which has been protruded from the surface of the semiconductor substrate 1. A region (planar region) surrounded by the device isolation regions 13 on the main surface of the semiconductor substrate 1 constitutes the active region 14. More specifically, the active region 14 is provided (defined) by the device isolation regions 13 and it is surrounded by the device isolation regions 13. The p-type well PW is formed in the active region 14. The active region 14 corresponds to a region in which the stacked pattern 8b is formed.

Next, the insulating film 32 in the stacked pattern 8b is selectively removed by wet-etching. At this time, the insulating film 32 is etched by using etchant having selectivity to the device isolation region 13 (silicon oxide film 12) and the insulating film 31 in the stacked pattern 8b. More specifically, the insulating film 32 is wet-etched by using the etchant by which an etching rate of the insulating film 32 becomes larger than respective etching rates of the device isolation region 13 (silicon oxide film 12) and the insulating film 31. By this means, the insulating film 32 is selectively removed and the device isolation region 13 can be left.

Figure 56:
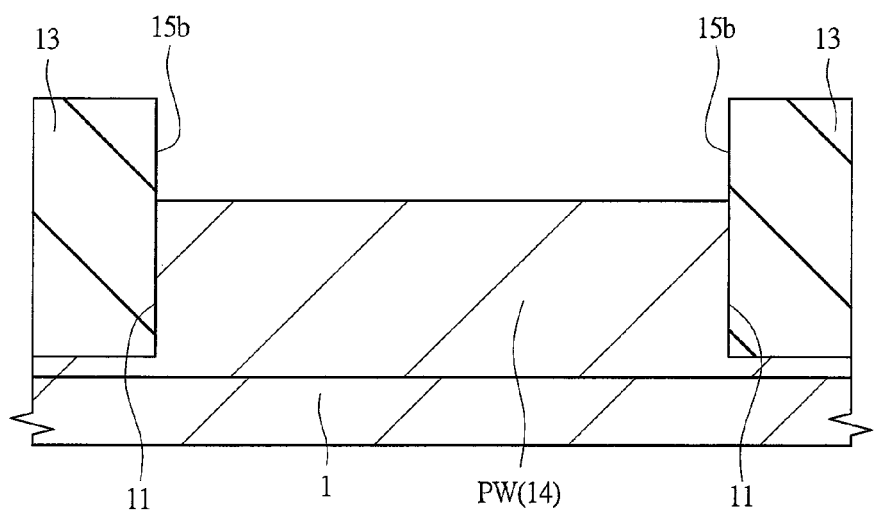
FIG. 56 is a sectional view of a main portion of the semiconductor device during the manufacturing process thereof continued from FIG. 55.

Next, the insulating film 31 exposed by the removal of the insulating film 32 is selectively removed by wet-etching. FIG. 56 shows a state that the insulating film 32 and the insulating film 31 have been removed (namely, the stacked pattern 8b has been removed).

When the insulating film 31 is made of a silicon oxide film, the device isolation region 13 is slightly etched in some cases when the insulating film 31 is etched. However, since the formation thickness of the insulating film 31 is smaller than the formation thickness of the insulating film 32, an etching amount (etching thickness) of the film to be etched is smaller in the etching process of the insulating film 31 than in the etching process of the insulating film 32. Therefore, in the etching process (removal step) of the insulating film 31, an etching amount of the device isolation region 13 can be suppressed. For this reason, the state that the upper portion of the device isolation region 13 is protruded from the semiconductor substrate 1 is maintained.

Further, as another aspect, the etching process of the insulating film 32 performed after the formation of the device isolation region 13 can be performed by dry-etching, and the etching process of the insulating film 31 performed after the formation of the device isolation region 13 and after the removal of the insulating film 32 can be performed by dry-etching. However, it is more preferable to perform these etching processes (etching process of the insulating film 32 and etching process of the insulating film 31) by wet-etching.

A recess (recessed portion) 15b is formed by the removal of the insulating films 31 and 32 (namely, removal of the stacked pattern 8b) as shown in FIG. 56. This recess 15b is a space where the stacked pattern 8b exists until it is removed. A bottom surface of the recess 15b is formed by the surface of the semiconductor substrate 1 (p-type well PW), and a side surface of the recess 15b is formed by the side surface of the device isolation region 13 (specifically, the side surface of a portion of the device isolation region 13 which is protruded from the surface of the semiconductor substrate 1).

Figure 57:
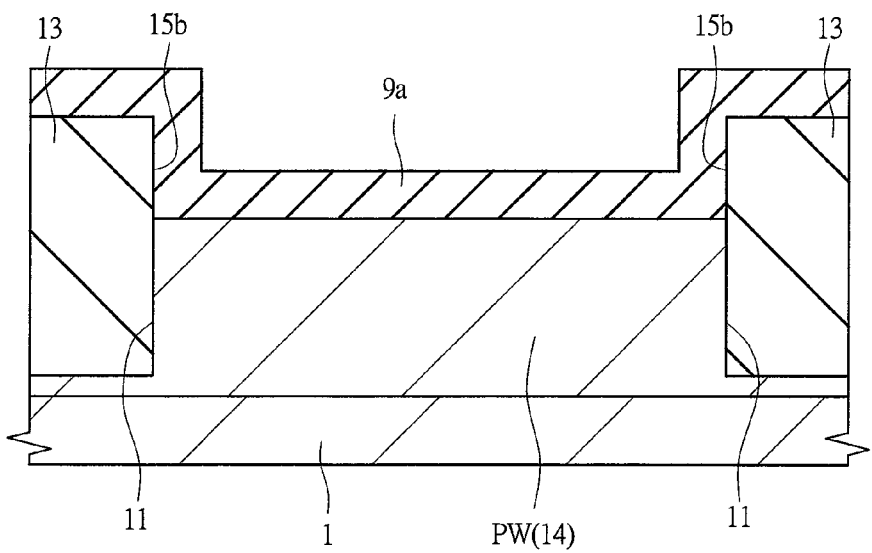
FIG. 57 is a sectional view of a main portion of the semiconductor device during the manufacturing process thereof continued from FIG. 56.
Figure 58:
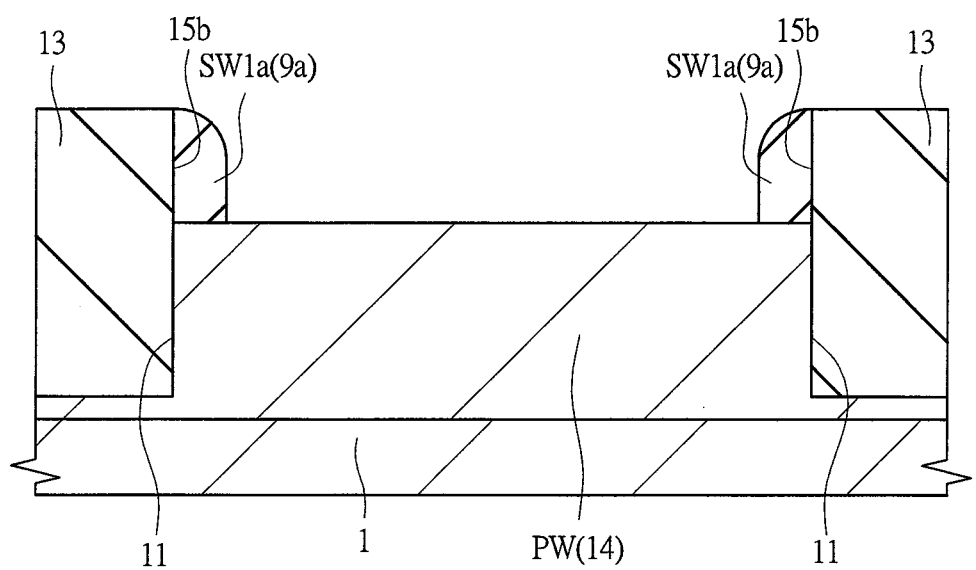
FIG. 58 is a sectional view of a main portion of the semiconductor device during the manufacturing process thereof continued from FIG. 57.

Next, a sidewall insulating film (sidewall, sidewall spacer, sidewall insulating film) SW1a made of silicon nitride or silicon oxynitride is formed as an insulator (insulating film) on a side surface (sidewall) of the recess 15b, namely, on a side surface (sidewall) of a portion of the device isolation region 13 protruded from the surface of the semiconductor substrate 1. Specifically, an insulating film 9a is formed on the semiconductor substrate 1 including the bottom surface and the side surface of the recess 15b as shown in FIG. 57, and thereafter anisotropic etching (etchback) is performed to this insulating film 9a, thereby forming the sidewall insulating film SW1a made of the insulating film 9a left on the sidewall of the recess 15b (specifically, the side surface of the portion of the device isolation regions 13 protruded from the surface of the semiconductor substrate 1) as shown in FIG. 58. At this time, the insulating film 9a is removed except for the portion to be the sidewall insulating film SW1a. The sidewall insulating film SW1a is formed on the side surface of the recess 15b (specifically, the side surface of the portion of the device isolation region 13 which has been protruded from the surface of the semiconductor substrate 1) in a shape of a sidewall spacer.

The insulating film 9a is made of a silicon nitride film or a silicon oxynitride film, and the silicon nitride film is more preferable. Therefore, the sidewall insulating film SW1a is made of silicon nitride (when the insulating film 9a is a silicon nitride film) or silicon oxynitride (when the insulating film 9a is a silicon oxynitride film), and it is more preferably made of silicon nitride. Like the sidewall insulating film SW1 described above, since the sidewall insulating film SW1a also has a function of preventing the diffusion of the element for threshold reduction which the Hf-containing insulating film 5 (or Hf-containing insulating film 5a described later) contains into the device isolation region 13, the sidewall insulating film SW1a needs to be formed of silicon nitride or silicon oxynitride in consideration of this function, and it is more preferable that the sidewall insulating film SW1a is made of silicon nitride.

The subsequent process is approximately similar to that in the above-described second embodiment, and the process described with reference to FIG. 40 to FIG. 47 in the above-described second embodiment is performed. At this time, however, the "sidewall insulating film SW1" in the description of the second embodiment should be read as the "sidewall insulating film SW1a".

Figure 59:
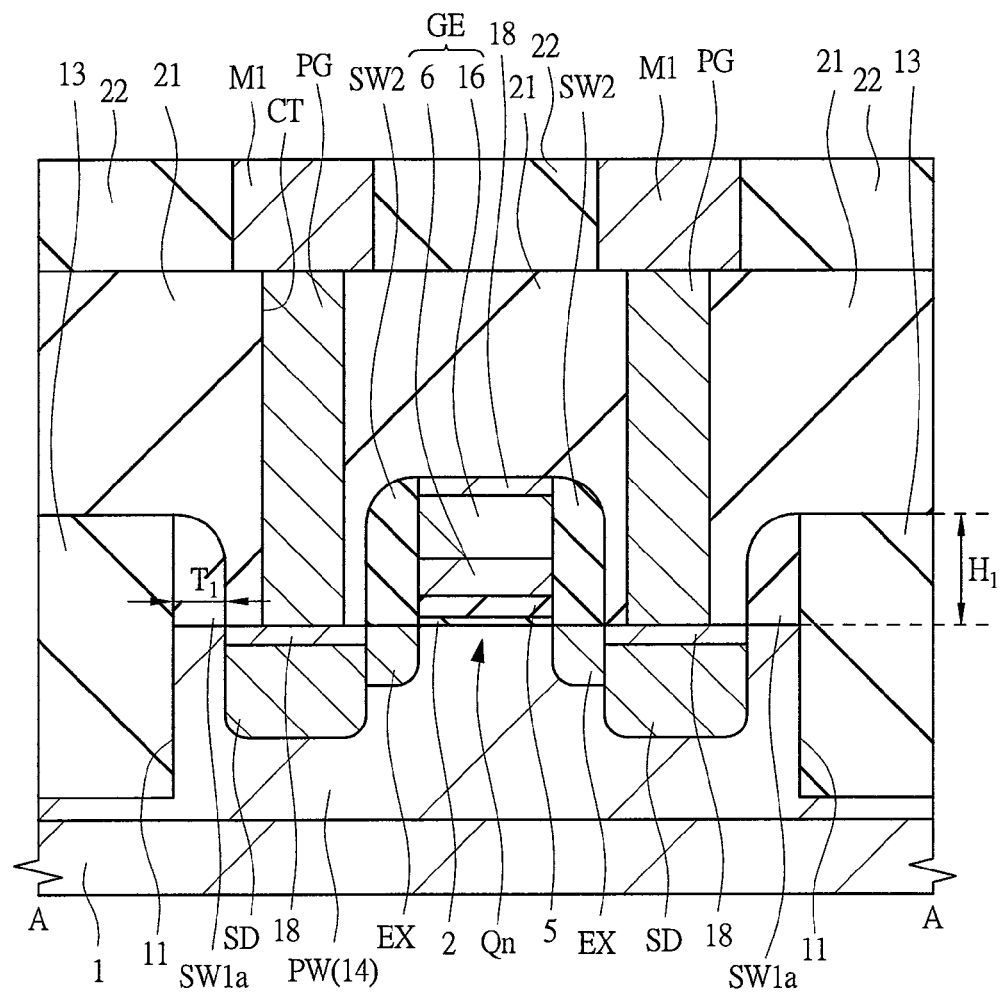
FIG. 59 is a sectional view (sectional view taken along the line A-A) of a main portion of the semiconductor device during the manufacturing process thereof continued from FIG. 58.

More specifically, in the same manner as the second embodiment described above, after an interface layer 2, an Hf-containing film 3 and a rare earth-containing film 4 are formed, the Hf-containing film 3 and the rare earth-containing film 4 are reacted with each other by heat treatment, thereby forming an Hf-containing insulating film 5. Then, in the same manner as the second embodiment, a gate electrode GE is formed by forming a metal film 6 and a silicon film 16 and then patterning the metal film 6 and the silicon film 16, n⁻-type semiconductor regions EX, sidewalls SW2 and n⁺-type semiconductor regions SD are formed, and a metal silicide layer 18 is formed by a silicide process. Thereafter, in the same manner as the second embodiment, an insulating film 21 is formed, contact holes CT are formed in the insulating film 21, conductive plugs PG are formed in the contact holes CT, an insulating film 22 is formed on the insulating film 21 in which the plugs PG have been embedded, and a wiring M1 is formed in the insulating film 22 by a damascene method. In this manner, the structure shown in FIG. 59 (sectional view taken along the line A-A) and FIG. 60 (sectional view taken along the line B-B) is obtained. FIG. 59 corresponds to FIG. 46 of the second embodiment described above, and FIG. 60 corresponds to FIG. 47 of the second embodiment described above. Thereafter, a second-layer wiring and subsequent wirings are formed by a dual damascene method or the like, but illustrations and descriptions of the formation thereof are omitted here.

In the manner described above, the semiconductor device according to the present embodiment is manufactured.

The structure of the semiconductor device according to the present embodiment and the structure of the semiconductor device according to the second embodiment described above are basically the same, and they have the structure in which the upper portion of the device isolation region 13 is protruded from (the surface of) the semiconductor substrate 1 and the sidewall insulating film SW1 or the sidewall insulating film SW1a is disposed (formed) on the side surface (sidewall) of the portion of the device isolation region 13 protruded from the surface of the semiconductor substrate 1. However, the structure of the semiconductor device according to the present embodiment and the structure of the semiconductor device according to the second embodiment described above are different from each other in the following points.

That is, in the second embodiment described above, after the sidewall insulating film SW1 is formed on the sidewall of the stacked pattern 8b, the device isolation region 13 is formed adjacent to the sidewall insulating film SW1, and the stacked pattern 8b is then removed. On the other hand, in the present embodiment, after the device isolation region 13 is formed adjacent to the stacked pattern 8b, the stacked pattern 8b is removed, and the sidewall insulating film SW1a is then formed on the sidewall of the portion of the device isolation region 13 protruded from the semiconductor substrate 1. In reflection of this, in the semiconductor device according to the second embodiment, as shown also in the FIG. 39, FIG. 46 and FIG. 47, the side surface of the sidewall insulating film SW1a located on the side which is not adjacent to the device isolation region 13 is approximately perpendicular to the main surface of the semiconductor substrate 1. On the other hand, in the present embodiment, as shown also in FIG. 58, FIG. 59 and FIG. 60, a lower portion of the side surface of the sidewall insulating film SW1a located on the side which is not adjacent to the device isolation region 13 is approximately perpendicular to the main surface of the semiconductor substrate 1, but an upper portion thereof is rounded off. The other constitutions of the semiconductor device according to the present embodiment are approximately similar to those of the semiconductor device according to the second embodiment described above.

Also in the present embodiment, effects approximately similar to those in the above-described second embodiment can be obtained.

More specifically, like in the second embodiment described above, also in the semiconductor device of the present embodiment, the gate electrode GE partially extends on the device isolation region 13 and the device isolation region 13 is made of the silicon oxide film 12 embedded into the trench 11 for device isolation formed in the semiconductor substrate 1, but an upper portion of the device isolation region 13 is protruded from (the main surface of) the semiconductor substrate 1 and the sidewall insulating film SW1a is formed on the sidewall of the portion of the device isolation film 13 protruded from the semiconductor substrate 1. Further, the sidewall insulating film SW1a is made of silicon nitride or silicon oxynitride. The gate insulating film of the n-channel MISFET Qn is made up of the Hf-containing insulating film 5 (and the interface layer 2) formed between the gate electrode GE and the active region 14 (p-type well PW) of the semiconductor substrate 1, and the sidewall insulating film SW1a is interposed between the gate insulating film (Hf-containing insulating film 5) located between the gate electrode GE and the active region 14 (p-type well PW) of the semiconductor substrate 1 and the device isolation region 13.

Also in the semiconductor device of the present embodiment, the portion of the Hf-containing insulating film 5 functioning as the gate insulating film (namely, the portion of the Hf-containing insulating film 5 located between the gate electrode GE and the active region 14 (p-type well PW) of the semiconductor substrate 1) is not located adjacent to (near)

the device isolation region 13, and the sidewall insulating film SW1a is interposed between the portion and the device isolation region 13. The Hf-containing insulating film 5 is located adjacent to the sidewall insulating film SW1a (namely, the Hf-containing insulating film 5 is formed also on the sidewall insulating film SW1a), but since the sidewall insulating film SW1a is made of silicon nitride or silicon oxynitride, the rare earth element is difficult to diffuse from the Hf-containing insulating film 5 to the sidewall insulating film SW1a.

Therefore, by forming the sidewall insulating film SW1a from silicon nitride or silicon oxynitride into which the rare earth element is difficult to diffuse and interposing the sidewall insulating film SW1a between the portion of the Hf-containing insulating film 5 which functions as the gate insulating film and the device isolation region 13, the sidewall insulating film SW1a can be made to function as a diffusion barrier for the rare earth element. By this means, the diffusion of the rare earth element from the portion of the Hf-containing insulating film 5 which functions as the gate insulating film to the device isolation region 13 can be suppressed or prevented, and lowering of the rare earth concentration in the portion of the Hf-containing insulating film 5 which functions as the gate insulating film can be suppressed or prevented. Accordingly, the effect of threshold reduction attained by introducing the rare earth element into the Hf-containing insulating film 5 can be obtained adequately, and the absolute value of the threshold voltage of the n-channel MISFET Qn can be lowered adequately. Further, since the effect of threshold reduction attained by introducing the rare earth element into the Hf-containing insulating film 5 can be adequately obtained regardless of the channel width as shown by the solid line in the graph in FIG. 28 in the first embodiment and the absolute value of the threshold voltage of the MISFET can be adequately lowered, the channel width dependency of the threshold voltage can be reduced. Therefore, the performance of the semiconductor device can be improved.

Further, the case where the n-channel MISFET is formed has been described in the present embodiment, but the invention can be applied also to a p-channel MISFET. FIG. 61 and FIG. 62 are sectional views of a main portion of a semiconductor device according to a modified example of the present embodiment, and the sectional views show the case of forming a p-channel MISFET. FIG. 61 corresponds to FIG. 59 and FIG. 62 corresponds to FIG. 60.

The p-channel MISFET Qp can also be formed basically in the same manner as the n-channel MISFET Qn, and different points from the case of forming the n-channel MISFET will be described here.

Figure 60:
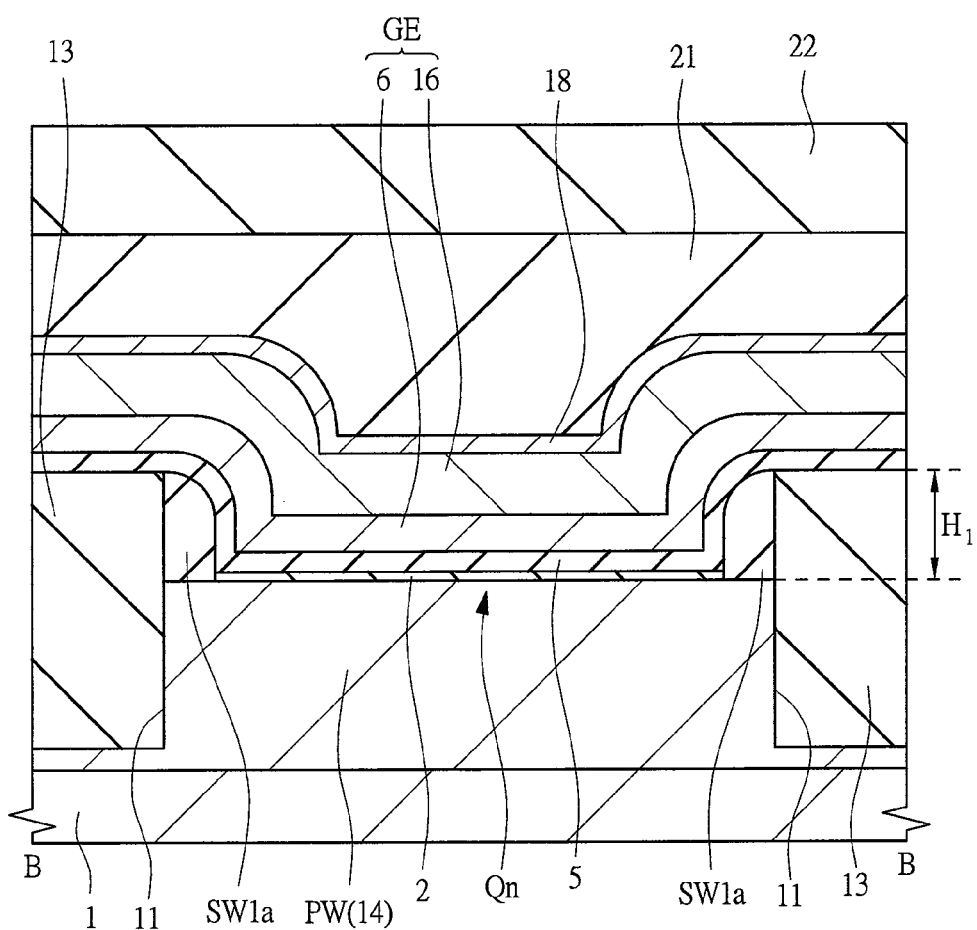
FIG. 60 is a sectional view (sectional view taken along the line B-B) of a main portion of the semiconductor device during the same manufacturing process thereof as that shown in FIG. 59.
Figure 61:
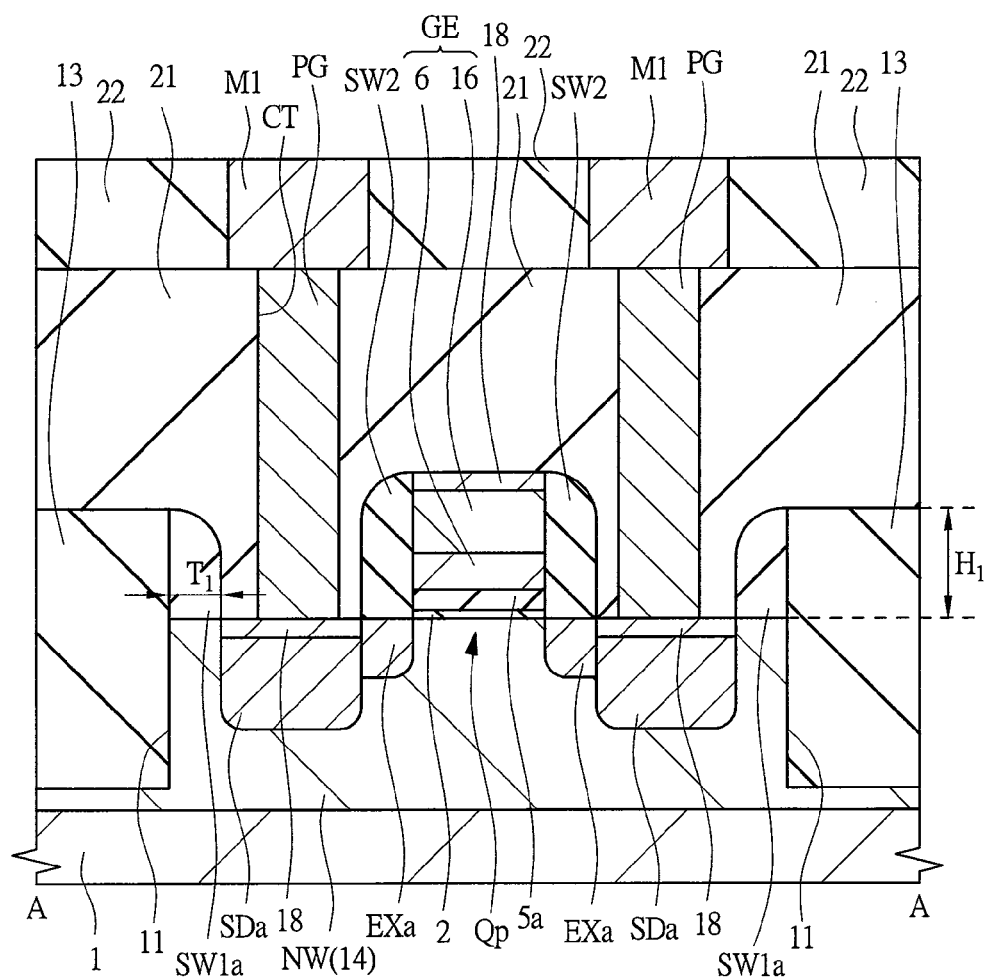
FIG. 61 is a sectional view (sectional view taken along the line A-A) of a main portion of a semiconductor device of a modified example of the third embodiment of the present invention.
Figure 62:
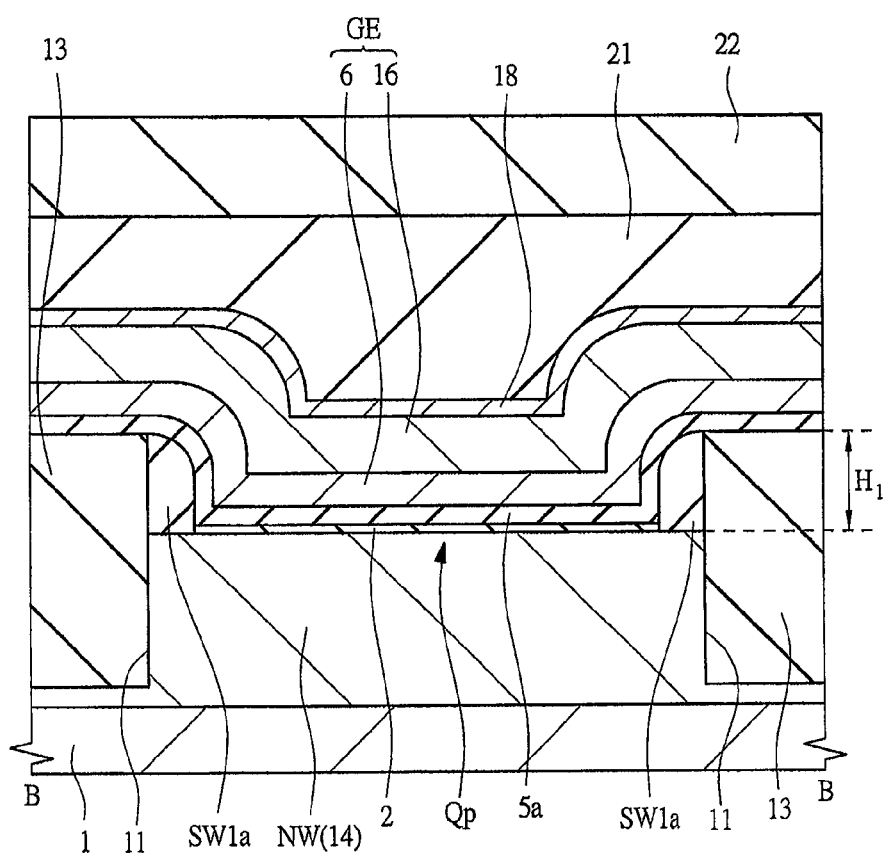
FIG. 62 is a sectional view (sectional view taken along the line B-B) of a main portion of the semiconductor device of the modified example of the third embodiment of the present invention.

Different points of the semiconductor device shown in FIG. 61 and FIG. 62 from the semiconductor device shown in FIG. 59 and FIG. 60 lie in that the conductivity types of the above-described p-type well PW, n$^-$-type semiconductor regions EX and n$^+$-type semiconductor regions SD are reversed to form the n-type well NW, the p$^-$-type semiconductor regions EXa and the p$^+$-type semiconductor regions SDa and that the element for threshold reduction contained in the Hf-containing insulating film 5 is changed to Al, Ti or Ta to form the Hf-containing insulating film 5a. The other constitutions of the semiconductor device shown in FIG. 61 and FIG. 62 are approximately similar to those of the semiconductor device shown in FIG. 59 and FIG. 60. A constitution and a formation method of the Hf-containing insulating film 5a are similar to those described in the second embodiment.

Even when the p-channel MISFET Qp is formed, diffusion of the element for threshold reduction (Al, Ti or Ta) from the portion of the Hf-containing insulating film 5a which functions as the gate insulating film to the device isolation region 13 can be suppressed or prevented by the sidewall insulating film SW1a in the present embodiment. Therefore, lowering of the concentration of the element for threshold reduction (Al, Ti or Ta) in the portion of the Hf-containing insulating film 5a which functions as the gate insulating film can be suppressed or prevented. Accordingly, also in the p-channel MISFET, like in the n-channel MISFET, the effect of the threshold reduction attained by introducing Al (aluminum), Ti (titanium) or Ta (tantalum) into the Hf-containing insulating film 5a can be adequately obtained as shown by the solid line in the graph in FIG. 28 regardless of the channel width, and the absolute value of the threshold voltage of the MISFET can be adequately lowered. Further, the channel width dependency of the threshold voltage can be reduced. Accordingly, the performance of the semiconductor device can be improved.

Further, it is preferred that a protrusion amount $H_1$ of the device isolation region 13 from the main surface (surface) of the semiconductor substrate 1 is 10 nm or more ($H_1 \geq 10$ nm). Here, the protrusion amount $H_1$ is shown also in FIG. 59 to FIG. 62, and it corresponds to a difference in height (difference in level) between the main surface (surface) of the semiconductor substrate 1 and the upper surface of the device isolation region 13 (height mentioned here is a height in a direction perpendicular to the main surface of the semiconductor substrate 1). By setting the protrusion amount $H_1$ of the device isolation region 13 from the main surface (surface) of the semiconductor substrate 1 to 10 nm or more, it becomes possible to easily dispose the sidewall insulating film SW1a on the sidewall of the portion of the device isolation region 13 protruded from the semiconductor substrate 1, and the effect of preventing the diffusion of the element for threshold reduction from the portion of the Hf-containing insulating film 5 (or Hf-containing insulating film 5a) functioning as the gate insulating film to the device isolation region 13 by the sidewall insulating film SW1a can be enhanced.

Fourth Embodiment

Figure 63:
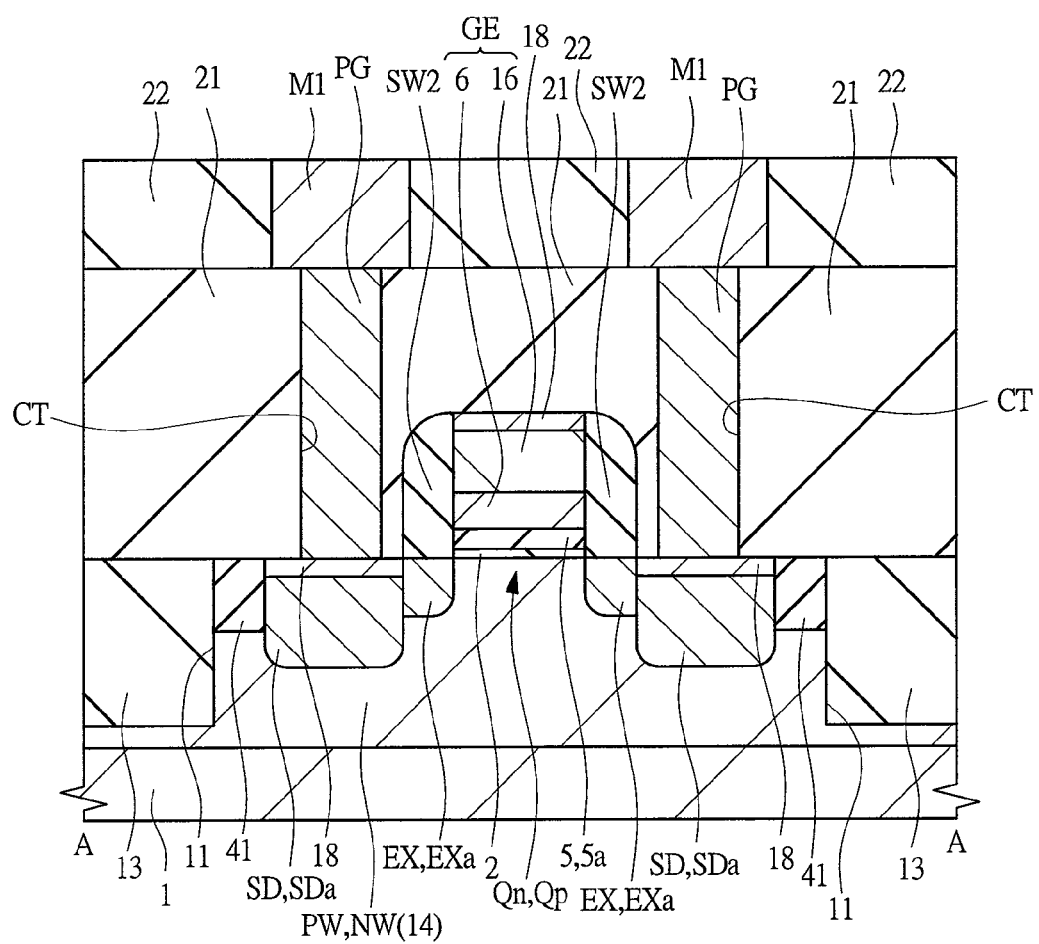
FIG. 63 is a sectional view of a main portion of a semiconductor device of a fourth embodiment of the present invention.
Figure 64:
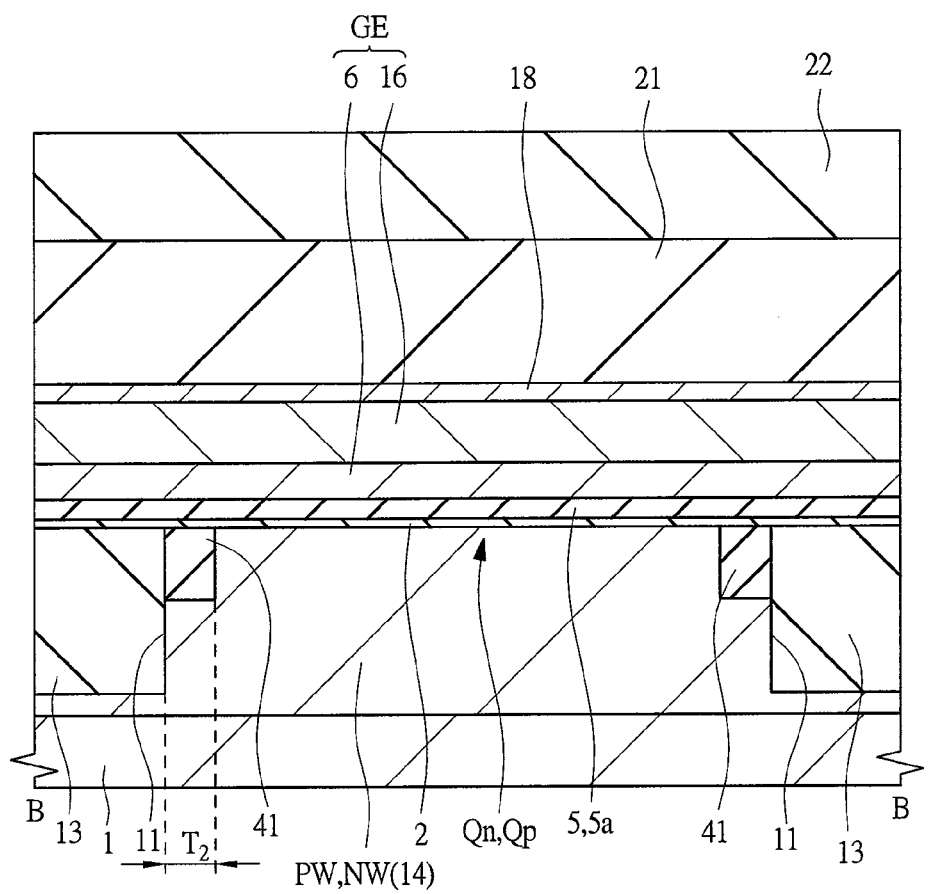
FIG. 64 is a sectional view of a main portion of the semiconductor device of the fourth embodiment of the present invention.

FIG. 63 and FIG. 64 are sectional views of a main portion of a semiconductor device according to the present embodiment, FIG. 63 shows a section (section at a position corresponding to the line A-A described above) taken along a gate length direction of a gate electrode GE, and FIG. 64 shows a section (section at a position corresponding to the line B-B described above) taken along a gate width direction of the gate electrode GE.

The semiconductor device according to the present embodiment shown in FIG. 63 and FIG. 64 is different from the semiconductor device according to the second embodiment described above in that the upper portion of the device isolation region 13 is not protruded from the semiconductor substrate 1. Further, the semiconductor device according to the present embodiment is different from the semiconductor device according to the second embodiment described above also in that a barrier portion (insulator portion) 41 corresponding to the sidewall insulating film SW1 is formed in the semiconductor substrate 1. Furthermore, the semiconductor device according to the present embodiment is different from the semiconductor device according to the second embodiment described above also in that the gate electrode GE is flat. The constitution of the semiconductor device according to the present embodiment shown in FIG. 63 and FIG. 64 is approximately similar to that of the semiconductor device according to the second embodiment other than these.

Note that, in FIG. 63, when an n-channel MISFET Qn is formed, a p-type well PW, an Hf-containing insulating film 5, n⁻-type semiconductor regions EX and n⁺-type semiconductor regions SD are formed, and when a p-channel MISFET Qp is formed, an n-type well NW, an Hf-containing insulating film 5a, p⁻-type semiconductor regions EXa and p⁺-type semiconductor regions SDa are formed.

In the semiconductor device shown in FIG. 63 and FIG. 64, the height of the upper surface of the device isolation region 13 is approximately equal to the height of the main surface (surface) of the semiconductor substrate 1, and the barrier portion 41 made of silicon nitride or silicon oxynitride is formed adjacent to the device isolation region 13. The height of the upper surface of the barrier portion 41 is also approximately equal to the height of the main surface (surface) of the semiconductor substrate 1. The barrier portion 41 is provided for preventing the diffusion of the element for threshold reduction introduced into the Hf-containing insulating film 5 (5a) like the sidewall insulating film SW1 (SW1a) described above. The barrier portion 41 is made of silicon nitride or silicon oxynitride, and it is more preferably made of silicon nitride. Since the barrier portion 41 is made of silicon nitride or silicon oxynitride, it can be regarded also as an insulator portion.

The second and third embodiments described above and the present embodiment are common in the following points. That is, the insulator portion made of silicon nitride or silicon oxynitride (corresponding to the sidewall insulating films SW1 and SW1a in the second and third embodiments and corresponding to the barrier portion 41 in the present embodiment) is disposed adjacent to the device isolation region 13. Further, the gate electrode GE extends on the active region 14 (active region 14 defined by the device isolation region 13), on the insulator portion made of silicon nitride or silicon oxynitride (corresponding to the sidewall insulating film SW1 (SW1a) or the barrier portion 41) and on the device isolation region 13. Further, the Hf-containing insulating film 5 (or Hf-containing insulating film 5a) is formed between the gate electrode GE and the active region 14, between the gate electrode GE and the insulator portion (sidewall insulating film SW1 (SW1a) or the barrier portion 41) and between the gate electrode GE and the device isolation region 13. Further, a portion of the Hf-containing insulating film 5 (5a) located on the insulator portion (sidewall insulating film SW1 (SW1a) or the barrier portion 41) is interposed between the portion of the Hf-containing insulating film 5 (5a) located on the active region 14 and the portion of the Hf-containing insulating film (5a) located on the device isolation region 13. More specifically, in the Hf-containing insulating film 5 (5a), a portion located between the gate electrode GE and the insulator portion (sidewall insulating film SW1 (SW1a) or the barrier portion 41) is interposed between a portion located between the gate electrode GE and the active region 14 of the semiconductor substrate 1 and a portion located between the gate electrode GE and the device isolation region 13.

Therefore, in the second and third embodiments described above and the present embodiment, the portion of the Hf-containing insulating film 5 (5a) functioning as the gate insulating film (portion of the Hf-containing insulating film 5 (5a) located between the gate electrode GE and the active region 14 in the semiconductor substrate 1) is not adjacent to the device isolation region 13, and a portion of the Hf-containing insulating film 5 (5a) located between the gate electrode GE and the insulator portion made of silicon nitride or silicon oxynitride is interposed between the portion of the Hf-containing insulating film 5 (5a) functioning as the gate insulating film and the portion of the Hf-containing insulating film 5 (5a) in contact with the device isolation region 13. Since the insulator portion (sidewall insulating film SW1 (SW1a) or the barrier portion 41) is made of silicon nitride or silicon oxynitride (more preferably silicon nitride), the element for threshold reduction is difficult to diffuse. In the second and third embodiments described above and the present embodiment, even if the element for threshold reduction diffuses from the portion of the Hf-containing insulating film 5 (5a) in contact with the device isolation region 13 to the device isolation region 13, lowering of the concentration of the element for threshold reduction in the portion of the Hf-containing insulating film 5 (5a) functioning as the gate insulating film can be suppressed or prevented. Therefore, the effect of threshold reduction can be adequately obtained, and the threshold reduction can be achieved even in a MISFET with a small channel width. Accordingly, the performance of the semiconductor device can be improved.

However, as compared with the case where the upper portion of the device isolation region 13 is not protruded from the semiconductor substrate 1 like in the present embodiment, the case where the upper portion of the device isolation region 13 is protruded from the semiconductor substrate 1 and the sidewall insulating film SW1 (SW1a) made of silicon nitride or silicon oxynitride is formed on the sidewall of the portion of the device isolation region 13 protruded from the semiconductor substrate 1 like in the second and third embodiments can obtain the following advantages.

That is, the sidewall insulating film SW1 (SW1a) made of silicon nitride or silicon oxynitride can be disposed easily and accurately at a position adjacent to the device isolation region 13. Further, since the size of the portion of the Hf-containing insulating film 5 (5a) located on the sidewall insulating film SW1 (SW1a) can be increased without increasing the thickness of the sidewall insulating film SW1 (SW1a) (thickness corresponding to $T_1$ described above) so much, the lowering of the concentration of the element for threshold reduction in the portion of the Hf-containing insulating film 5 (5a) functioning as the gate insulating film can be prevented while suppressing the thickness of the sidewall insulating film SW1 (SW1a) (thickness corresponding to $T_1$ described above). By this means, the effect of threshold reduction can be adequately obtained and the size reduction (area reduction) of the semiconductor device can be achieved.

On the other hand, in the semiconductor device shown in FIG. 63 and FIG. 64, when it is tried to obtain the effect of threshold reduction equivalent to that obtained in the semiconductor device according to the second and third embodiments described above, a thickness $T_2$ of the barrier portion 41 needs to be made considerably larger than the thickness of the sidewall insulating film SW1 (SW1a) (corresponding to $T_1$ described above). Therefore, the semiconductor device shown in FIG. 63 and FIG. 64 is disadvantageous with respect to the size reduction (area reduction) of the semiconductor device as compared with the semiconductor device according to the second and third embodiments described above. Here, the thickness $T_2$ of the barrier portion 41 is shown also in FIG. 64, and it corresponds to the size (thickness) in a direction parallel to the main surface of the semiconductor substrate 1 and along an extending direction of the gate electrode GE. In order to obtain the effect of preventing the diffusion of the element for threshold reduction by the barrier portion 41, it is preferred that the thickness $T_2$ of the barrier portion 41 is 10 nm or more.

In the foregoing, the invention made by the inventor of the present invention has been concretely described based on the embodiments. However, it is needless to say that the present invention is not limited to the foregoing embodiments and various modifications and alterations can be made within the scope of the present invention.

The present invention is effective when applied to a semiconductor device and a manufacturing method thereof.

What is claimed is:

1. A method of manufacturing a semiconductor device provided with a MISFET, the method comprising:
   (a) a step of preparing a semiconductor substrate;
   (b) a step of forming a second material film on the semiconductor substrate;
   (c) a step of patterning the second material film to form a second material film pattern;
   (d) a step of forming a sidewall insulating film made of silicon nitride or silicon oxynitride on a sidewall of the second material film pattern;
   (e) a step of etching the semiconductor substrate with the sidewall insulating film and the second material film pattern as an etching mask to form a trench for device isolation in the semiconductor substrate;
   (f) a step of forming a silicon oxide film on the semiconductor substrate so as to fill the trench for device isolation and cover the second material film pattern and the sidewall insulating film;
   (g) a step of polishing the silicon oxide film until the second material film pattern is exposed, thereby forming a device isolation region which is made of the silicon oxide film embedded in the trench and whose upper portion is protruded from the semiconductor substrate;
   (h) after the step (g), a step of removing the second material film pattern;
   (i) after the step (h), a step of forming a first insulating film which is for a gate insulating film of the MISFET and contains hafnium, oxygen and a first element as main components on a region of the semiconductor substrate which is surrounded by the device isolation region and is not covered with the sidewall insulating film;
   (j) a step of forming a metal film for forming a metal gate electrode of the MISFET on the first insulating film;
   (k) a step of forming a silicon film on the metal film; and
   (l) a step of patterning the silicon film and the metal film to form the metal gate electrode for the MISFET,
   wherein, when the MISFET is an n-channel MISFET, the first element is an element belonging to any of Group 1, Group 2 and Group 3,
   when the MISFET is a p-channel MISFET, the first element is any of Al, Ti and Ta,
   wherein, at the step (i), the first insulating film is also formed over the device isolation region and the sidewall insulating film,
   wherein, at the step (l), the metal gate electrode is also formed over the device isolation region and the sidewall insulating film via the first insulating film, and
   wherein, after the step (l), in a gate width direction of the MISFET, the first insulating film and the metal gate electrode are above the device isolation region and the sidewall insulating film.

2. The method of manufacturing the semiconductor device according to claim 1,
   wherein, when the MISFET is the n-channel MISFET, the first element is a rare earth element or Mg, and
   when the MISFET is the p-channel MISFET, the first element is Al.

3. The method of manufacturing the semiconductor device according to claim 2,
   wherein the sidewall insulating film is made of silicon nitride.

* * * * *